United States Patent
Liu et al.

(10) Patent No.: US 10,205,070 B2
(45) Date of Patent: Feb. 12, 2019

(54) LIGHT-EMITTING DEVICE HAVING DISSIMILAR FIRST AND SECOND LIGHT-EMITTING ANGLES

(71) Applicant: EPISTAR CORPORATION, Hsinchu (TW)

(72) Inventors: Chien-Liang Liu, Hsinchu (TW); Ming-Chi Hsu, Hsinchu (TW); Shih-An Liao, Hsinchu (TW); Chun-Hung Liu, Hsinchu (TW); Zhi-Ting Ye, Hsinchu (TW); Cheng-Teng Ye, Hsinchu (TW); Po-Chang Chen, Hsinchu (TW); Sheng-Che Chiou, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 15/394,951

(22) Filed: Dec. 30, 2016

(65) Prior Publication Data
US 2017/0194540 A1 Jul. 6, 2017

(30) Foreign Application Priority Data

Dec. 31, 2015 (TW) .............................. 104144679 A
Aug. 19, 2016 (TW) .............................. 105126557 A

(51) Int. Cl.
*H01L 33/20* (2010.01)
*H01L 33/38* (2010.01)
(Continued)

(52) U.S. Cl.
CPC .......... *H01L 33/60* (2013.01); *H01L 25/0753* (2013.01); *H01L 33/20* (2013.01);
(Continued)

(58) Field of Classification Search
CPC ......... H01L 33/60; H01L 33/20; H01L 33/38; H01L 33/504; H01L 25/0753
See application file for complete search history.

(56) References Cited

U.S. PATENT DOCUMENTS 5,940,550 A * 8/1999 Plickert ................ G02B 6/4212
385/14
7,141,825 B2 * 11/2006 Horio ...................... H01L 33/40
257/79
(Continued)

FOREIGN PATENT DOCUMENTS

EP 1403937 A2 3/2004
EP 3054492 A3 10/2016
(Continued)

*Primary Examiner* — Ida M Soward
(74) *Attorney, Agent, or Firm* — Ditthavong & Steiner, P.C.

(57) ABSTRACT

A light-emitting device includes a light-emitting structure with a side surface, and a reflective layer covering the side surface, and a light-transmitting body. The light-transmitting body encloses the light-emitting structure and has a first side surface, a second side surface, a third side surface and a fourth side surface. The reflective layer covers the first side surface and the third side surface without covering the second side surface and the fourth side surface. The light-emitting structure has a first light-emitting angle and a second light-emitting angle different from the first light-emitting angle.

14 Claims, 50 Drawing Sheets

(51) Int. Cl.
  *H01L 33/50* (2010.01)
  *H01L 33/60* (2010.01)
  *H01L 25/07* (2006.01)
  *H01L 25/075* (2006.01)
  *F21V 8/00* (2006.01)
  *H01L 33/00* (2010.01)
  *H01L 33/48* (2010.01)
  *H01L 33/62* (2010.01)
  *H01L 21/56* (2006.01)

(52) U.S. Cl.
  CPC ............ *H01L 33/38* (2013.01); *H01L 33/504* (2013.01); *G02B 6/0068* (2013.01); *G02B 6/0073* (2013.01); *H01L 21/568* (2013.01); *H01L 33/0095* (2013.01); *H01L 33/486* (2013.01); *H01L 33/62* (2013.01); *H01L 2224/19* (2013.01); *H01L 2933/0058* (2013.01)

(56) References Cited

U.S. PATENT DOCUMENTS

| | | | |
|---|---|---|---|
| 7,633,133 B2* | 12/2009 | Noma | H01L 27/14618 257/433 |
| 7,667,224 B2* | 2/2010 | Ohashi | H01L 33/20 257/13 |
| 7,800,125 B2* | 9/2010 | Chen | H01L 33/58 257/98 |
| 7,939,841 B2* | 5/2011 | Lee | H01L 33/20 257/98 |
| 8,360,619 B2* | 1/2013 | Weng | G02B 3/0056 362/311.06 |
| 8,502,242 B2* | 8/2013 | Kim | H01L 25/0756 257/103 |
| 8,653,552 B2* | 2/2014 | Kazama | H01L 33/382 257/100 |
| 8,770,819 B2* | 7/2014 | Tanaka | G02B 6/0028 349/61 |
| 8,890,845 B2* | 11/2014 | Lin | G06F 3/0428 345/173 |
| 8,916,904 B2* | 12/2014 | Shinohara | H01L 31/02 257/103 |
| 9,236,529 B2* | 1/2016 | Kinouchi | H01L 33/20 |
| 9,287,464 B2* | 3/2016 | Saito | H01L 33/46 |
| 2008/0019148 A1* | 1/2008 | Chou | G02F 1/133603 362/612 |
| 2008/0186733 A1 | 8/2008 | Ho et al. | |
| 2009/0230410 A1 | 9/2009 | Joung | |
| 2010/0134716 A1 | 6/2010 | Hamada | |
| 2010/0308365 A1* | 12/2010 | Masuya | H01L 33/20 257/98 |
| 2011/0297914 A1* | 12/2011 | Zheng | H01L 33/46 257/13 |
| 2012/0107988 A1* | 5/2012 | Kim | H01L 33/46 438/46 |
| 2013/0083296 A1* | 4/2013 | Ogura | G03B 21/204 353/31 |
| 2013/0105978 A1* | 5/2013 | Hung | H01L 33/60 257/751 |
| 2014/0014980 A1* | 1/2014 | Morimoto | H01L 33/501 257/88 |
| 2014/0321128 A1* | 10/2014 | Wu | F21S 48/215 362/308 |
| 2015/0085527 A1 | 3/2015 | Nam et al. | |
| 2015/0102378 A1* | 4/2015 | Huang | H01L 33/58 257/98 |
| 2015/0129919 A1 | 5/2015 | Liu et al. | |
| 2016/0079496 A1* | 3/2016 | Huang | H01L 33/58 257/98 |

FOREIGN PATENT DOCUMENTS

| | | |
|---|---|---|
| JP | 2011061056 A | 3/2011 |
| WO | 2010035206 A1 | 4/2010 |
| WO | 2010044023 A1 | 4/2010 |
| WO | 2013121800 A1 | 8/2013 |

* cited by examiner

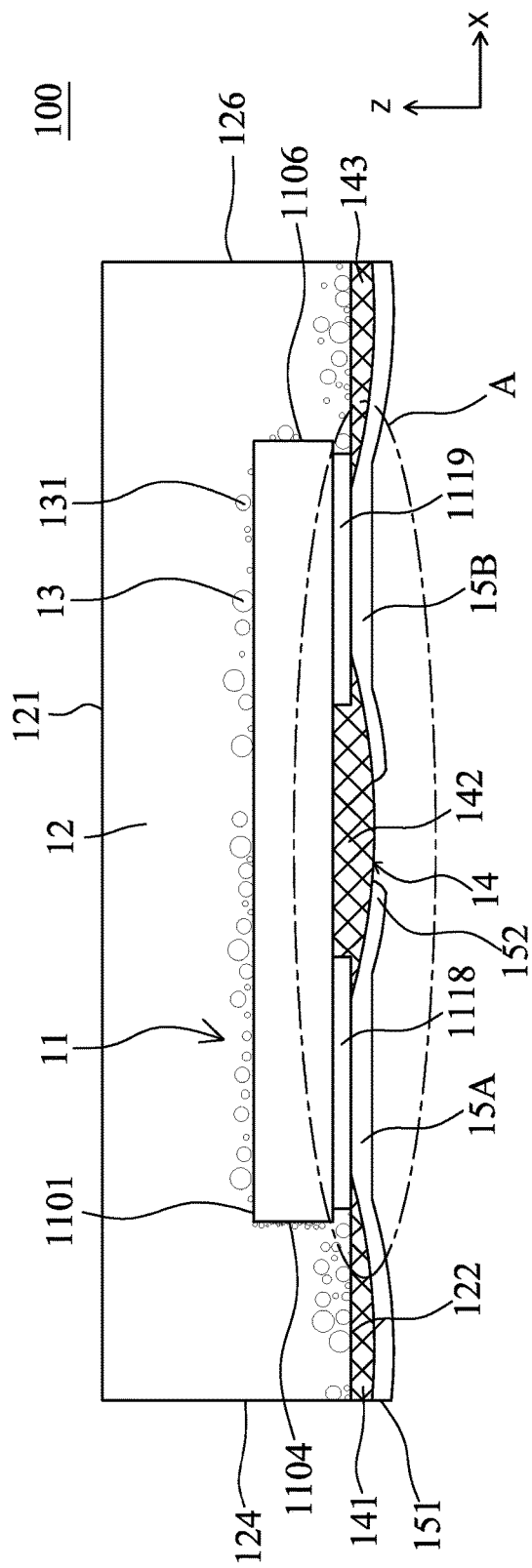
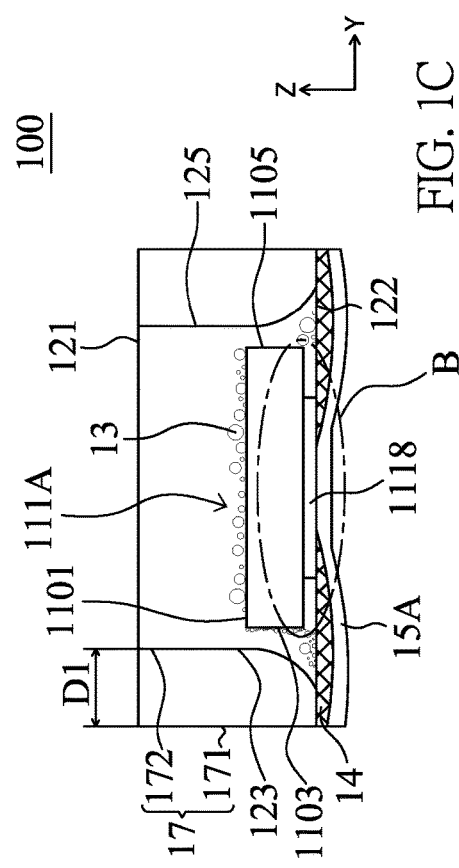
FIG. 1B
FIG. 1C

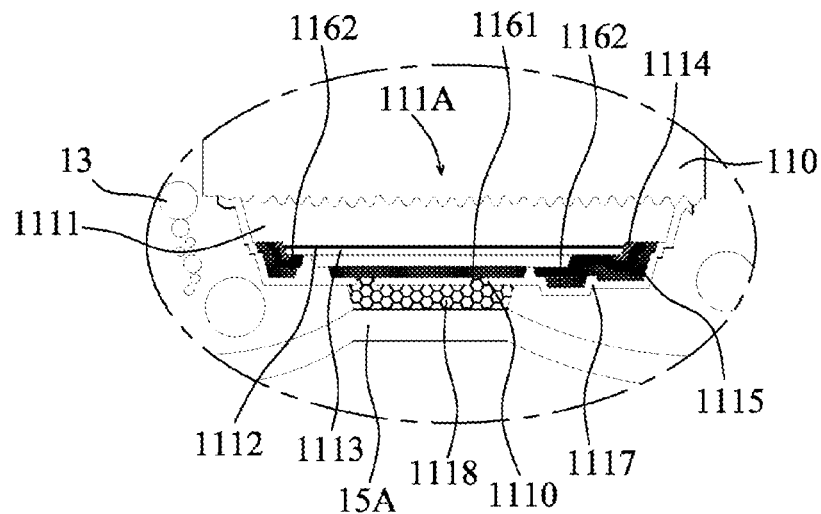
FIG. 1E
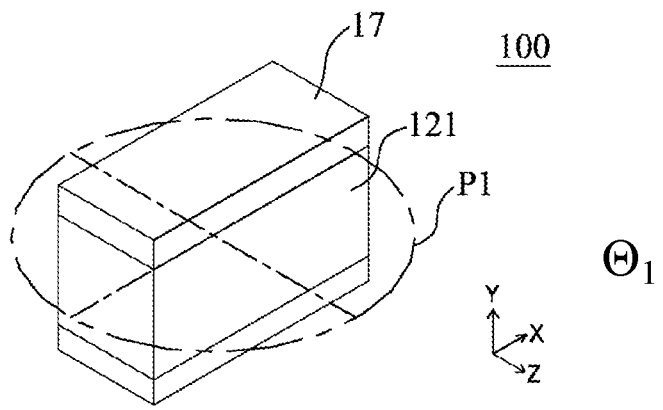
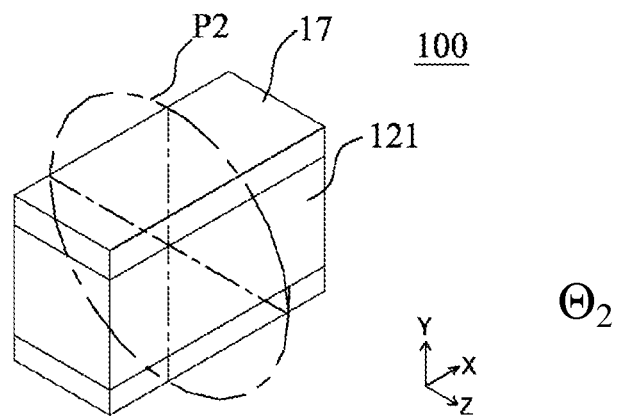
FIG. 1F

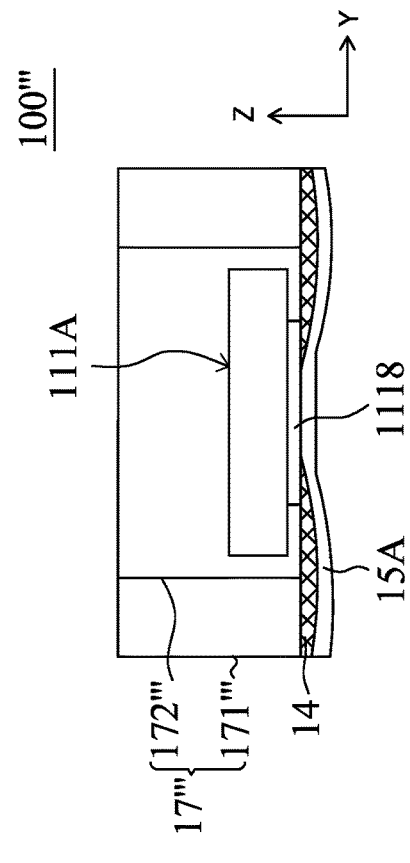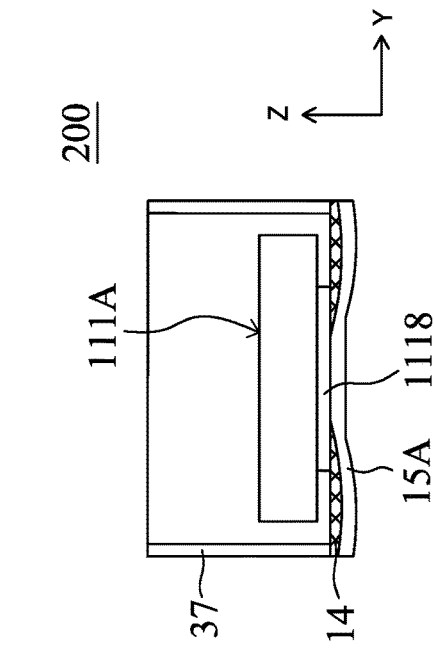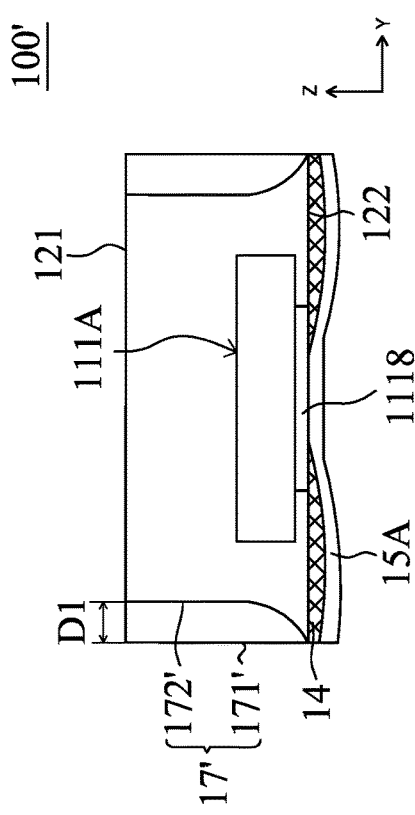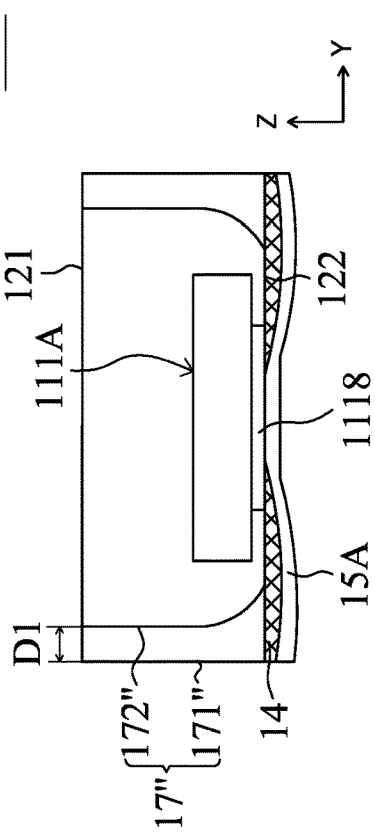

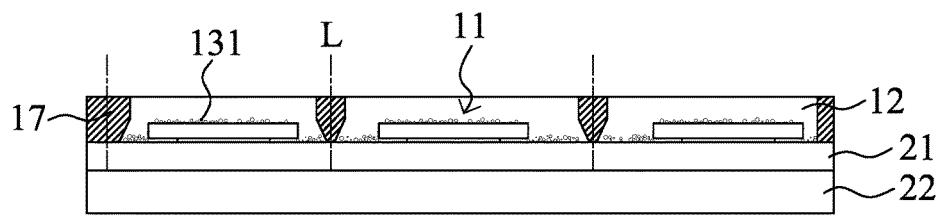
FIG. 3G
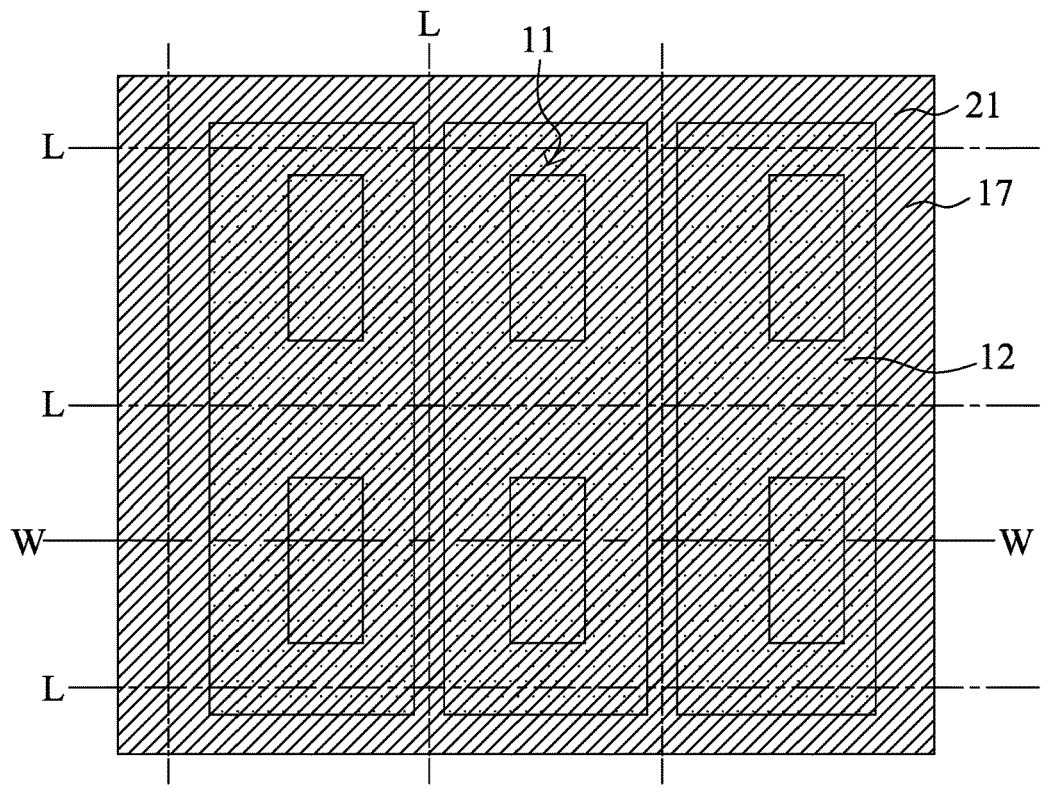
FIG. 4G
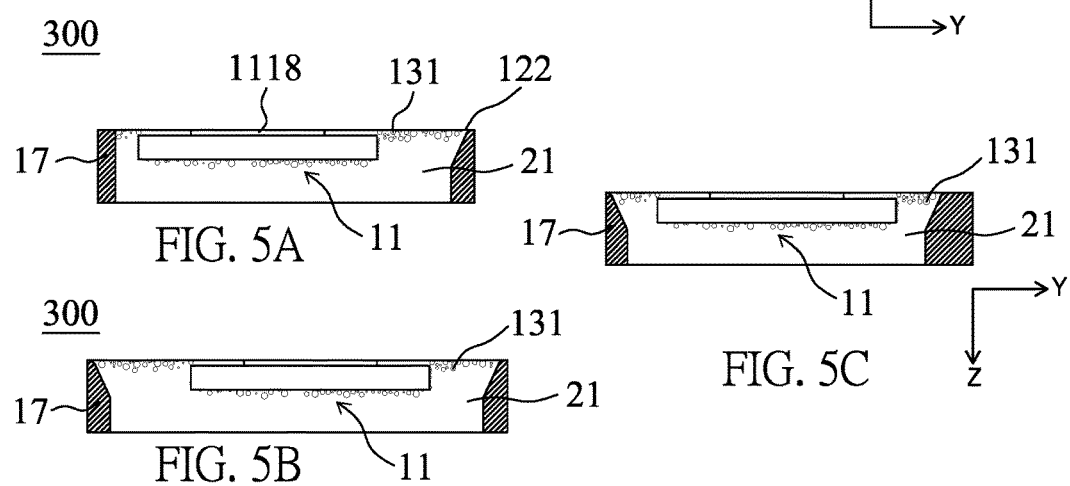
FIG. 5A
FIG. 5B
FIG. 5C

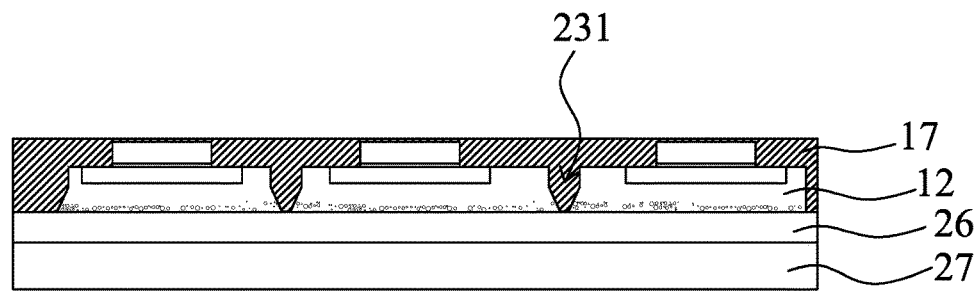
FIG. 7F
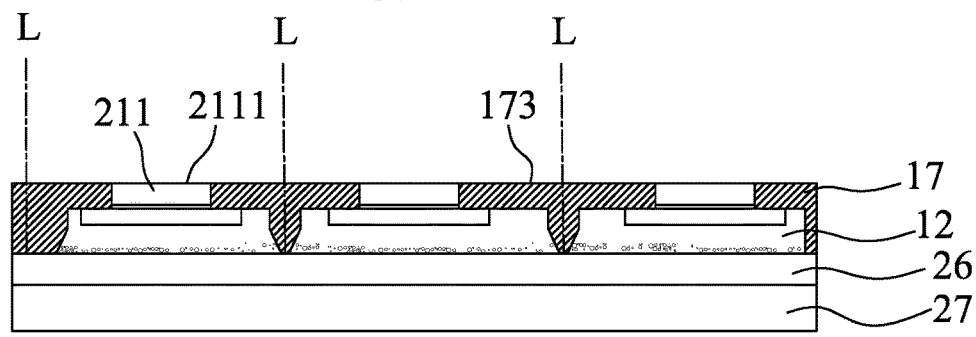
FIG. 7G
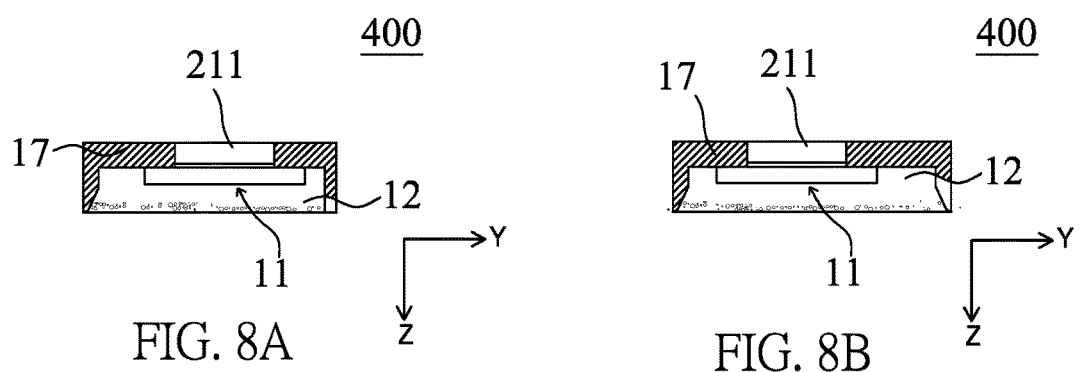
FIG. 8A
FIG. 8B
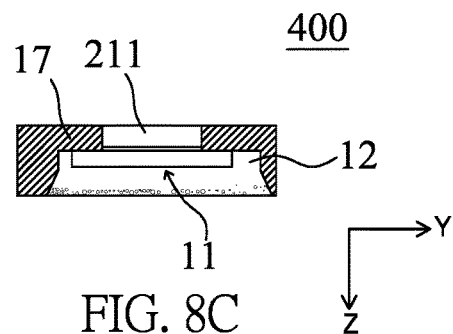
FIG. 8C

LIGHT-EMITTING DEVICE HAVING DISSIMILAR FIRST AND SECOND LIGHT-EMITTING ANGLES

CROSS-REFERENCE TO RELATED APPLICATIONS

The present application is a non-provisional patent application, claiming the benefit of priority of TW Patent Application No. 104144679 filed on Dec. 31, 2015 and TW Patent Application No. 105126557 filed on Aug. 19, 2016.

TECHNICAL FIELD

The present disclosure relates to a light-emitting device and in particular to a light-emitting device comprising a reflective layer covering two sides of a light-transmitting body.

DESCRIPTION OF THE RELATED ART

The light-emitting diodes (LEDs) have the characteristics of low power consumption, long operational life, small volume, quick response and stable opto-electrical property of emitted light. Recently, the light-emitting diodes gradually are used in a backlight module of a liquid crystal display.

SUMMARY OF THE DISCLOSURE

A light-emitting device includes a light-emitting structure with a side surface, and a reflective layer covering the side surface, and a light-transmitting body. The light-transmitting body encloses the light-emitting structure and has a first side surface, a second side surface, a third side surface and a fourth side surface. The reflective layer covers the first side surface and the third side surface without covering the second side surface and the fourth side surface. The light-emitting structure has a first light-emitting angle and a second light-emitting angle different from the first light-emitting angle.

The following description illustrates embodiments and together with drawings to provide a further understanding of the disclosure described above.

BRIEF DESCRIPTION OF THE DRAWINGS

FIG. 1B shows a cross-sectional view taken along lines I-I of FIG. 1A.

FIG. 1C shows a cross-sectional view taken along lines II-II of FIG. 1A.

FIG. 1E shows an enlarged view of a circled area B in FIG. 1C.

FIG. 1F shows drawings of how to measure a light-emitting device.

FIGS. 2A~2D show cross-sectional views of light-emitting devices in accordance with embodiments of the present disclosure.

FIGS. 3A~3G show cross-sectional views of making a light-emitting device in accordance with an embodiment of the present disclosure.

FIGS. 4A~4G show top views of FIGS. 3A~3G respectively.

FIGS. 5A~5C show cross-sectional views of light-emitting devices in accordance with embodiments of the present disclosure.

FIGS. 7A~7G show cross-sectional views of making a light-emitting device in accordance with an embodiment of the present disclosure.

FIGS. 8A~8C show cross-sectional views of light-emitting devices in accordance with embodiments of the present disclosure respectively.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1A:
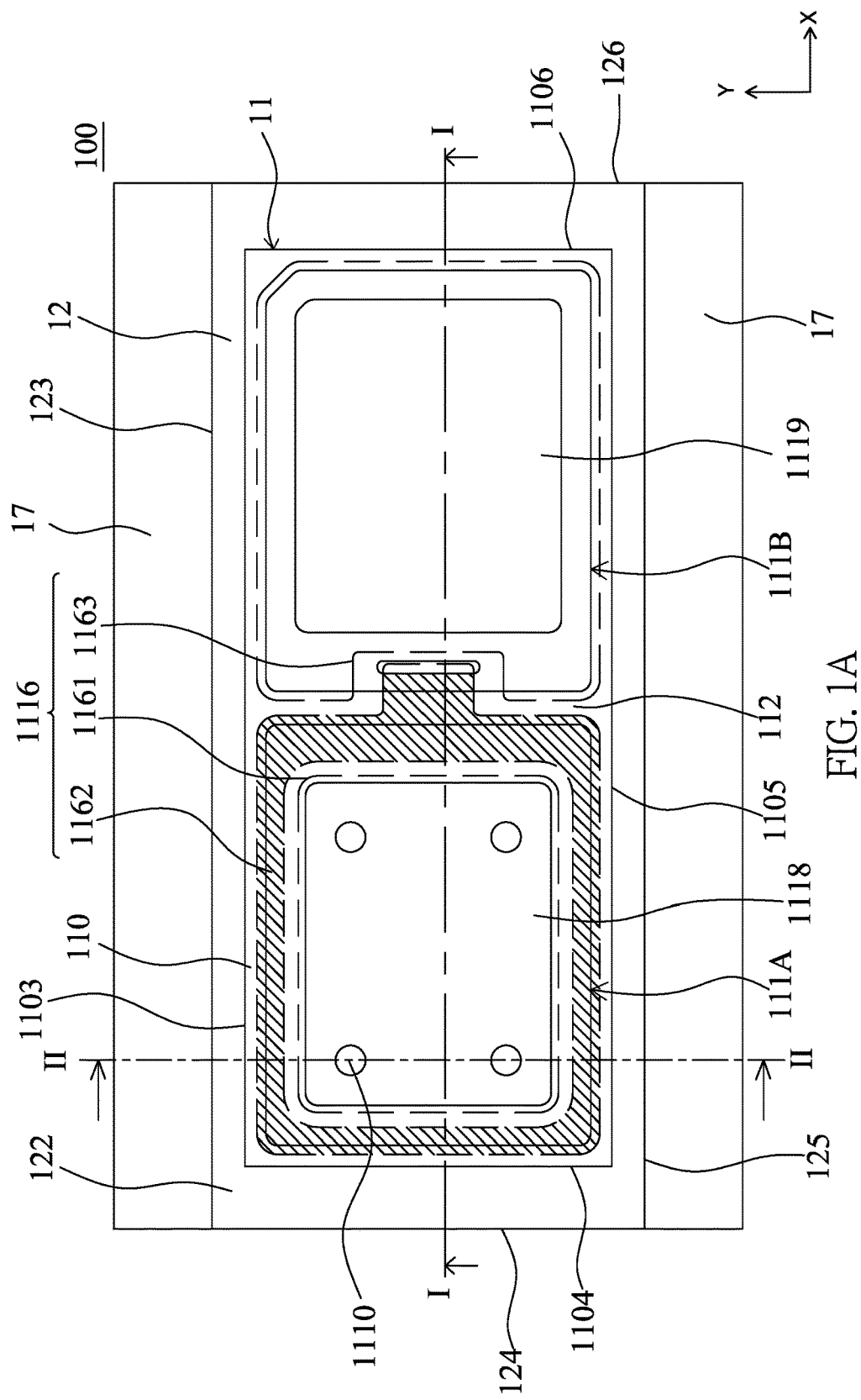
FIG. 1A shows a bottom view of a light-emitting device in accordance with an embodiment of the present disclosure.
Figure 1D:
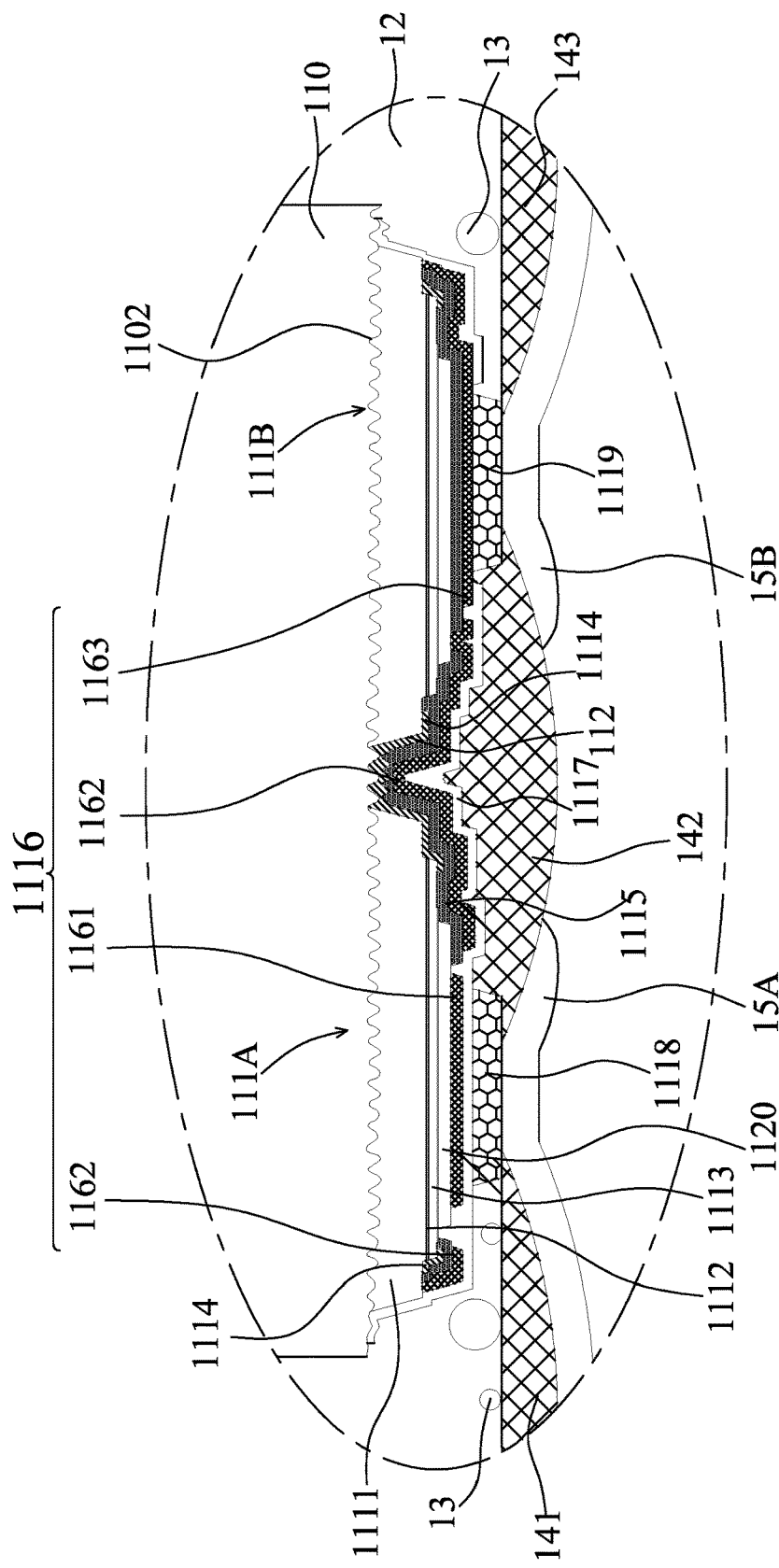
FIG. 1D shows an enlarged view of a circled area A in FIG. 1B.

FIG. 1A shows a bottom view of a light-emitting device 100 in accordance with an embodiment of the present disclosure. For clear illustration, FIG. 1A only shows some layers and each layer is drawn in solid line (a conductive layer 1116 is drawn in dot line and will be described later) regardless of its material being non-transparent, transparent, or semi-transparent. FIG. 1B shows a cross-sectional view taken along lines I-I of FIG. 1A. FIG. 1C shows a cross-sectional view taken along lines II-II of FIG. 1A. FIG. 1D shows an enlarged view of a circled area A in FIG. 1B. FIG. 1E shows an enlarged view of a circled area B in FIG. 1C. For simplified illustration, a light-emitting structure 11 is shown as cuboid in FIGS. 1B and 1C and the detailed structure will be described in FIGS. 1D and 1E.

Referring to FIGS. 1A, 1B, and 1D, the light-emitting device 100 includes a light-emitting structure 11, a light-transmitting body 12, a wavelength-conversion body 13, a first reflective layer 14, extension electrode layers 15A, 15B, and a second reflective layer 17. The light-emitting structure 11 includes a patterned substrate 110 and two light-emitting bodies 111A, 111B. The patterned substrate 110 is substantially a cuboid and includes a top surface 1101, a bottom surface 1102 opposite to the top surface 1101, and four side surfaces (a first side surface 1103, a second side surface 1104, a third side surface 1105, and a fourth side surface 1106) connecting between the top surface 1101 and the bottom surface 1102. The bottom surface 1102 is a patterned surface with a concave-convex structure in a regular or irregular arrangement. The light-transmitting body 12 covers the top surface 1101, the four side surface 1103~1106 and a portion of the bottom surface 1102.

Referring to FIG. 1D, in this embodiment, the light-emitting structure 11 includes the patterned substrate 110, the two light-emitting bodies 111A, 111B commonly formed on the patterned substrate 110, a trench 112 formed between the two light-emitting bodies 111A, 111B such that the two light-emitting bodies 111A, 111B are physically separated from each other. Each light-emitting body 111A, 111B includes a first-type semiconductor layer 1111, an active layer 1112, and a second-type semiconductor layer 1113. A first insulation layer 1114 is formed in the trench 112 and covers the first-type semiconductor layers 1111 of the light-emitting bodies 111A, 111B to avoid undesired electrical path (short circuit). A second insulation layer 1115 is formed on the first insulation layer 1114 to expose the second-type semiconductor layers 1113 of the light-emitting bodies 111A, 111B. A conductive layer 1116 is formed on the second insulation layer 1115 to expose the second-type semiconductor layers 1113 of the light-emitting bodies 111A, 111B. In addition, the second insulation layer 1115 covers a sidewall of the first insulation layer 1114. The conductive layer 1116 covers a portion of a sidewall of the second insulation layer 1115 and extends to the second-type semiconductor layer 1113. A third insulation layer 1117 is formed on the conductive layer 1116, covers the light-emitting bodies 111A, 111B and exposes a portion of the conductive layer 1116. A first electrode layer 1118 and a second electrode layer 1119 are electrically connected to the light-emitting bodies 111A, 111B, respectively. The electrical connection between the light-emitting bodies 111A, 111B is described later. An ohmic contact layer 1120 is optionally formed between the second-type semiconductor layer 1113 and the conductive layer 1116 for lowering a driving voltage of the light-emitting device 100.

For clear illustration, the conductive layer 1116 of FIG. 1A is drawn in a dot line. Referring to FIGS. 1A, 1D, and 1E, the conductive layer 1116 has a first region 1161, a second region 1162 (the hatch area in FIG. 1A) and a third region 1163. The first region 1161 is formed merely on the light-emitting body 111A and physically separated from the second region 1162. The second region 1162 surrounds the first region 1161. The second region 1162 contacts the first-type semiconductor layer 1111 of the light-emitting body 111A, and is further formed on the second insulation layer 1115 in the trench 112 to extend to the second-type semiconductor layer 1113 of the light-emitting body 111B so the conductive layer 1116 serially connects the light-emitting body 111A with the light-emitting body 111B (due to the position of I-I line, the electrical connection is not shown in FIG. 1D).

Referring to FIGS. 1A, 1D and 1E, a plurality of holes 1110 is formed in the third insulation layer 1110, and the holes 1110 are formed merely on the light-emitting body 111A and not formed on the light-emitting body 111B. The first electrode layer 1118 extends into the holes 1110 and electrically connected to the first region 1161 of the conductive layer 1116 on the light-emitting body 111A so the first electrode layer 1118 is electrically connected to the second-type semiconductor layer 1113 of the light-emitting body 111A. The third region 1163 of the conductive layer 1116 is formed merely on the light-emitting body 111B. The second electrode layer 1119 contacts directly the third region 1163 of the conductive layer 1116 exposed from the third insulation layer 1117. The third region 1163 of the conductive layer 1116 contacts the first-type semiconductor layer 1111 of the light-emitting body 111B. In this embodiment, for example, when the first electrode layer 1118 is electrically connected to a positive terminal of an external electrode and the second electrode layer 1119 is electrically connected to a negative terminal of the external electrode, a current flows through the first electrode layer 1118 in the holes, the first region 1161 of the conductive layer 1116, the second-type semiconductor layer 1113 of the light-emitting body 111A, the active layer 1112 of the light-emitting body 111A, the first-type semiconductor layer 1111 of the light-emitting body 111A, the second region 1162 of the conductive layer 1116, the second-type semiconductor layer 1113 of the light-emitting body 111B, the active layer 1112 of the light-emitting body 111B, the first-type semiconductor layer 1111 of the light-emitting body 111B, the third region 1163 of the conductive layer 1116 and to the second electrode layer 1119, so the light-emitting bodies 111A, 111B are electrically connected with each other in series. Moreover, based on the aforesaid structure, a process of forming holes 1110 on the light-emitting body 111B can be eliminated and the conductive layer 1116 covers the sidewalls of the light-emitting bodies 111A, 111B for enhancing the luminous flux (lumen) of the light-emitting device 100 and reducing the forward voltage of the light-emitting device 100.

In this embodiment, the first electrode layer 1118, the second electrode layer 1119 and the conductive layer 1116 can be made of metal, for example Au, Ag, Cu, Cr, Al, Pt, Ni, Ti, Sn or alloy thereof. The first insulation layer 1114 can be a single layer or a multilayer. When the first insulation layer 1114 is a single layer, it can comprise oxide, nitride, or polymer. The oxide can comprise $Al_2O_3$, $SiO_2$, $TiO_2$, $Ta_2O_5$, $AlO_x$. The nitride can comprise MN or $SiN_x$. The polymer can comprise polyimide or BCB. When the first insulation layer 1114 is a multilayer, it can be a stack structure for forming a Distributed Bragg Reflector whose material comprising $Al_2O_3$, $SiO_2$, $TiO_2$, $Nb_2O_5$, or $SiN_x$. The second insulation layer 1115 and the third insulation layer 1117 comprise a material referred to the material of the first insulation layer 1114.

Referring to FIGS. 1A and 1C, the light-transmitting body 12 encloses the light-emitting structure 11 and is substantially a cuboid. Accordingly, the light-transmitting body 12 is a rectangular in FIG. 1A. The light-transmitting body 12 has a top surface 121, a bottom surface 122 opposite to the top surface 121, and four side surfaces (a first side surface 123, a second side surface 124, a third side surface 15 and a fourth side surface 126) connecting between the top surface 121 and the bottom surface 122. In FIG. 1A, the first side surface 123 is substantially parallel to the third side surface 125, and they are the longer sides of the rectangle. The second side surface 124 and the fourth side surface 126 are parallel to each other and they are the shorter sides of the rectangle. The second reflective layer 17 covers the first side surface 123 and the third side surface 125 without covering the second side surface 124, the fourth side surface 126, the top surface 121 and the bottom surface 122 so the second reflective layer 17 covers the first side surface 1103 and the third side surface 1105 of the light-emitting structure 11.

Referring to FIG. 1C, the second reflective layer 17 has an outer surface 171 and an inner surface 172. The outer surface 171 is substantially perpendicular to top surface 121 and the inner surface 172 has a curved shape. Specifically, a distance (D1) between the inner surface 172 and the outer surface 171 is gradually decreased in a direction from the top surface 121 to the bottom surface 122 of the light-transmitting body 12. Moreover, the inner surface 172 extends to the first reflective layer 14 and without connecting to the outer surface 171. In addition, the extension electrode layer 15A overlaps the second reflective layer 17 in a Z direction.

Light emitted from the light-emitting structure 11 is reflected by the second reflective layer 17 toward the top surface 121 and/or side surfaces 124, 126 to exit the light-emitting device 100. Furthermore, the second reflective layer 17 is a mixture including a matrix and a plurality of reflective particles dispersed in the matrix so reflection of the light emitted from the light-emitted structure 11 occurs within the second reflective layer 17 and the reflection is called diffuse reflection. The matrix is an insulation material and includes silicone-based material or epoxy-based material. The reflective particle includes $TiO_2$, $SiO_2$, $BaSO_4$, or $Al_2O_3$. Since the thickness of the second reflective layer 17 correlates with its reflectivity which varies with wavelength, the thickness of the second reflective layer 17 (the maximum distance between the inner surface 172 and the outer surface 171) ranges from 50 μm~160 μm. When the thickness of the second reflective layer 17 is less than 50 μm, the second reflective layer 17 has a reflectivity of less than 90% at 430 nm~450 nm, has a reflectivity of less than 88% at 540 nm~570 nm, and has a reflectivity of less than 80% at 620 μm~670 nm. When the thickness of the second reflective layer 17 is about 160 μm, the second reflective layer 17 has a reflectivity of greater than 95% at 430 nm~450 nm, at 540 nm~570 nm, and at 620 nm~670 nm. However, the thickness of the second reflective layer 17 is greater than 160 μm, which results in an increase in the thickness of the light-emitting device 100 and the cost for making thereof for limiting the applicability, for example, mobile phone, liquid crystal display, wearable apparatus like watch, wristband, ring, and so on. In another embodiment, based on various applications, the second reflective layer 17 has a thickness greater than 160 μm, or in a range of 50 μm~1000 μm.

Referring to FIGS. 1B and 1D, the first reflective layer 14 is formed on the third insulation layer 1117, and has a first part 141, a second part, 142 and a third part 143. The extension electrode layers 15A, 15B are formed on the first reflective layer 14. Specifically, the first part 141 of the first reflective layer 14 covers merely a portion of the first electrode layer 1118 and has a curved cross-section. The second part 142 of the first reflective layer 14 is formed between the first electrode layer 1118 and the second electrode layer 1119 and covers a portion of the first electrode layer 1118 and a portion of the second electrode layer 1119. The third part 143 of the first reflective layer 13 covers merely a portion of a first electrode layer 1119. The extension electrode layer 15A covers merely the first part 141 and the second part 142 of the first reflective layer 14, and the extension electrode layer 15B covers merely the second part 142 and the third part 143 of the first reflective layer 14. The extension electrode layers 15A, 15B contact and are electrically connected to the first electrode layer 1118 and the second electrode layer 1119 respectively. The extension electrode layer 15A has a first end 151 with a surface coplanar with the second side surface 124, and a second end 152 formed on the second part 142 of the first reflective layer 14 and having a curved cross-section. The extension electrode layer 15B has a structure similar to that of the extension electrode layer 15A.

In FIG. 1D, the second part 142 contacted directly the third insulation 1117 and fully filled between the first electrode layer 1118 and the second electrode layer 1119 and the light-transmitting body 12 is not formed between the first reflective layer 14 and the third insulation layer 1117. In another embodiment, during manufacturing, the light-transmitting body 12 can be formed between the first reflective layer 14 and the third insulation layer 1117.

Referring to FIGS. 1B and 1C, the wavelength-conversion body 13 is formed within the light-transmitting body 12. In this embodiment, the wavelength-conversion body 13 includes a plurality of wavelength-conversion particles 131 dispersed in a matrix. The wavelength-conversion particles 131 covers the top surface 1102, the first side surface 1103, the second side surface 1104, a portion of the third side surface 1105 and a portion of the fourth side surface 1106. A portion of the third side surface 1105 and a portion of the fourth side surface 1106 are not covered by the wavelength-conversion particles 131. Alternatively, the wavelength-conversion body 13 and/or the light-transmitting body 12 further include diffusion powder. The matrix includes epoxy, silicone, PI, BCB, PFCB, Su8, Acrylic resin, PMMA, PET, PC or polyetherimide. The light-transmitting body 12 includes epoxy, silicone, PI, BCB, PFCB, Su8, Acrylic resin, PMMA, PET, PC or polyetherimide. When the matrix of the wavelength-conversion body 13 has a material same as the light-transmitting body 12, an interface therebetween observed by scan electron microscope (SEM) is vague and unclear. Or, there is no interface existing between the wavelength-conversion body 13 and the light-transmitting body 12, that is, the wavelength-conversion particles dispersed in the light-transmitting body 12.

The wavelength-conversion particles 131 have a particle size of 5 μm~100 μm and include one or more kinds of inorganic phosphor, organic fluorescent colorants, semiconductors, or combinations thereof. The inorganic phosphor includes but is not limited to, yellow-greenish phosphor or red phosphor. The yellow-greenish phosphor comprises aluminum oxide (such as YAG or TAG), silicate, vanadate, alkaline-earth metal selenide, or metal nitride. The red phosphor includes fluoride ($K_2TiF_6:Mn^{4+}$, $K_2SiF_6:Mn^{4+}$), silicate, vanadate, alkaline-earth metal sulfide (CaS), metal nitride oxide, a mixture of tungstate and molybdate. The weight percentage (w/w) of the wavelength-conversion particles within the matrix is between 50%~70%. The semiconductors include crystal with nano-sizes, for example, quantum dot. The quantum dot can be ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, CuInS, $CsPbCl_3$, $CsPbBr_3$, or $CsPbI_3$.

The diffusing powder includes titanium dioxide, silicon dioxide, aluminum oxide, zinc oxide, or zirconium dioxide for diffusing the light emitted from the light-emitting structure 11. The weight percentage (w/w) of the diffusing powder within the matrix is between 0.1%~0.5% and has a particle size between 10 nm~100 nm or between 10 μm~50 μm. In an embodiment, the weight percentage of the diffusing powder (or the wavelength-conversion particles) within the matrix can be measured by a thermogravimetric analyzer (TGA). Specifically, the matrix is removed (through evaporation or pyrolysis) by increasing the temperature to a certain temperature so the diffusing powder (or the wavelength-conversion particles) is remained. The change of the weight can be measured and the weight of the matrix and the weight of the diffusing powder (or the wavelength-conversion particles) can be respectively derived from the change of the weight, and the weight percentage of the diffusing powder within the matrix can be calculated. Or, the total weight of the matrix and the diffusing powder (or the wavelength-conversion particles) can be measured first, and a solvent is applied to remove the matrix so the weight of the diffusing powder (or the wavelength-conversion particles) can be measured. Then, the weight percentage of the diffusing powder (or the wavelength-conversion particles) within the matrix can be calculated.

The wavelength-conversion particles 131 can absorb a first light emitted from the light-emitting structure 11 and convert the first light to a second light having a spectrum different from that of the first light. The first light is mixed with the second light to produce a third light. In this embodiment, the third light has chromaticity coordinates (x, y) on CIE 1931 chromaticity diagram, wherein 0.27≤x≤0.285; 0.23≤y≤0.26. In another embodiment, the first light is mixed with the second light to produce a third light, such as a white light. Based on the weight percentage and the material of the wavelength-conversion particles, the light-emitting device has a correlated color temperature of about 2200K~6500K (ex. 2200K, 2400K, 2700K, 3000K, 5000K~5700K, 6500K) under a thermal stable state with a color point (CIE x, y) within a seven-step MacAdam ellipse and a color rendering index greater than 80 or greater than 90. In another embodiment, the first light is mixed with the second light to produce purple light, amber light, green light, yellow light or other non-white light.

In FIGS. 1A~1C, the first side surface 123 and the third side surface 125 are covered by the second reflective layer 17, and the bottom surface 122 is covered by the first reflective layer 14 and the extension electrode layers 15A, 15B, therefore, the light-emitting device 100 has three light emitting surfaces. In other words, the light emitted from the light-emitting structure 11 pass directly through the top surface 121, the second side surface 124 and the fourth side surface 126 of the light-transmitting body 12 to exit the light-emitting device 100. The light-emitting angle, which will be described later, of the light-emitting structure 11 is about 140° so more than 50% of light emits outward from the top surface 1101 (or the top surface 121 of the light-transmitting body 12). The top surface 1101 of the light-emitting structure 11 is defined as a main light-emitting surface. The light-emitting directions of the light-emitting structure 11 and the light-emitting device 100 are identical, that is, light emit outward along the Z axis (exiting the light-emitting device 100). Accordingly, the main light-emitting surface of the light-emitting structure 11 and the light-emitting surface of the light-emitting device 100 are substantially parallel to each other.

FIGS. 2A~2C show cross-sectional views of light-emitting devices 100', 100", 100''' in accordance with embodiments of the present disclosure, respectively. Each of the light-emitting devices 100', 100", 100''' has a structure similar to that of the light-emitting device 100, and devices or elements with similar or the same symbols represent those with the same or similar functions. As shown in FIG. 1C, FIGS. 2A~2C show cross-sectional views taken along lines II-II of FIG. 1A. The corresponding bottom view can be referred to FIG. 1A and the corresponding cross-sectional views taken along lines I-I can be referred to FIGS. 1B and 1D.

Referring to FIG. 2A, the second reflective layer 17' has an outer surface 171' and an inner surface 172'. The outer surface 171' is substantially perpendicular to top surface 121 and the inner surface 172' has a curved shape. Specifically, a distance (D1) between the inner surface 172' and the outer surface 171' is gradually decreased in a direction from the top surface 121 to the bottom surface 122 of the light-transmitting body 12. Moreover, the inner surface 171' connects to the outer surface 171'.

Referring to FIG. 2B, the second reflective layer 17" has an outer surface 171" and an inner surface 172". The outer surface 171" is a surface perpendicular to top surface 121 and the inner surface 172" has a curved shape. Specifically, a distance (D1) between the inner surface 172" and the outer surface 171'' is gradually increased in a direction from the top surface 121 to the bottom surface 122 of the light-transmitting body 12.

Referring to FIG. 2C, the second reflective layer 17''' has an outer surface 171''' and an inner surface 172'. The outer surface 171''' and the inner surface 172''' are substantially perpendicular to the top surface 121.

FIG. 2D show a cross-sectional view of light-emitting device 200 in accordance with an embodiment of the present disclosure. The light-emitting device 200 has a structure similar to that of the light-emitting device 100, and devices or elements with similar or the same symbols represent those with the same or similar functions. In this embodiment, the second reflective layer 27 includes metal such as Au, Ag, Cu, Cr, Al, Pt, Ni, or Rh. Accordingly, reflection of the light emitted from the light-emitted structure 11 occurs at the second reflective layer 27 and the reflection is called specular reflection. In addition, when the second reflective layer 27 is metal and has a thickness of 50~200 Å, its reflectivity is 99% so a thickness of the light-emitting device 200 in the Y direction can be reduced and the applicability of the light-emitting device 200 (for example, mobile phone, liquid crystal display, wearable apparatus (watch, wristband, ring, etc.)) is therefore increased. The second reflective layer 27 can be formed on the light-transmitting body 12 by sputtering, electroplating or chemical plating. Alternatively, an adhesive (not shown), such as $TiO_2$, can be formed between the second reflective layer 27 and the light-transmitting body 12 for improving adhesion therebetween. Or, the light-transmitting body 12 is undergone a surface treatment (for example, He plasma, $O_2$ plasma, or $N_2$ plasma) and the second reflective layer 27 is immediately formed thereon (that is, the second reflective layer 27 contacts directly the light-transmitting body 12). The surface treatment improves adhesion between the second reflective layer 27 and the light-transmitting body 12.

The cross-sectional shape of the second reflective layer is determined by the shape and size of a cutter used in the process. When the cutter has a curved shape in cross section, the second reflective layer has a curved inner surface (shown in FIGS. 1C, 2A and 2B). When the cutter has a straight-line shape in cross section, the second reflective layer has a straight-line inner surface (shown in FIGS. 2C, 2D). Of course, the curvature of the curved shape is also determined by the shape and the size of the cutter. In addition, the shape of the inner surface of the second reflective layer affects the light intensity of the light-emitting device. Generally speaking, compared to the straight-line shape in cross section, more light can exit the light-emitting device while the light-emitting device has the second reflective layer having the inner surface with the curved shape in cross section. Furthermore, the light-emitting device of FIG. 2B has a light intensity (for example, luminous flux (lumen)) greater than that of FIG. 2A or FIG. 1C.

Referring to FIG. 1A, since the second reflective layer 17 covers merely the first side surface 123 and the third side surface 125, the light emitted from the light-emitting structure 11 toward the first side surface 123 and the third side surface 125 is reflected by the second reflective layer 17. On the contrary, the light toward the second side surface 124 and the fourth side surface 126 exit directly from the light-emitting device 100. Therefore, the light-emitting device has different light-emitting angle in different directions. Furthermore, FIG. 1F shows a drawing of how to measure the lighting apparatus 100. A goniophotometer (product numbered LID-100CS from AMA Optoelectronics. Inc.) is used to measure the luminous intensities of each points on circle P1 or P2 while the lighting apparatus 100 emits light, wherein the circles P1 and P2 are virtual and are defined for measurement. The luminous intensity of each point on circle P1 is measured with an angle to obtain a first luminous intensity distribution curve and to derive a first light-emitting angle ($\Theta_1$, the longer side, X direction). Likewise, the luminous intensity of each point on circle P2 o is measured with an angle to obtain a second luminous intensity distribution curve and to derive a second light-emitting angle ($\Theta_2$, the shorter side, Y direction). The detailed description of circles P1 and P2 can be referred to the content disclosed in the TW patent application 105114875. The first light-emitting angle $\Theta_1$ is greater than the second light-emitting angle $\Theta_2$. In one embodiment, the first light-emitting angle $\Theta_1$ is of 130~150°, and the second light-emitting angle $\Theta_2$ is of 100~125°. Or, a difference of the first light-emitting angle $\Theta_1$ and the second light-emitting angle $\Theta_2$ is greater than 15° and of 15~40°. The light-emitting angle is defined as a range of angle from the angle of maximum luminous intensity to the angle of half (50%) of the maximum luminous intensity. The detailed description of the light-emitting angle can be referred to the content disclosed in the TW patent application 104103105.

Two light-emitting bodies in FIG. 1A are electrically connected in series. In another embodiment, the light-emitting structure can include one light-emitting body and more than three light-emitting bodies which are electrically connected in series, in parallel or series-parallel or bridge. When the light-emitting structure includes a plurality of light-emitting bodies, the plurality of light-emitting bodies can be commonly formed on one substrate, or each of the plurality of light-emitting bodies has a substrate and then being mounted on a carrier. Alternatively, some of the light-emitting bodies are commonly formed on a substrate, and other light-emitting bodies have respective substrates and then are mounted commonly on a carrier. In addition, two light-emitting bodies in this embodiment are flip-chip structures and are electrically connected to each other by a conductive layer. In another embodiment, two light-emitting bodies are horizontal structure and are electrically connected to each other through wire bonding.

When the aforesaid light-emitting body has a heterostructure, the first-type semiconductor layer and the second-type semiconductor layer, for example a cladding layer or a confinement layer, provide holes and electrons, respectively, and each type layer has a bandgap greater than that of the active layer, thereby increasing the probability of electrons and holes combining in the active layer to emit light. The first-type semiconductor layer, the active layer, and the second-type semiconductor layer can be made of III-V group semiconductor materials, such as $Al_xIn_yGa$ N or $Al_xIn_yGa_{(1-x-y)}P$, wherein 0≤x, y≤1; (x+y)≤1. Depending on the material of the active layer, the light-emitting diode can emit a red light with a peak wavelength or dominant wavelength of 610~650 nm, a green light with a peak wavelength or dominant wavelength of 530~570 nm, a blue light with a peak wavelength or dominant wavelength of 450~490 nm, a purple light with a peak wavelength or dominant wavelength of 400~440 nm, or a UV light with a peak wavelength of 200~400 nm.

FIGS. 3A~3G show cross-sectional views of making a light-emitting device in accordance with an embodiment of the present disclosure. FIGS. 4A~4G show top views of FIGS. 3A~3G, respectively. FIGS. 3A~3G cross-sectional view taken along lines W-W of FIGS. 4A~4G, respectively. For simplification, the light-emitting structure 11 is shown as cuboid in FIGS. 2A~2J for exemplary illustration. The shape of the light-emitting structure 11 in top view can also be trapezoid, parallelogram, diamond, triangle, pentagon, hexagon, or round. For clear illustration, each layer is drawn in solid lines regardless of an opaque, transparent, or translucent material.

Figure 3A:
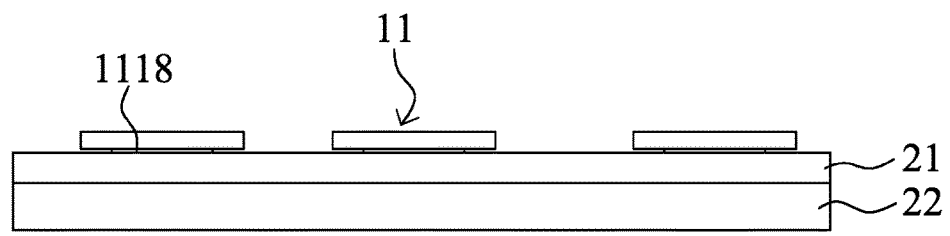
Figure 4A:
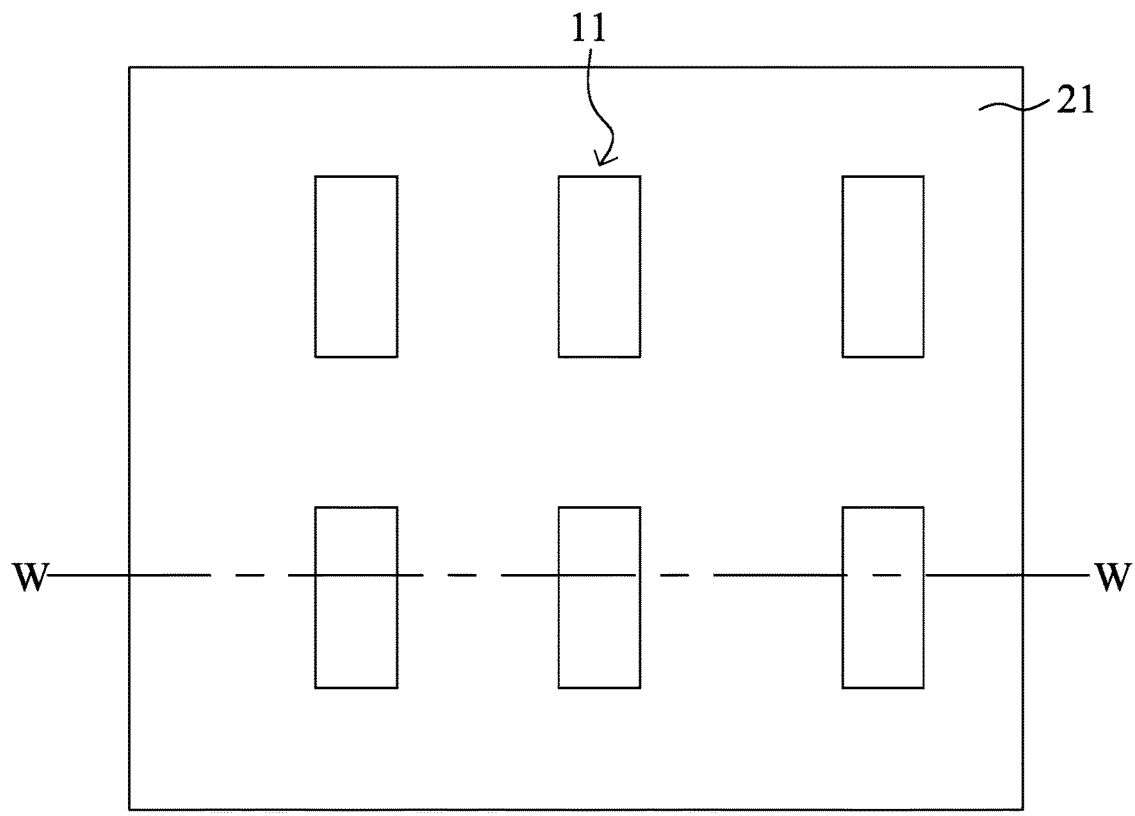

Referring to FIGS. 3A and 4A, a carrier 22 is provided, an adhesion layer 21 is attached to the carrier 22 and a plurality of light-emitting structure 11 is disposed on the adhesion layer 21. In the embodiment, the light-emitting structure 11 is attached to the adhesion layer 21 through the first electrode layer 1118 and the second electrode layer 1119. The number and arrangement of the light-emitting structure 11 is illustrative, and not intended to limit the scope of the present disclosure.

Figure 3B:
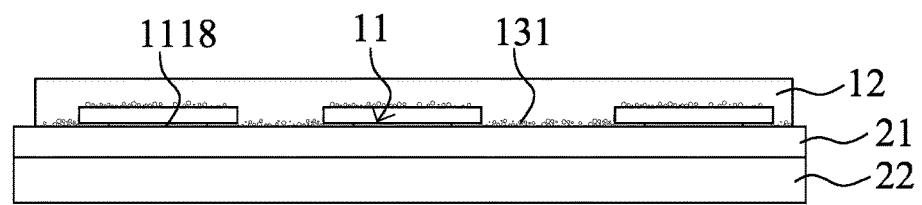
Figure 4B:
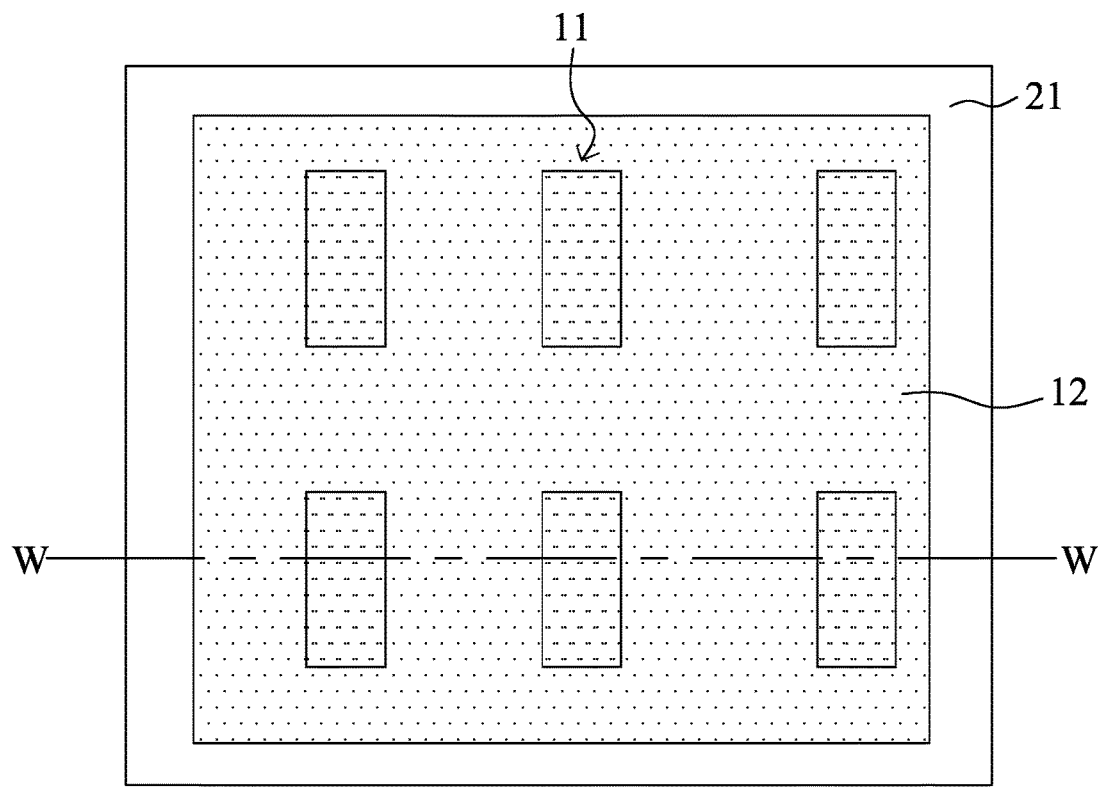

Referring to FIGS. 3B and 4B, a transparent body including a plurality of wavelength conversion particles 131 covers the light-emitting structure 11 completely. The transparent body can be formed on the light-emitting structure 11 by spraying, coating, dispensing or screen printing. Thereafter, the transparent body is cured to form the light-transmitting body 12. If the transparent body is formed on the light-emitting structure 11 by spraying or dispensing, the transparent body has various heights (Z direction) at different locations across its whole area. After curing, the transparent body is cured to form the light-transmitting body 12 with different heights at different locations. Therefore, a physical removal process is conducted to planarize the light-transmitting body 12 so the top surface 121 of the light-transmitting body 12 is substantially flat. The definition of "the physical removal process" and "the substantially flat" will be described later.

Moreover, in this embodiment, because of gravity, during the curing, the wavelength conversion particles 131 are naturally precipitated and thus most of the wavelength conversion particles 131 can contact the light-emitting structure 11 and a portion of the wavelength conversion particles 131 is attached to the side surface of the light-emitting structure 11 (the detailed description is referred to FIGS. 1B and 1C). In another embodiment, it is possible to control the temperature and time of the curing to change distributions of the wavelength conversion particles 131. For example, the transparent body is fully cured before the wavelength conversion particles 131 do not precipitate near the bottom so the wavelength conversion particles 131 are suspended within the light-transmitting body 12 and do not contact the light-emitting structure 11. Or, an anti-precipitation agent (such as $SiO_2$) is added into the transparent body for preventing the wavelength conversion particles 131 from precipitating near the bottom during curing so the wavelength conversion particles 131 can be uniformly dispersed within the light-transmitting body 12.

In another embodiment, the transparent body with the wavelength conversion particles can be pre-formed as a wavelength conversion sheet and to adhere to the light-emitting structure 11. The adhesion is established by tightly sealing an upper mold (not shown) and a lower mold (not shown) with heat and pressure for softening the wavelength conversion sheet. Then, the wavelength conversion sheet tightly adheres to the light-emitting structure 11. Alternatively, the air is extracted out when the upper mold is very close to the lower mold and the wavelength conversion sheet does not contact the light-emitting structure 11. The bubble between the wavelength conversion sheet and the light-emitting structure 11 can be eliminated and the strength of joint can be enhanced.

Referring to FIGS. 3C, 3D, 4C and 4D, a cutter 23 is provided and a cutting step is performed along the cutting line L in the X direction to form a plurality of trenches 231 in the light-transmitting body 12. The trenches 231 have a shape corresponding to the cutter 23. For example, in this embodiment, the cutter 23 has a curved cross-section and therefore the trenches 231 have the curved cross-section. In addition, the light-transmitting body 12 also has the curved cross-section, and the curved cross-section is close to the bottom surface 122 and surrounds the light-emitting structure 11. Moreover, a distance between the curved cross-section and the light-emitting structure 11 is gradually decreased in the Z direction.

Figure 3C:
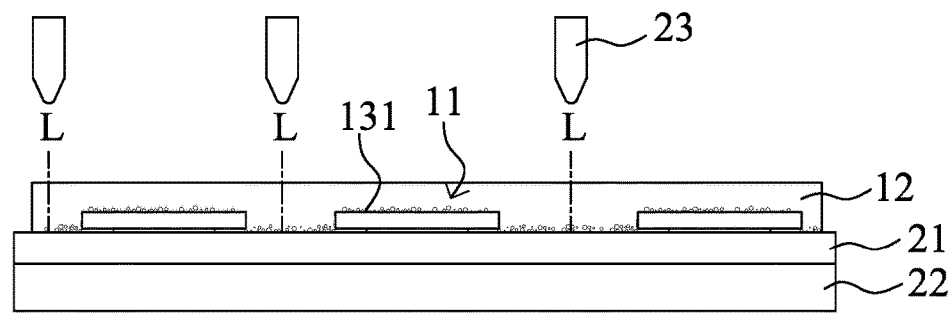
Figure 4C:
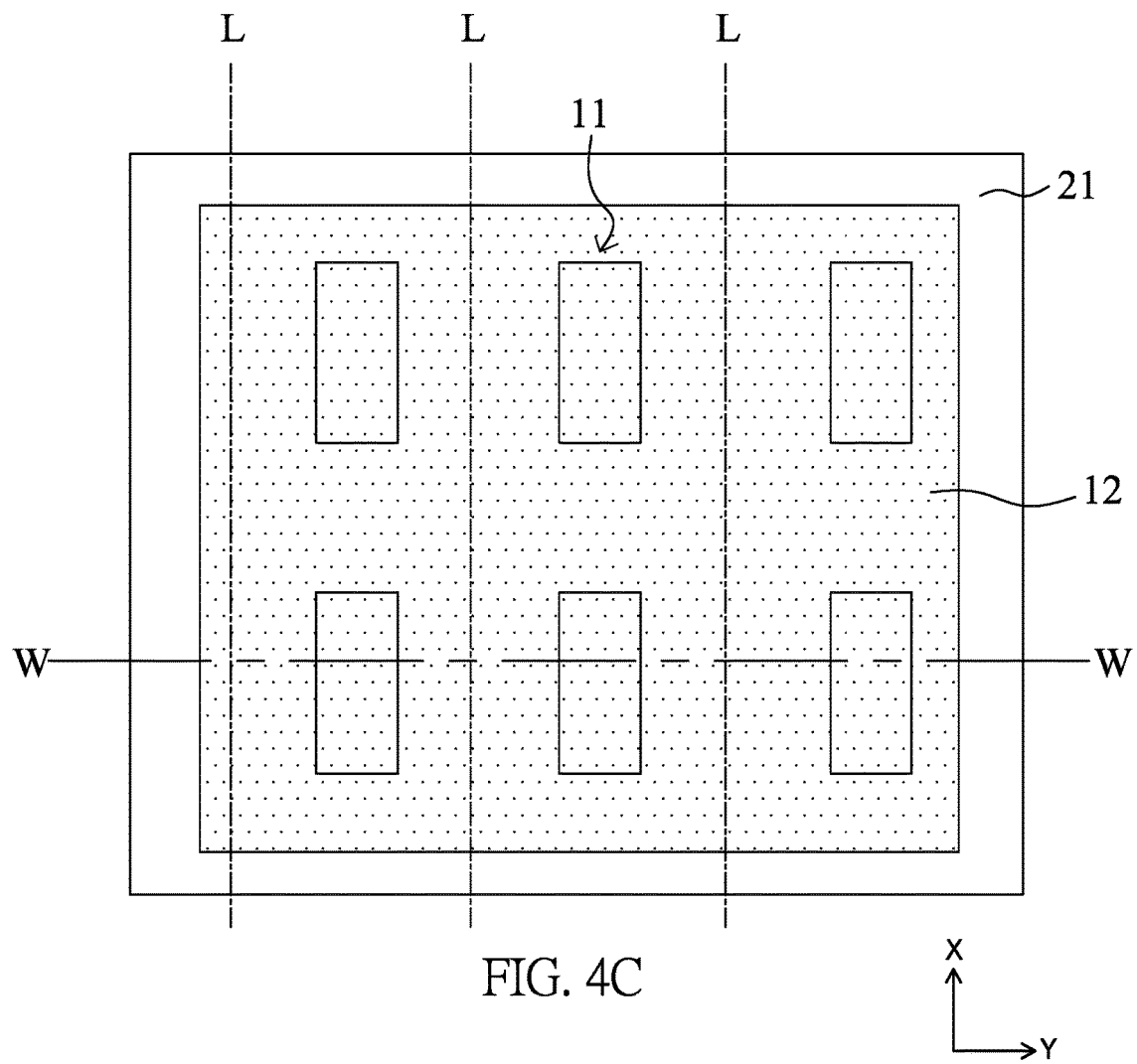
Figure 3D:
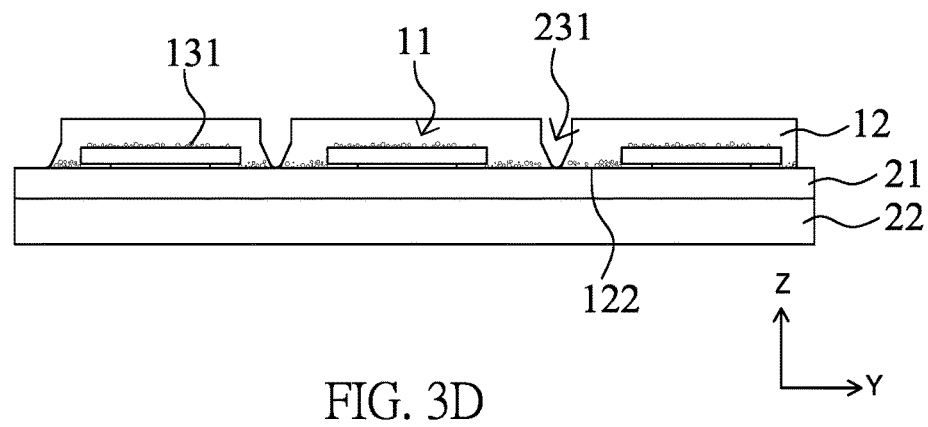
Figure 4D:
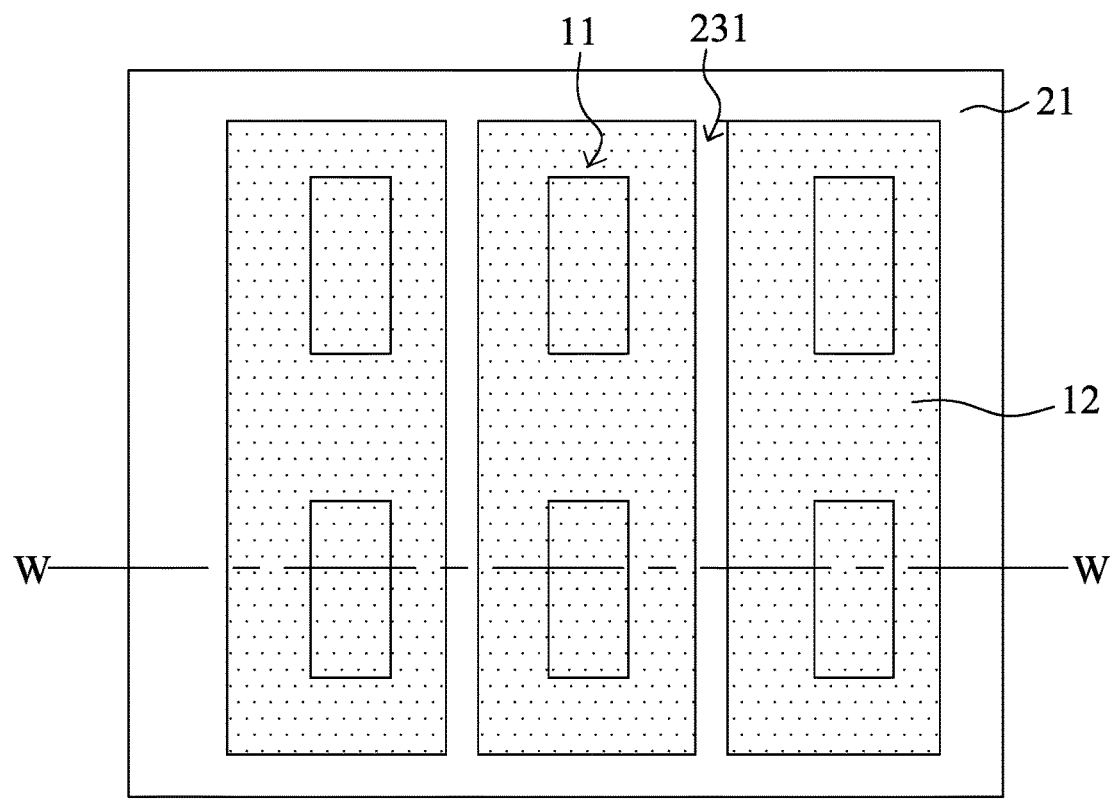
Figure 3E:
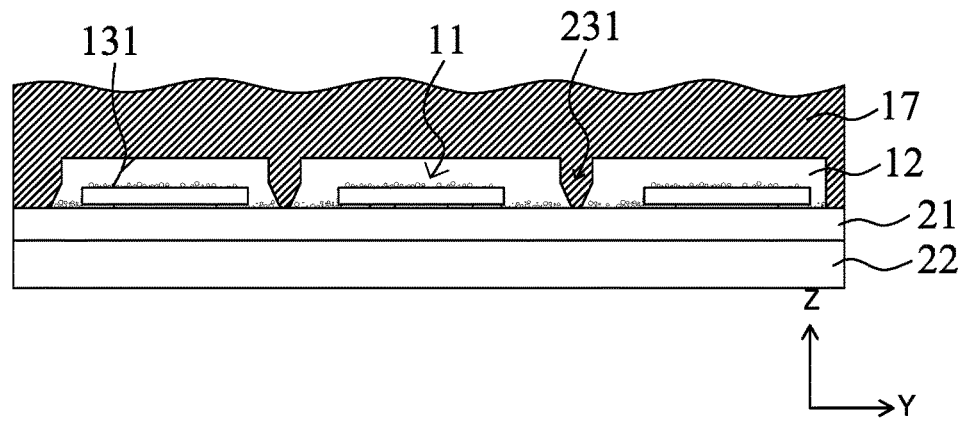
Figure 4E:
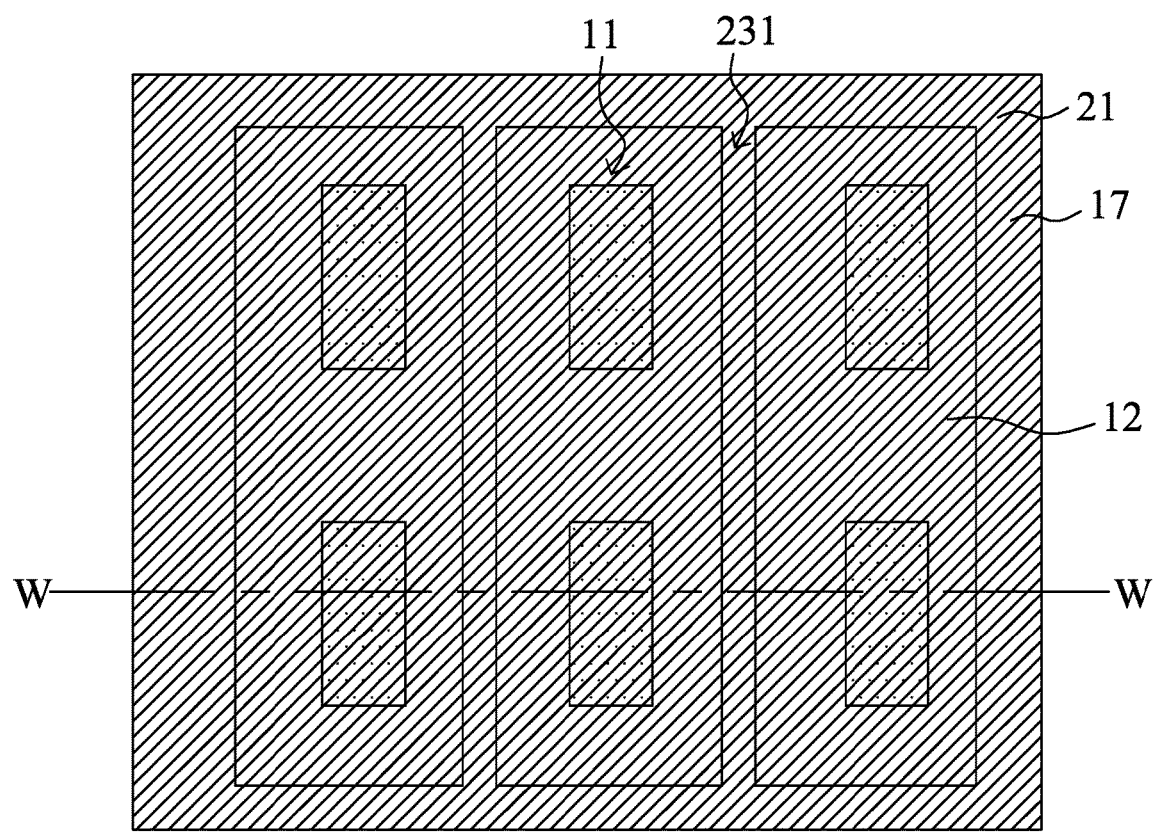

Referring to FIGS. 3E and 4E, a plurality of reflective particles is mixed into a matrix to form a paste in an uncured state, wherein the paste includes matrix and reflective particles and has a color determined by the reflective particles, which is generally white. Subsequently, the paste is added to cover the light-transmitting body 12 and the trenches 231 wherein the trenches 231 can be completely covered or partially covered by the paste or have bubble remaining in the paste. Then, the paste is cured to form the second reflective layer 17. The second reflective layer 17 has a height greater than that of the light-transmitting body 12. The second reflective layer 17 can be formed on the light-emitting structure 11 by spraying, coating, dispensing or screen printing. Likewise, the second reflective layer 17 can be a pre-formed sheet and adheres to the light-transmitting body 12. The description of the adhesion can be referred to the aforesaid paragraphs.

Figure 3F:
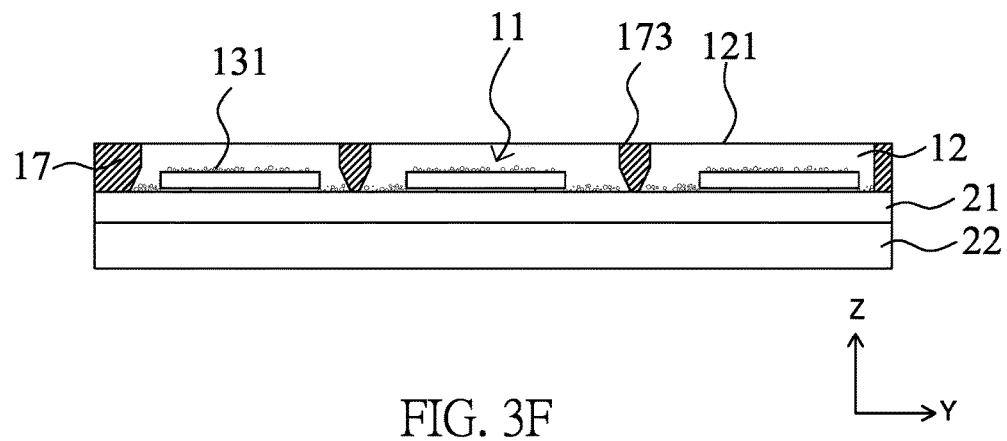
Figure 4F:
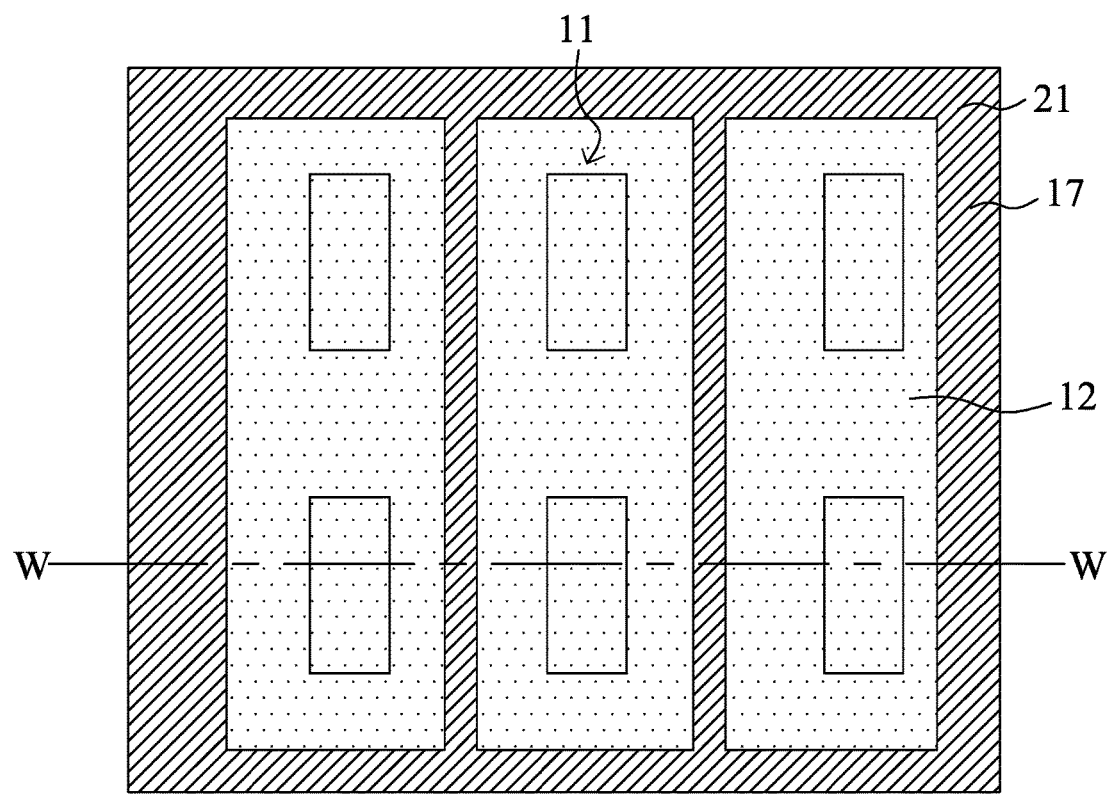

Referring to FIGS. 3F and 4F, the physical removal process (polishing or cutting) is preformed to remove a portion of the second reflective layer 17 to expose the light-transmitting body 12. In the embodiment, the paste is formed by spraying or dispensing and has various heights (Z direction) at different locations across its whole area (as shown in FIG. 3E). After curing, the paste is cured to form the second reflective layer 17 having different heights at different locations as well. In the physical removal process, a portion of the second reflective layer 17 is removed to expose the light-transmitting body 12. Furthermore, the physical removal process is performed continuously to remove the second reflective layer 17 and the light-transmitting body 12 simultaneously so the height of the light-transmitting body 12 can be reduced. The height of the light-transmitting body 12 in FIG. 3F can be equal to or smaller than that of FIG. 3E. In addition, the second reflective layer 17 has a top surface 173 substantially coplanar with the top surface 121 of the light-transmitting body 12. The top surfaces 121, 173 are substantially flat.

The definition of "substantially flat" herein is when the light-emitting device 100 is observed by scanning electron microscope (SEM) at 60×~100× magnification, the surface are not substantially and severely rugged. However, when the light-emitting device 100 is observed by scanning electron microscope (SEM) at larger than 400× magnification, or measured by atomic force microscope (AFM), the light-transmitting body 12 and the second reflective layer 17 may have rough top surfaces 121, 173. In addition, in this embodiment, the matrix of the light-transmitting body 12 is silicone with a hardness of 30-90 (Shore D) and the matrix of the second reflective layer 17 is silicone with a hardness of 10-70 (Shore D). The difference of hardnesses between the light-transmitting body 12 and the second reflective layer 17 is smaller than 30. After the physical removal process, the maximum roughness (Ra1) of the top surface 121 of the light-transmitting body 12 can be slightly larger than, equal to or slightly smaller than that of the top surface 173 of the second reflective layer 17 (Ra2). By measuring the top surface 121 of the light-transmitting body 12 by alpha step film thickness measuring instrument in a measuring length of 0.5 mm, the difference (defined as the maximum roughness) between the highest point and the lowest point among the top surface 121 of the light-transmitting body 12 is Ra1; likewise, by measuring the top surface 173 of the second reflective layer 17 in a measuring length of 0.5 mm, the difference between the highest point and the lowest point among the top surface 173 of the second reflective layer 17 is Ra2; wherein 2 µm≤Ra1≤15 µm; 2 µm≤Ra2≤15 µm; 0≤|Ra1−Ra2|≤13 µm.

The physical removal process is conducted by machinery cutters. The cutter can be composed of high-carbon steel, diamond, ceramic or BN. During the removal process, only water (no slurry or chemical solution) is provided to lower the temperature which is raised due to friction between the cutter and the material to be cut (for example, the second reflective layer 17 or the light-transmitting body 12), and to wash the residue from the removed second reflective layer 17 and the removed light-transmitting body 12. Moreover, while the cutter having a hardness larger than that of the second reflective layer 17 and the removed light-transmitting body 12 is selected, a plurality of scratched lines (not shown) which can be observed by optical microscope is formed thereon. In another embodiment, by adjusting cutting parameters (for example, cutting speed or the material of the cutter), the scratched lines may not be observed by optical microscope.

Referring to FIGS. 3G, 4G, 5A~5C, a cutting step is performed along the cutting line L (in the X direction and Y direction) to form a plurality of light-emitting devices 300. Subsequently, the adhesion layer 21 is heated or is irradiated by UV radiation light so the light-emitting structure 11 and the light-transmitting body 12 are separated from the adhesion layer 21. Alternatively, a first reflective layer 14 and extension electrode layers 15A, 15B are further formed, and the detailed description can be referred to other corresponding paragraphs.

Referring to FIGS. 3C and 4C, by cutting at different locations, a relative position between the light-transmitting body 12 and the light-emitting structure 11 is varied, that is, a distance between the first side surface 1103 and the first side surface 123 and a distance between the third side surface 1105 and the third side surface 125 (referring to FIG. 1A) are changed. Then, referring to FIGS. 3F and 4F, the second reflective layer 17 is filled into the trenches 231 and covers the side surfaces of the light-transmitting body 12. When light emitted from the light-emitting structure 11 emits toward the second reflective layer 17, the light is reflected or refracted at an interface between the light-transmitting body 12 and the second reflective layer 17 (for example, the first side surface 123 of the light-transmitting body 12 or the inner surface 172 of the second reflective layer 17). In conclusion, by controlling the step of FIG. 3C, a light-emitting device with desired far field pattern and light intensity (for example, luminous flux (lumen)) can be obtained.

Figure 6A:
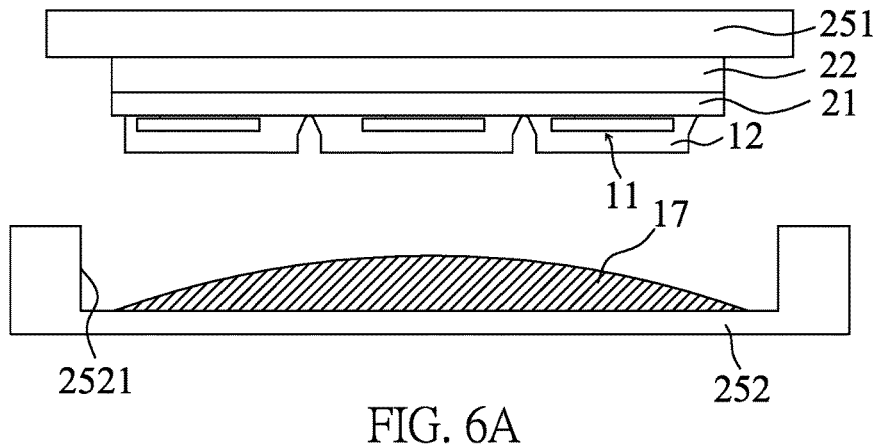
FIGS. 6A~6B show cross-sectional views of forming a second reflective layer in accordance with an embodiment of the present disclosure.
Figure 6B:
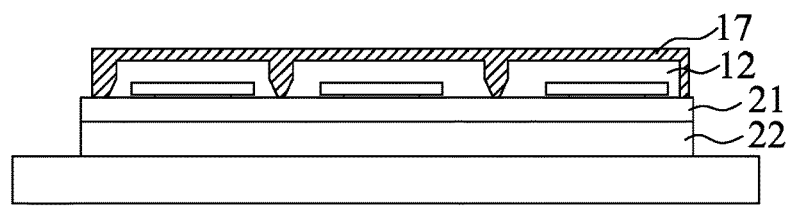

FIGS. 6A~6B show cross-sectional views of a second reflective layer 17 in accordance with an embodiment of the present disclosure. After cutting (shown in FIG. 3D), an upper mold 251 and a lower mold 252 are provided. A carrier 22 is mounted on the upper mode 251 and the uncured paste is filled in a recess 2521 of the lower mold 252. The upper mold is close to the lower mold to conduct a compressing molding so the paste covers the light-transmitting body 12 and completely filled in the trenches 231. A heat process is conducted to cure the paste to form the second reflective layer 17. Due to the formation of the second reflective layer 17 by molding in the embodiment, the second reflective layer 17 on the light-transmitting body 12 has the same height at different locations. The subsequent processes can be referred to the description of FIGS. 3F~3G.

FIGS. 7A~7G show cross-sectional views of making a light-emitting device 400 in accordance with an embodiment of the present disclosure. The top views can be referred to FIGS. 4A~4G.

Figure 7A:
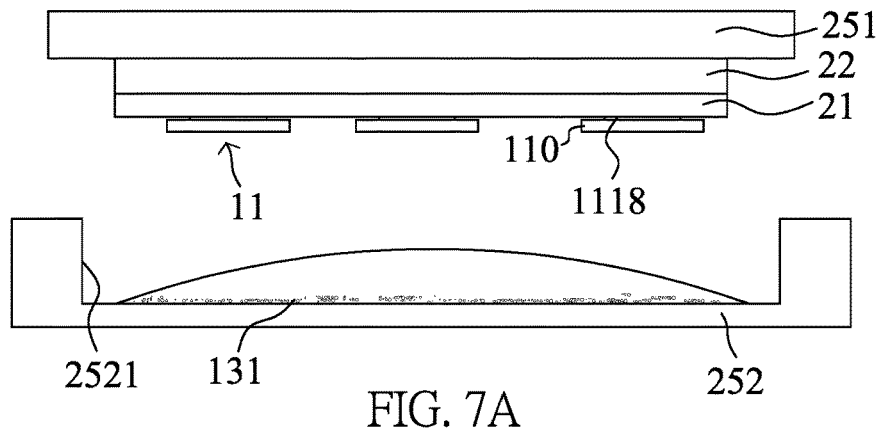

Referring to FIG. 7A, a carrier 22 is provided, an adhesion layer 21 is attached to the carrier and a plurality of light-emitting structure is disposed on the adhesion layer 21. In the embodiment, the light-emitting structure 11 is attached to the adhesion layer 21 through the first electrode layer 1118 and the second electrode layer 1119. In addition, the carrier 22 is mounted on the upper mold 251 and the substrate 110 of the light-emitting structure 11 faces toward the lower mold 252. A transparent body with a plurality of wavelength conversion particles is filled into the recess 2521 of the lower mold 251. Then, a compression molding is conducted so the transparent body covers the light-emitting structure 11 completely. Because of gravity, during curing, the wavelength conversion particles 131 precipitate close to the bottom of the mold 252. Accordingly, while the transparent body is fully cured, the wavelength conversion particles 131 accumulate at the top surface 121 of the light-transmitting body 12. In another embodiment, by controlling the temperature and time of the curing, the transparent body is fully cured to form the light-transmitting body 12 before the wavelength conversion particles 131 precipitate close to the bottom of the mold 252. Or, an anti-precipitation agent is added into the transparent body for preventing the wavelength conversion particles 131 from precipitating near the bottom during curing.

Figure 7B:
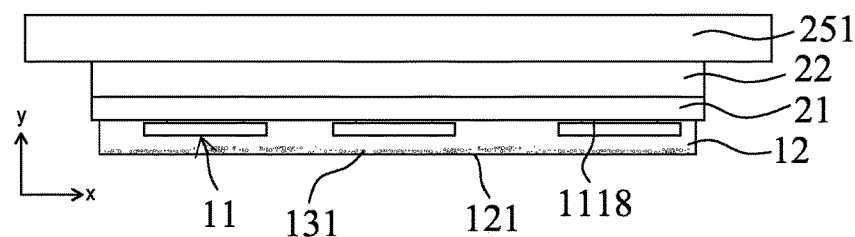
Figure 7C:
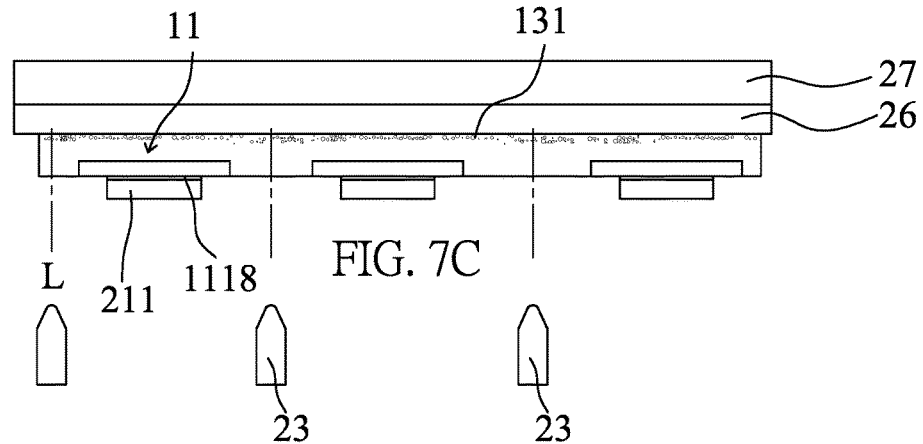
Figure 7D:
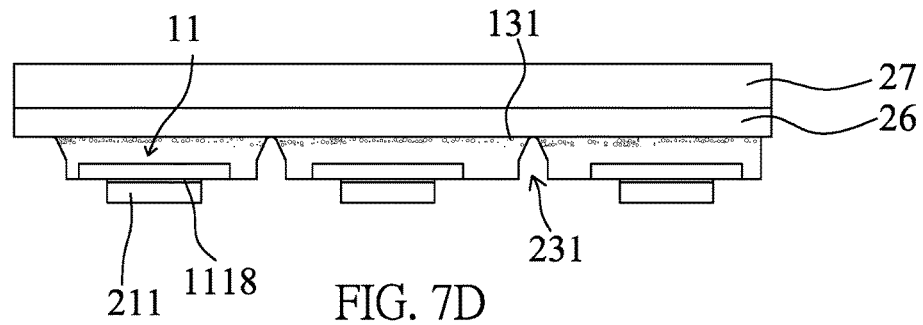

Referring to FIGS. 7B~7D, an adhesion layer 26 attaching to a carrier 27 is provided. After attaching the light-transmitting body 12 in the structure of FIG. 7B to the adhesion layer 26, the adhesion layer 21 is heated or is irradiated by UV radiation light so the light-emitting structure 11 and the light-transmitting body 12 are separated from the adhesion layer 21 (the adhesion layer 21 and the carrier 22 are not shown in FIG. 7C) to expose the electrode layers 1118, 1119 (the electrode layer 1119 is not shown in the figure). An electrode layer 211 is formed on the electrode layers 1118, 1119. The electrode layer 211 can be formed on the electrode layers 1118, 1119 of a single light-emitting structure 11, respectively. Alternatively, the electrode layer 211 can be formed on the electrode layer 1118 of one light-emitting structure and the electrode layer 1119 of adjacent light-emitting structure to electrically connect these light-emitting structures in series (not shown). Furthermore, a cutter 23 is provided and a cutting step is performed along the cutting line L to form a plurality of trenches 231 in the light-transmitting body 12. The trenches 231 have a shape corresponding to the cutter 23. For example, in this embodiment, the cutter 23 has a curved cross-section and therefore the trenches 231 have the curved cross-section.

Figure 7E:
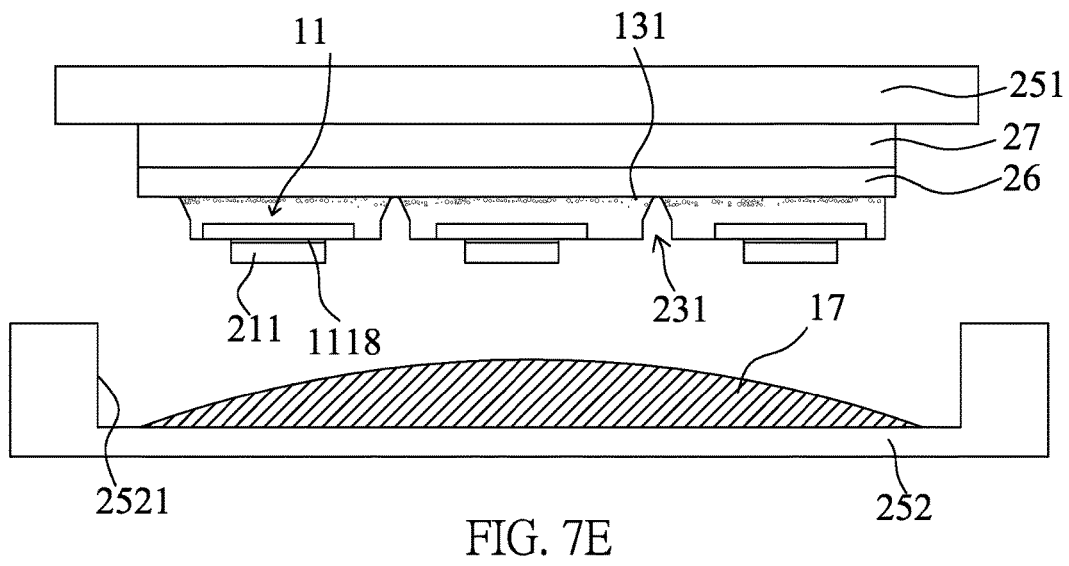

Referring to FIGS. 7E and 7F, likewise, the carrier 27 is mounted on the upper mode 251 and the uncured paste is filled in a recess 2521 of the lower mold 252. Then, a compression molding is conducted so the uncured paste covers light-transmitting body 12, the electrode layer 211 and completely filled in the trenches 231. A heating process is conducted to cure the paste to form the second reflective layer 17. Due to the formation of the second reflective layer 17 by molding in the embodiment, the second reflective layer 17 on the light-transmitting body 12 has the same height at different locations. In addition, the second reflective layer 17 has a height higher than that of the light-transmitting body 12.

Referring to FIG. 7G, the physical removal process (polishing or cutting) is preformed to remove a portion of the second reflective layer 17 to expose the electrode layer 211. Furthermore, the physical removal process is performed continuously so the second reflective layer 17 and the electrode layer 211 are simultaneously removed, thereby the height of the electrode layer 211 can be reduced. The height of the electrode layer 211 in FIG. 7G can be equal to or smaller than that of the electrode layer 211 in FIG. 7F. The second reflective layer 17 has a top surface 173 substantially coplanar with the top surface 2111 of the electrode layer 211. In this embodiment, after the physical removal process, the maximum roughness (Ra3) of the top surface 211 of the electrode layer 211 can be slightly larger than, equal to or slightly smaller than that of the top surface 173 of the second reflective layer 17 (Ra4). By alpha step film thickness measuring instrument in a measuring length of 50 μm, the difference (defined as the maximum roughness) between the highest point and the lowest point by measuring the top surface 2111 of the electrode layer 211 is Ra3. Likewise, by measuring the top surface 173 of the second reflective layer 17 in a measuring length of 50 μm, the difference between the highest point and the lowest point among the top surface 173 of the second reflective layer 17 is Ra4; wherein 2 μm≤Ra3≤15 μm; 2 μm≤Ra4≤15 μm; 0≤|Ra4−Ra3|≤13 μm.

Referring to FIG. 7G, a cutting step is performed along the cutting line L to form a plurality of light-emitting devices 400 as shown in FIGS. 8A~8C. The adhesion layer 26 is heated or is irradiated by UV radiation light so the light-emitting structure 11 and the light-transmitting body 12 are separate from the adhesion layer 26. Different from the light-emitting devices 300 of FIGS. 5A~5C, the curved cross-section of the light-transmitting body 12 in the light-emitting devices 400 of FIGS. 8A~8C does not surround the light-emitting structure 11 and close to the top surface 121 of the light-transmitting body 12.

The adhesion layers 21, 26 and the carriers 22, 27 are used as a temporary carrier for mounting the light-emitting structure or the light-emitting device during manufacturing. The adhesion layers 21, 26 include blue tape, thermal release sheet or tape, UV release tape or polyethylene terephthalate (PET). The carriers 22, 27 include glass or sapphire for supporting the adhesion layers 21, 26.

FIGS. 9A~9E show top views of making a light-emitting device 500 in accordance with an embodiment of the present disclosure. The corresponding cross-sectional views can be referred to other paragraphs.

Figure 9A:
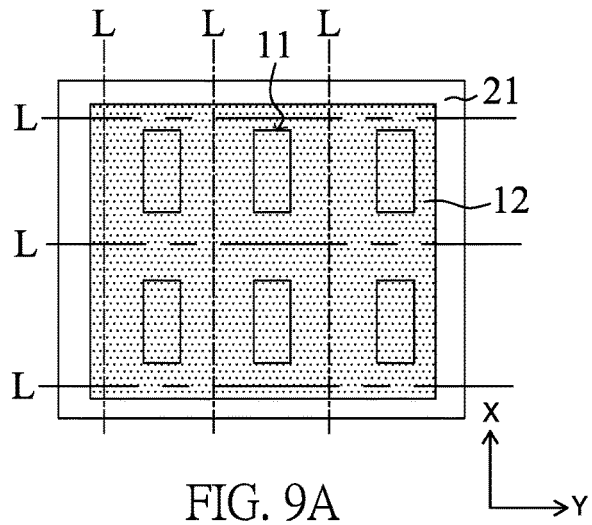
FIGS. 9A~9E show top views of making a light-emitting device in accordance with an embodiment of the present disclosure.
Figure 9B:
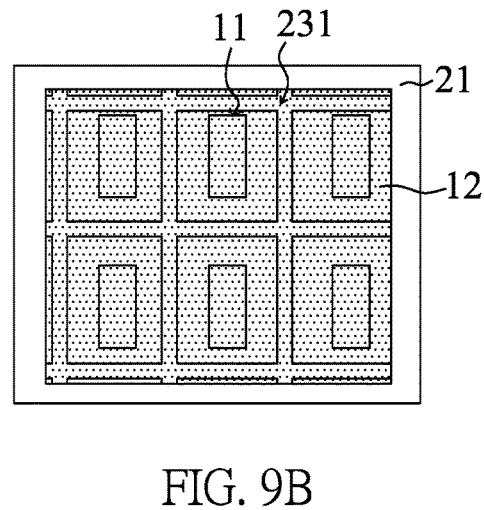

Referring to FIGS. 9A and 9B, a cutting step using a cutter (not shown) is performed along the cutting line L in the X direction and Y direction to form a plurality of trenches 231 in the light-transmitting body 12.

Figure 9C:
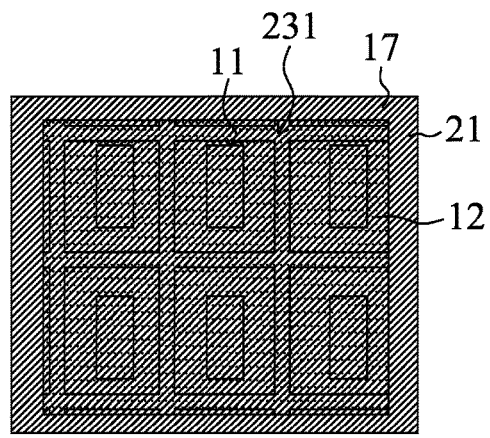

Referring to FIG. 9C, a second reflective layer 17 is formed to cover the light-transmitting body 12 and completely filled in the trenches 231. The formation of the second reflective layer 17 can be referred to the aforesaid paragraphs.

Figure 9D:
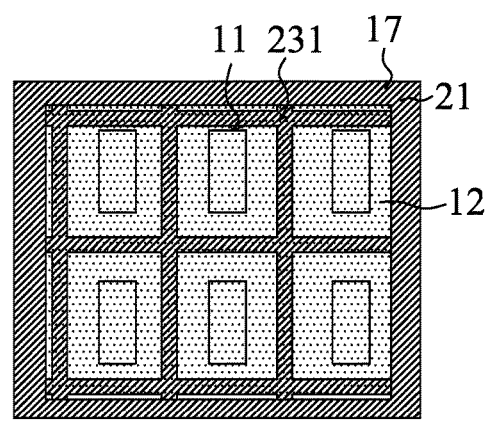

Referring to FIG. 9D, the physical removal process (polishing or cutting) is preformed to remove a portion of the second reflective layer 17 to expose the light-transmitting body 12. Other description can be referred to those of FIG. 4F and not be recited herein.

Figure 9E:
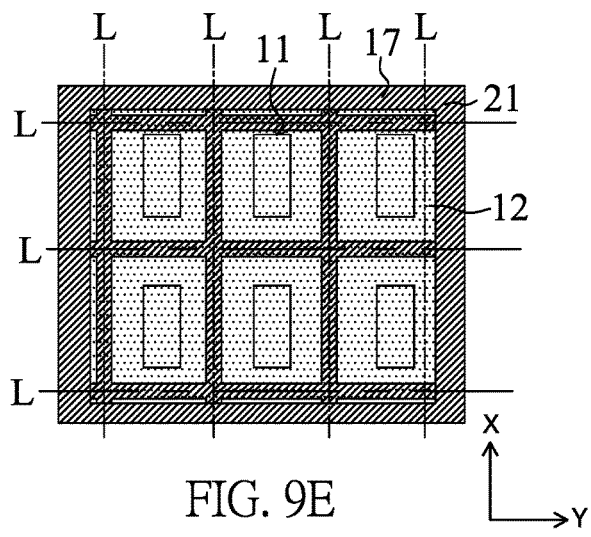
Figure 10A:
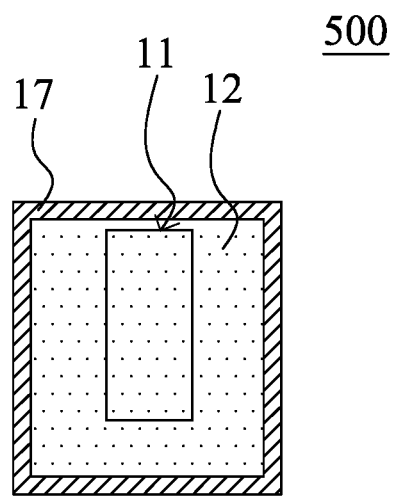
FIGS. 10A~10D show cross-sectional views of light-emitting devices in accordance with embodiments of the present disclosure respectively.
Figure 10C:
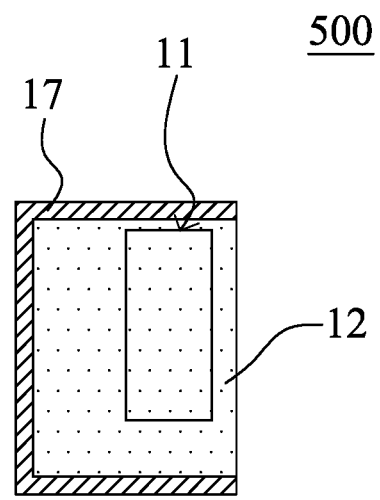
Figure 10B:
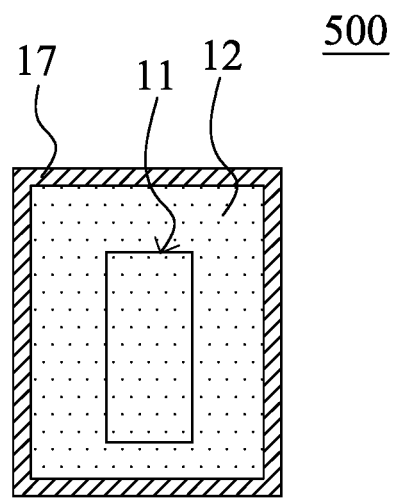
Figure 10D:
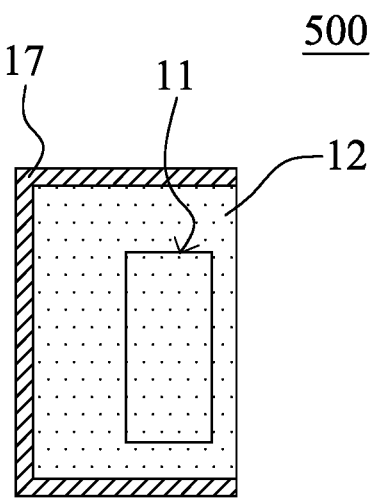

Referring to FIG. 9E, a cutting step is performed along the cutting line L (in the X direction and Y direction) to form a plurality of discrete light-emitting devices 500 as shown in FIGS. 10A~10D. As shown in FIGS. 10A and 10B, the second reflective layer 17 covers four side surfaces, and when the bottom surface 122 is also covered by the first reflective layer 14 and the extension electrode layers 15A, 15B, the light-emitting devices 500 have one light-emitting surface. As shown in FIGS. 10C and 10D, the second reflective layer 17 covers three side surfaces, and when the bottom surface 122 is also covered by the first reflective layer 14 and the extension electrode layers 15A, 15B, the light-emitting devices 500 have two light-emitting surfaces. Likewise, by cutting at different locations, the relative position between the light-transmitting body 12 and the light-emitting structure 11 can be changed, and various light-emitting devices are formed to have desired far field pattern and light intensity (for example, luminous flux (lumen)) for meeting various requirements.

Figure 11A:
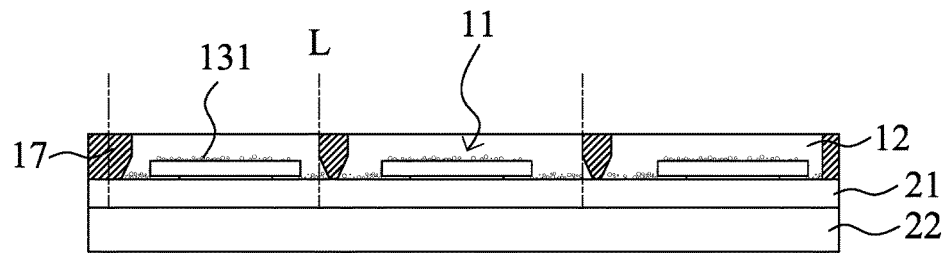
FIG. 11A shows a cross-sectional view of one step of making a light-emitting device in accordance with an embodiment of the present disclosure.
Figure 11B:
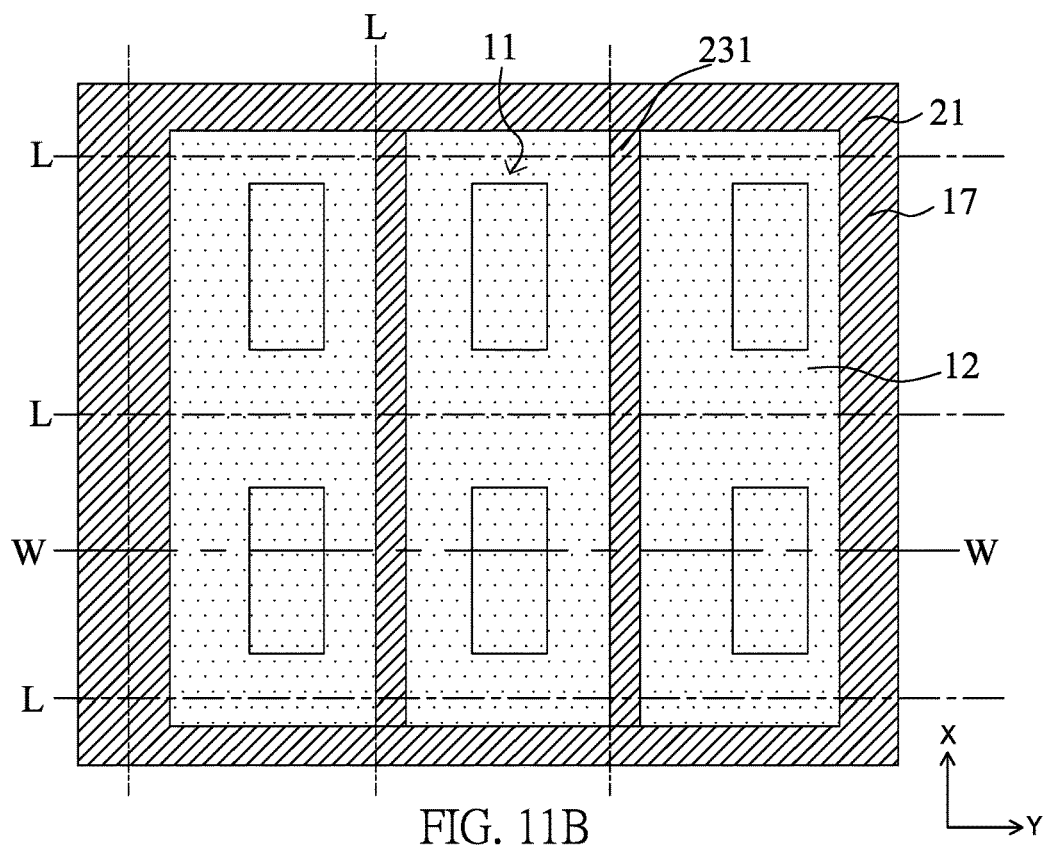
FIG. 11B shows a top view of one step of making a light-emitting device in accordance with an embodiment of the present disclosure.
Figure 11C:
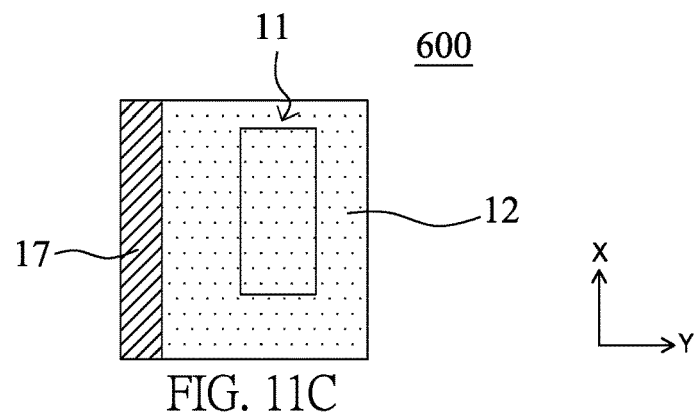
FIG. 11C shows a cross-sectional view of a light-emitting device in accordance with an embodiment of the present disclosure.

Similarly, as shown in FIGS. 11A and 11B, a cutting step is performed along the cutting line L at the interface between the light-transmitting body 12 and the second reflective layer 17 to obtain a light-emitting device 600 (as shown in FIG. 11C) having the second reflective layer only covering one side surface. In one embodiment, the second reflective layer 17 covers one side surface and when the bottom surface 122 is also covered by the first reflective layer 14 and the extension electrode layers 15A, 15B, the light-emitting device 600 has four light-emitting surfaces. Compared to the light-emitting device 100 of FIG. 1A, the light-emitting device 600 has a greater light intensity (for example, luminous flux (lumen)).

Figure 12A:
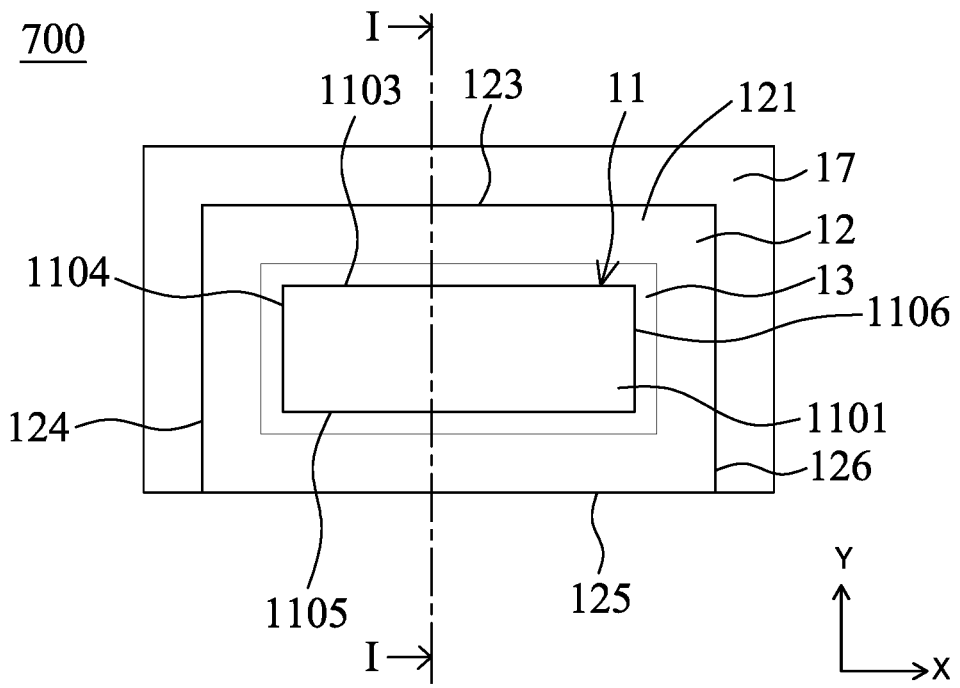
FIG. 12A shows a top view of a light-emitting device in accordance with an embodiment of the present disclosure.
Figure 12B:
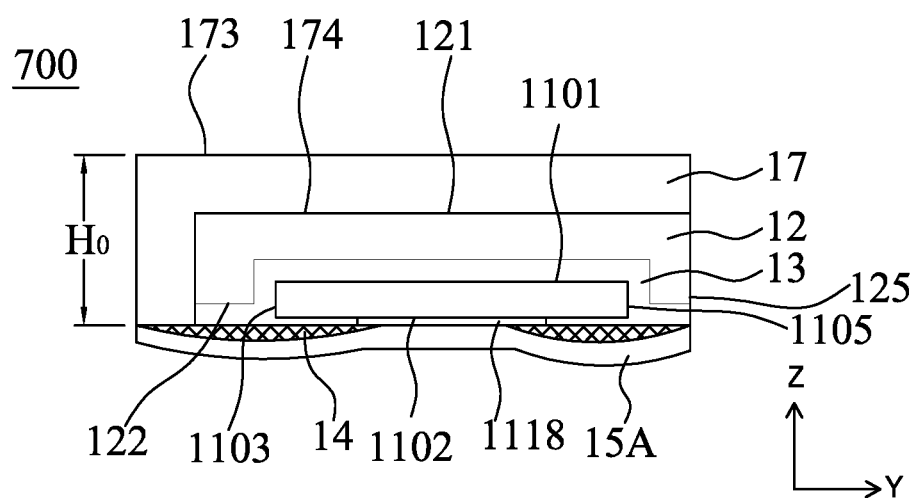
FIG. 12B shows a cross-sectional view taken along lines I-I of FIG. 12A.

FIG. 12A shows a top view of a light-emitting device 700 in accordance with an embodiment of the present disclosure. For clear illustration, not all layers are shown and each layer is drawn in solid line regardless of its material being non-transparent, transparent, or semi-transparent. FIG. 12B shows a cross-sectional view taken along lines I-I of FIG. 12A. For simplification, the light-emitting structure 11 is shown as cuboid in FIGS. 12A and 12B as an exemplary illustration. FIGS. 12A and 12B show a top view and a cross-sectional view in one direction, respectively. Other relative views and the structure of the light-emitting structure 11 can be referred to the corresponding paragraphs in this specification and figures.

Referring to FIGS. 12A and 12B, the light-emitting device 700 includes a light-emitting structure 11, a wavelength-conversion body 13, a light-transmitting body 12, a first reflective layer 14, extension electrode layers 15A, 15B, and a second reflective layer 17. The light-emitting structure 11 includes a top surface 1101, a bottom surface 1102 opposite to the top surface 1101, and four side surfaces (a first side surface 1103, a second side surface 1104, a third side surface 1105, and a fourth side surface 1106) connecting between the top surface 1101 and the bottom surface 1102. The wavelength-conversion body 13 covers the top surface 1101, the four side surface 1103~1106 and a portion of the bottom surface 1102. Likewise, the light-transmitting body 12 enclose the wavelength-conversion body 13, that is, the light-transmitting body 12 covers the top surface and four side surfaces of the wavelength-conversion body 13. The light-transmitting body 12 has a top surface 121, a bottom surface 122 opposite to the top surface 121 and four side surfaces (a first side surface 123, a second side surface 124, a third side surface 15 and a fourth side surface 126) connecting between the top surface 121 and the bottom surface 122. The second reflective layer 17 covers the top surface 121, the first side surface 123, the second side surface 124, and the fourth side surface 126 without covering the third side surface 125 and the bottom surface 122. In other words, the second reflective layer 17 cover the first side surface 1103, the second side surface 1104 and the fourth side surface 1106 without covering the third side surface 1105.

Referring to FIGS. 12A and 12B, the light-emitting angle of the light-emitting structure 11 is about 140° so more than 50% of light emits outward from the top surface 1101. In that case, the top surface 1101 of the light-emitting structure 11 is defined as a main light-emitting surface. Because the top surface 1102 and the three side surfaces (1103, 1104, 1106) are covered by the second reflective layer 17 and the bottom surface 1102 is covered by the first reflective layer 14, light emitted from the light-emitting structure 11 is reflected by the second reflective layer 17 or/and the first reflective layer 14 and exits the light-emitting device 700 through the third side surface 1105 and the third sides surface 125 of the light-transmitting body 12. In other words, the light-emitting directions of the light-emitting structure 11 and the light-emitting device 100 are different. Most light emitted from the light-emitting structure 11 emits outward along the Z axis (without exiting the light-emitting device 700), but most light emitted from the light-emitting device 700 emits outward along the Y axis (exiting the light-emitting device 700). Accordingly, the main light-emitting surface of the light-emitting structure 11 and the light-emitting surface of the light-emitting device 700 are substantially perpendicular to each other.

Furthermore, in FIG. 12B, a bottom surface 174 of the second reflective layer 17 is substantially parallel to the top surface 173, but it does not limit this disclosure. Any optical design for improving light extraction from the light-emitting device 700 can be applied in the second reflective layer 17. For example, directing light from the light-emitting structure 11 toward the third side surface 1195 to exit the light-emitting device 700 can be achieved by changing the shape of the top surface 121 of the light-transmitting body 12. The shape of the bottom surface 174 of the second reflective layer 17 is determined by the shape of the top surface 121. The corresponding structure and process will be described later.

The light-emitting device 700 has a height ($H_0$) not greater than 0.3 mm (≤0.3 mm) which expands the applicability of the light-emitting device 700 (for example, mobile phone, liquid crystal display, wearable apparatus like watch, wristband, or ring). As described above, the light-emitting directions of the light-emitting structure 11 and the light-emitting device 100 are different, and therefore when an area of the main light-emitting surface (XY plane) of the light-emitting structure 11 is increased, the height of the light-emitting device 700 is not increased. In addition, since the area of the main light-emitting surface (XY plane) of the light-emitting structure 11 is increased, the light output of the light-emitting structure 11 and the overall luminous flux are therefore enhanced. However, the height of the light-emitting device 700 is not increased, and the applicability of the light-emitting device 700 is not adversely affected.

FIGS. 13A~13F show cross-sectional views of making a light-emitting device in accordance with an embodiment of the present disclosure. FIGS. 14A~14F show top views of FIGS. 13A~13F, respectively. FIGS. 13A~13F are cross-sectional view taken along lines W-W of FIGS. 14A~14F, respectively. For simplification, the light-emitting structure 11 is shown as cuboid as an exemplary illustration. For clear illustration, each layer is drawn in solid lines regardless of a non-transparent, transparent, or translucent material.

Figure 13A:
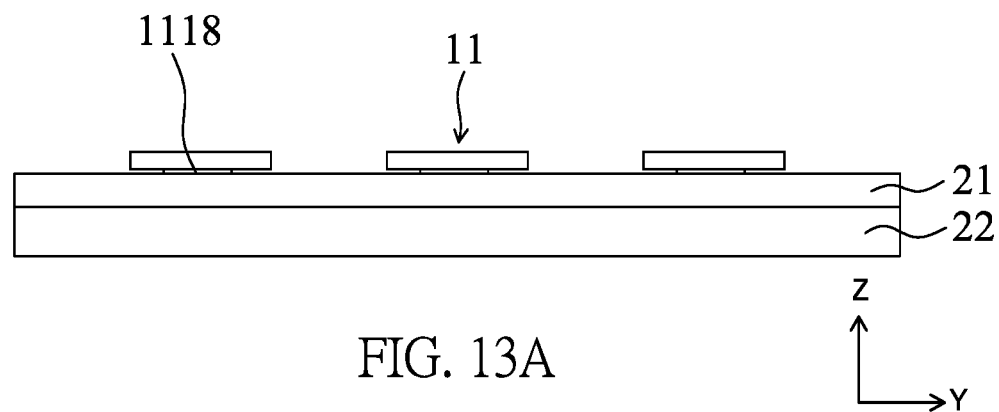
FIGS. 13A~13F show cross-sectional views of making a light-emitting device in accordance with an embodiment of the present disclosure.
Figure 14A:
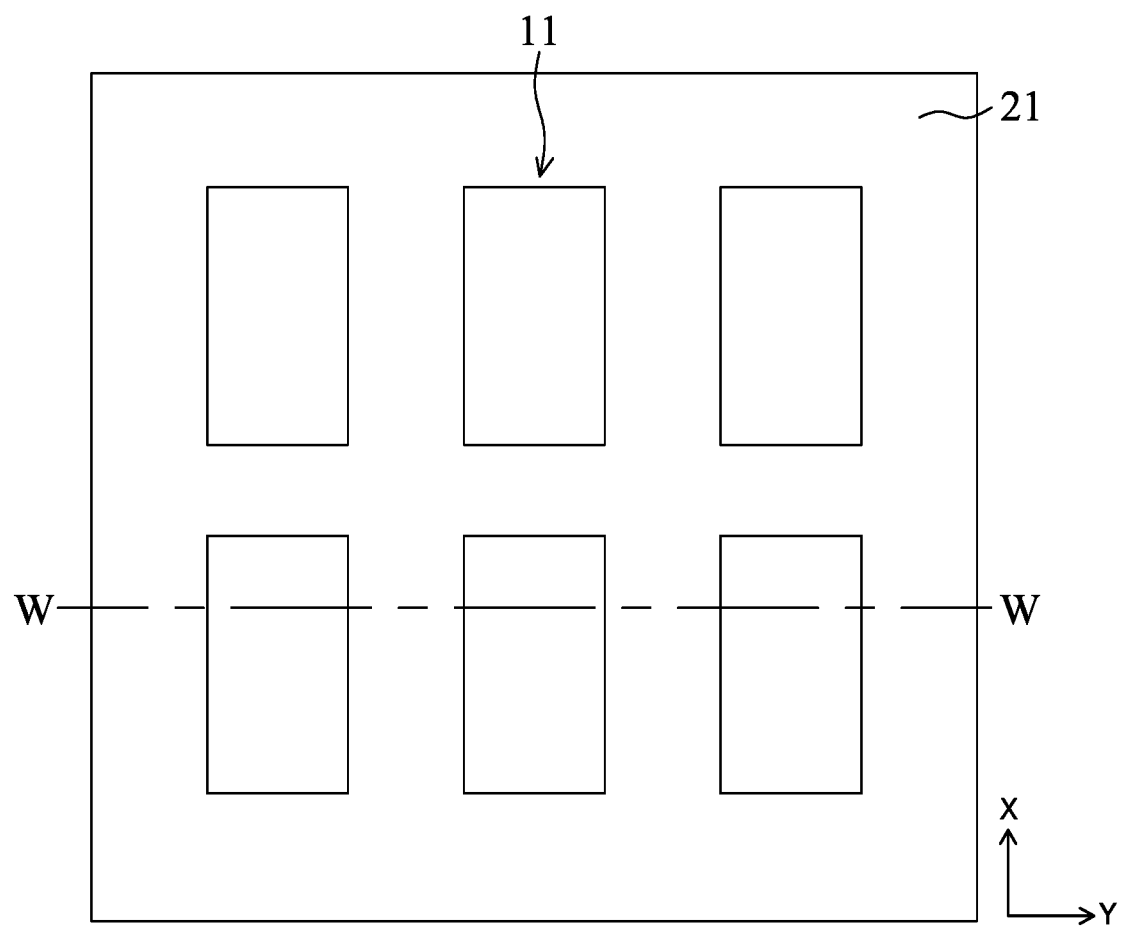
FIGS. 14A~14F show top views of FIGS. 13A~13F respectively.

Referring to FIGS. 13A and 14A, a carrier 22 is provided, an adhesion layer 21 is attached to the carrier 22, and a plurality of light-emitting structure 11 is disposed on the adhesion layer 21. In the embodiment, the light-emitting structure 11 is attached to the adhesion layer 21 through the first electrode layer 1118. The number and arrangement of the light-emitting structure 11 of FIG. 13A is illustrative, and not intended to limit the scope of the present disclosure.

Figure 13B:
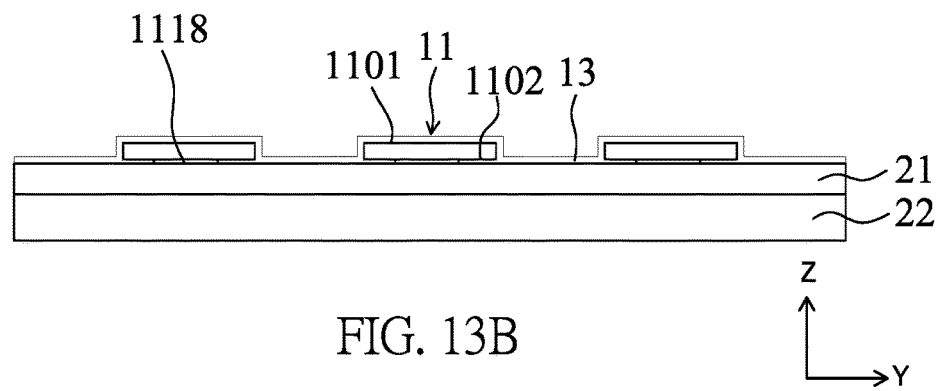
Figure 14B:
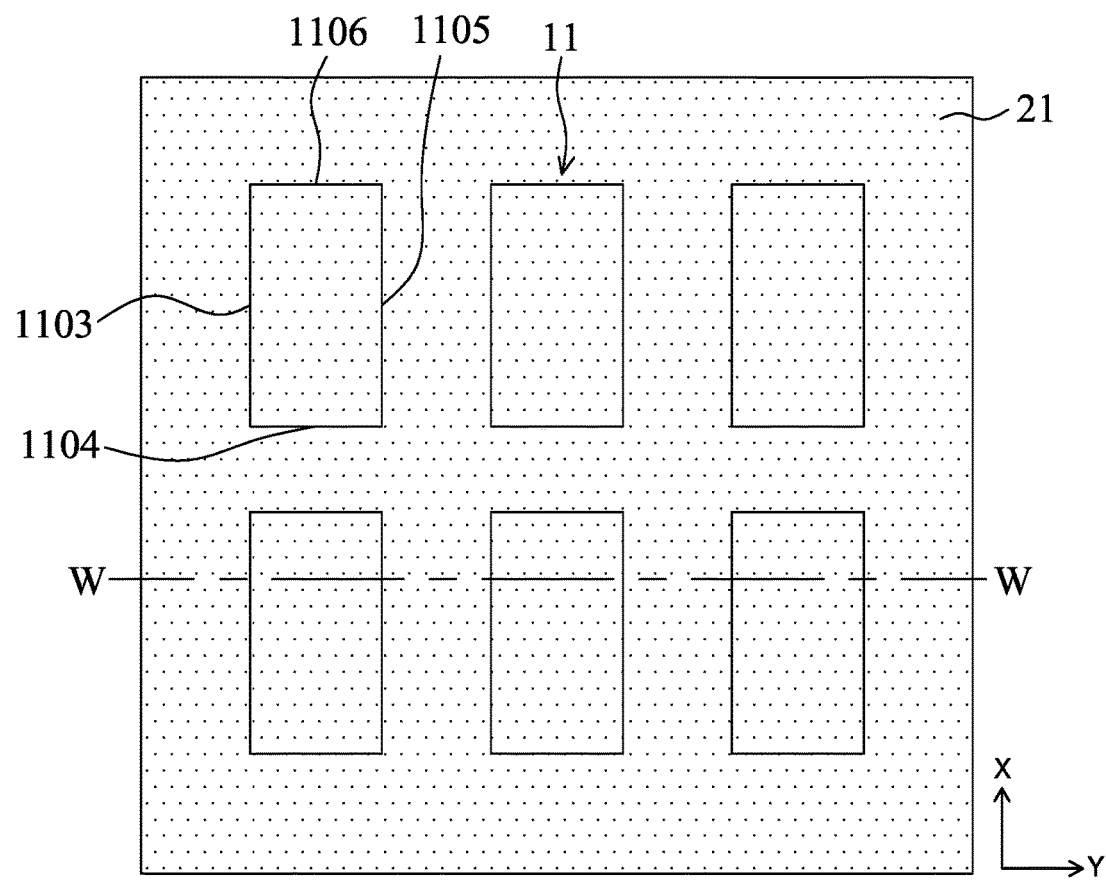
Figure 13C:
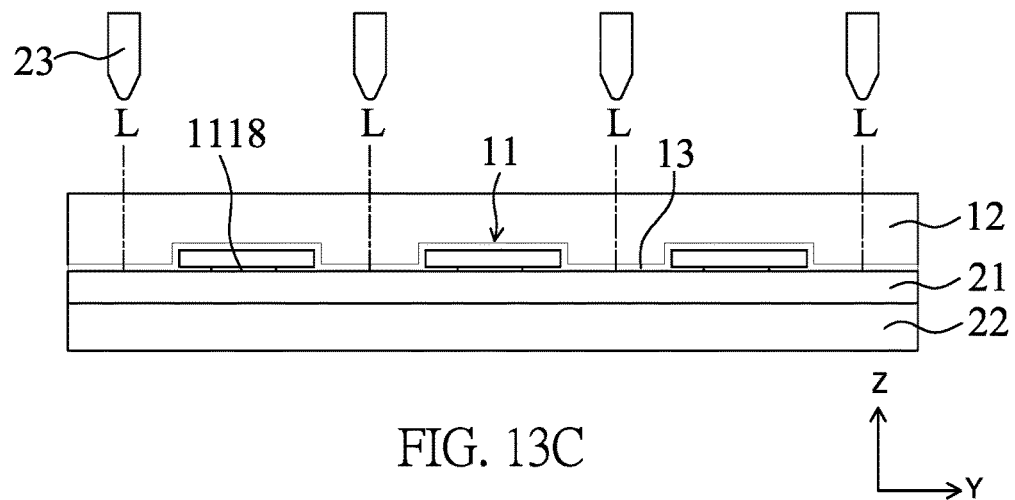
Figure 14C:
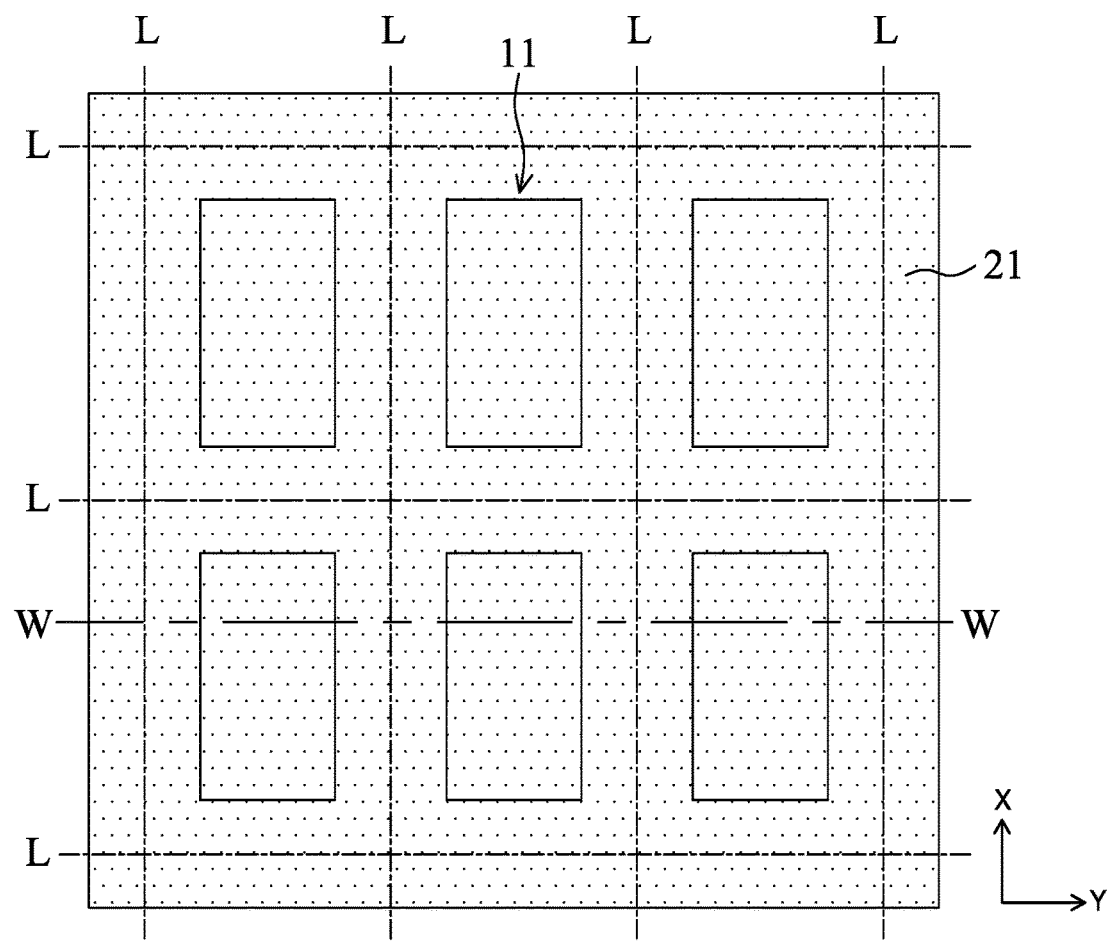
Figure 13D:
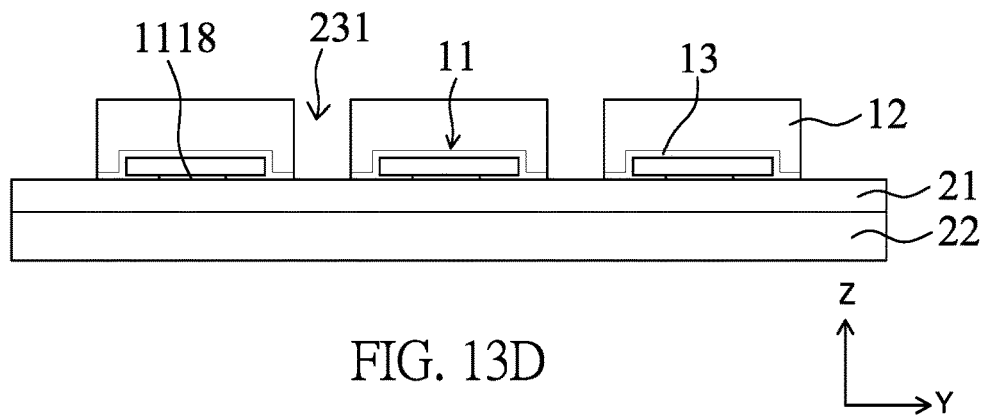
Figure 14D:
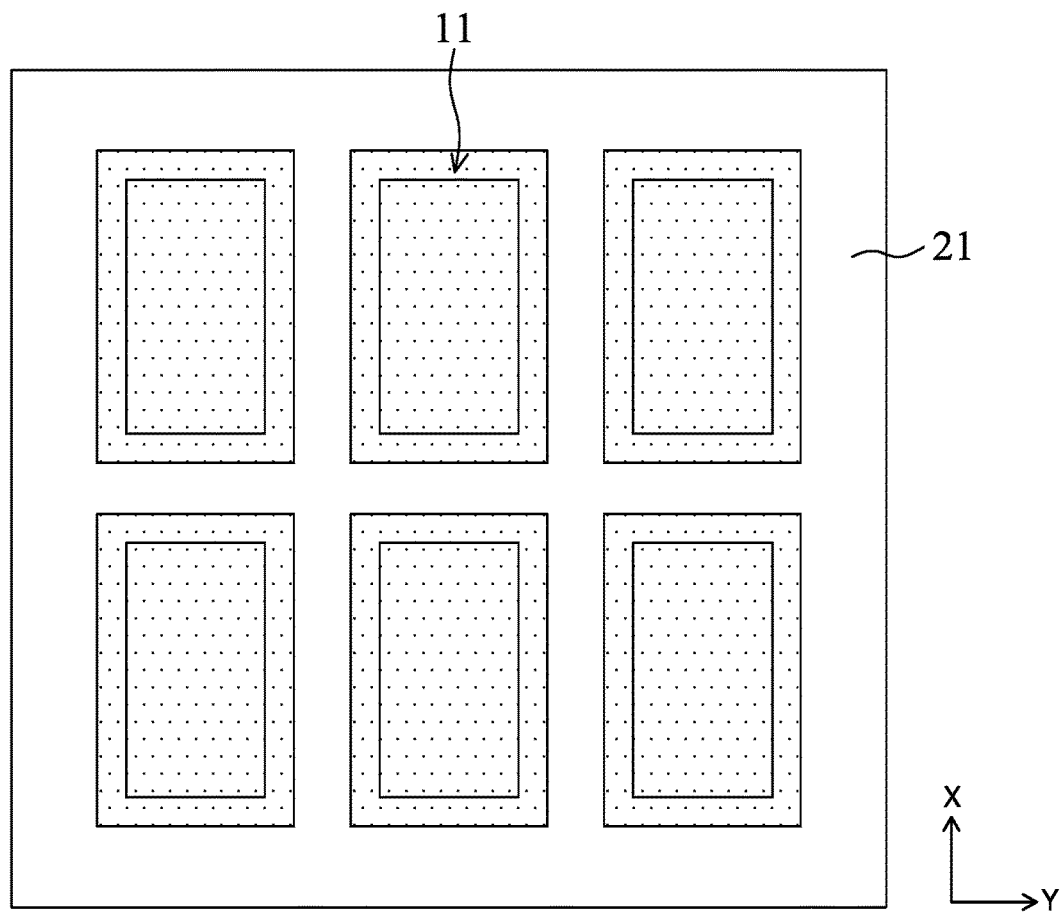
Figure 13E:
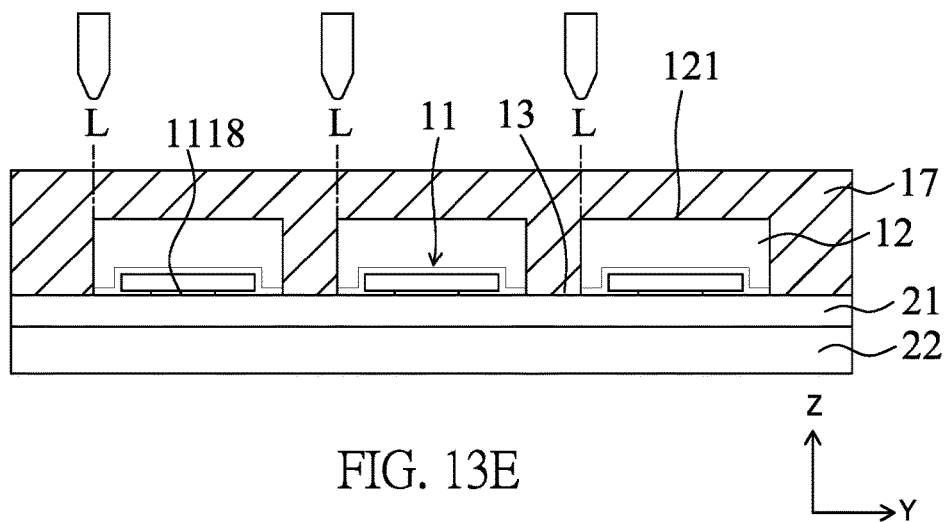
Figure 14E:
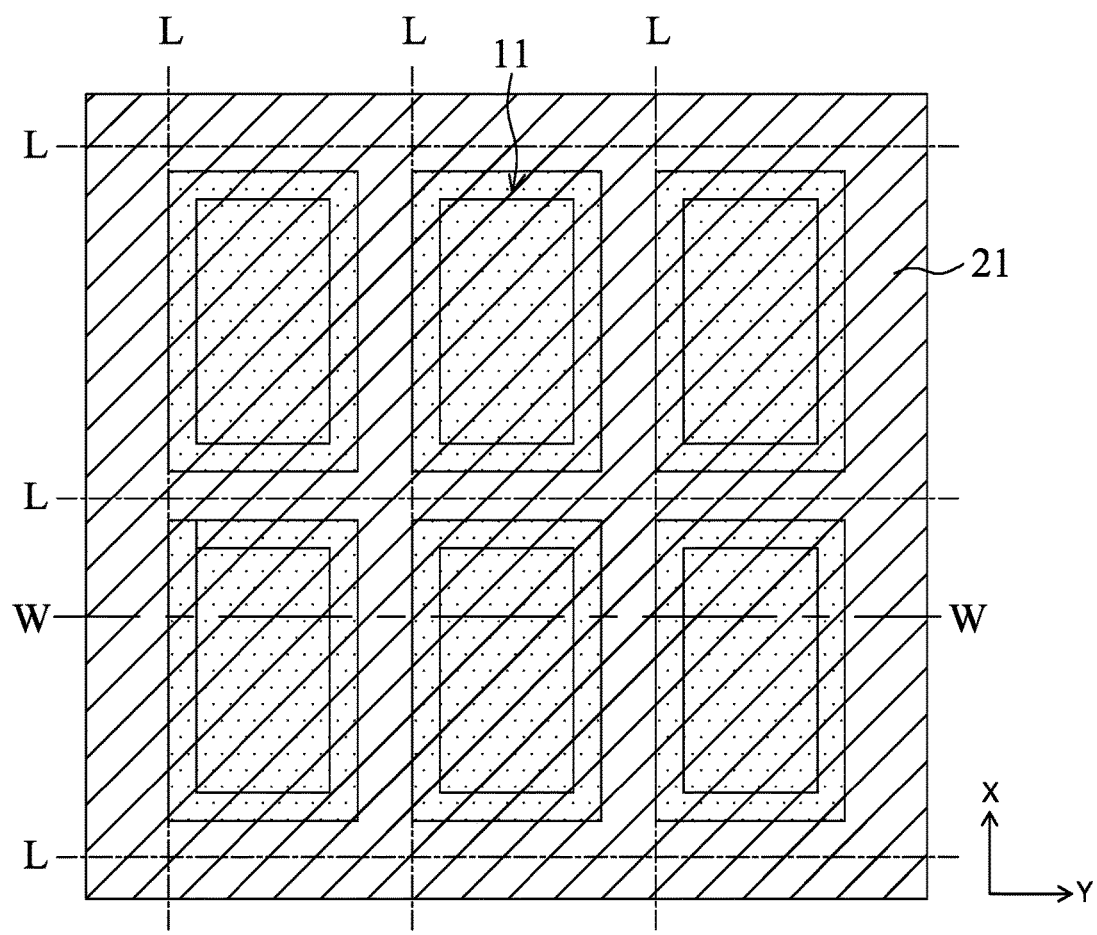
Figure 13F:
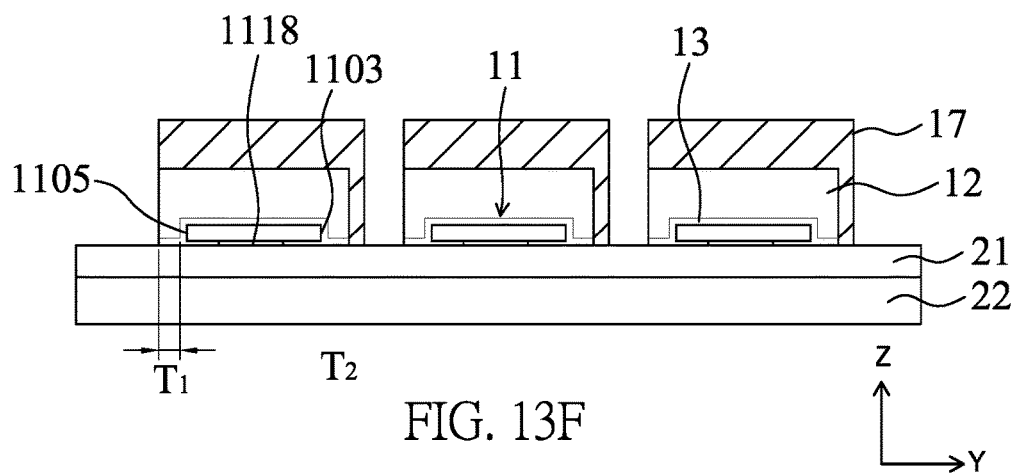
Figure 14F:
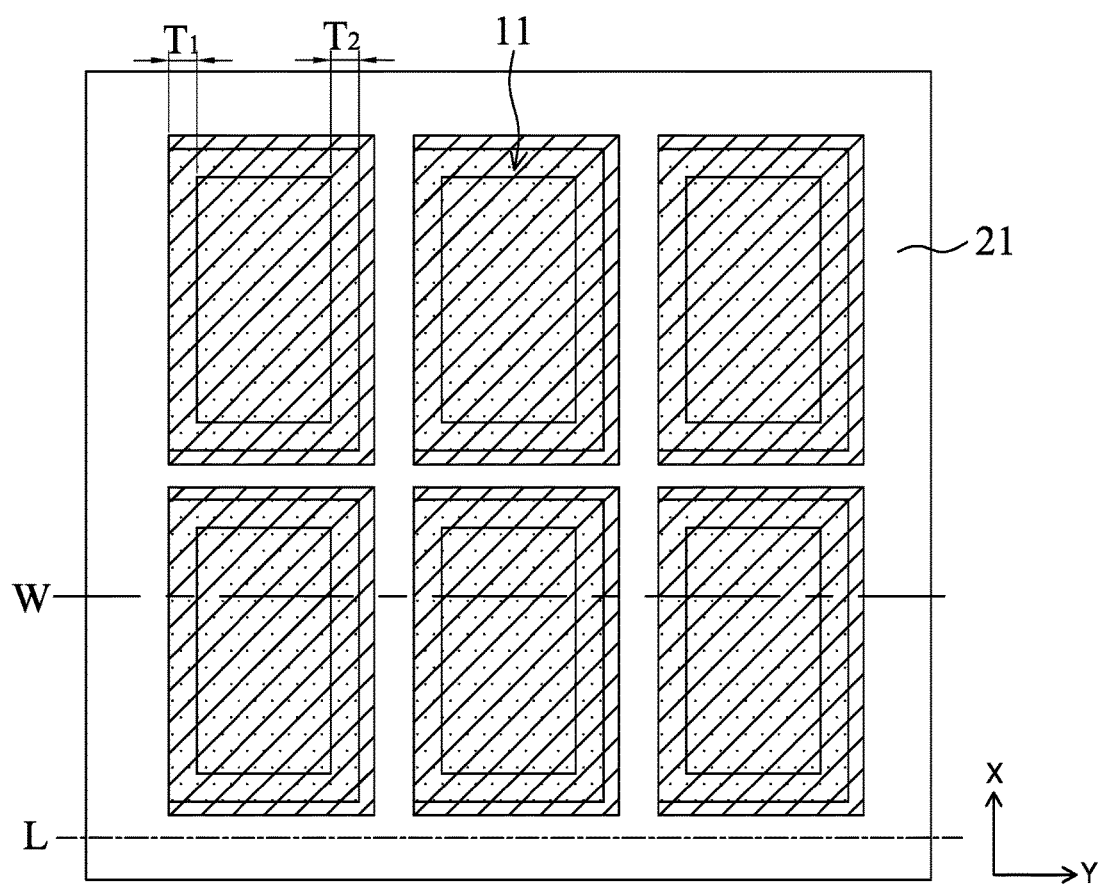
Figure 16A:
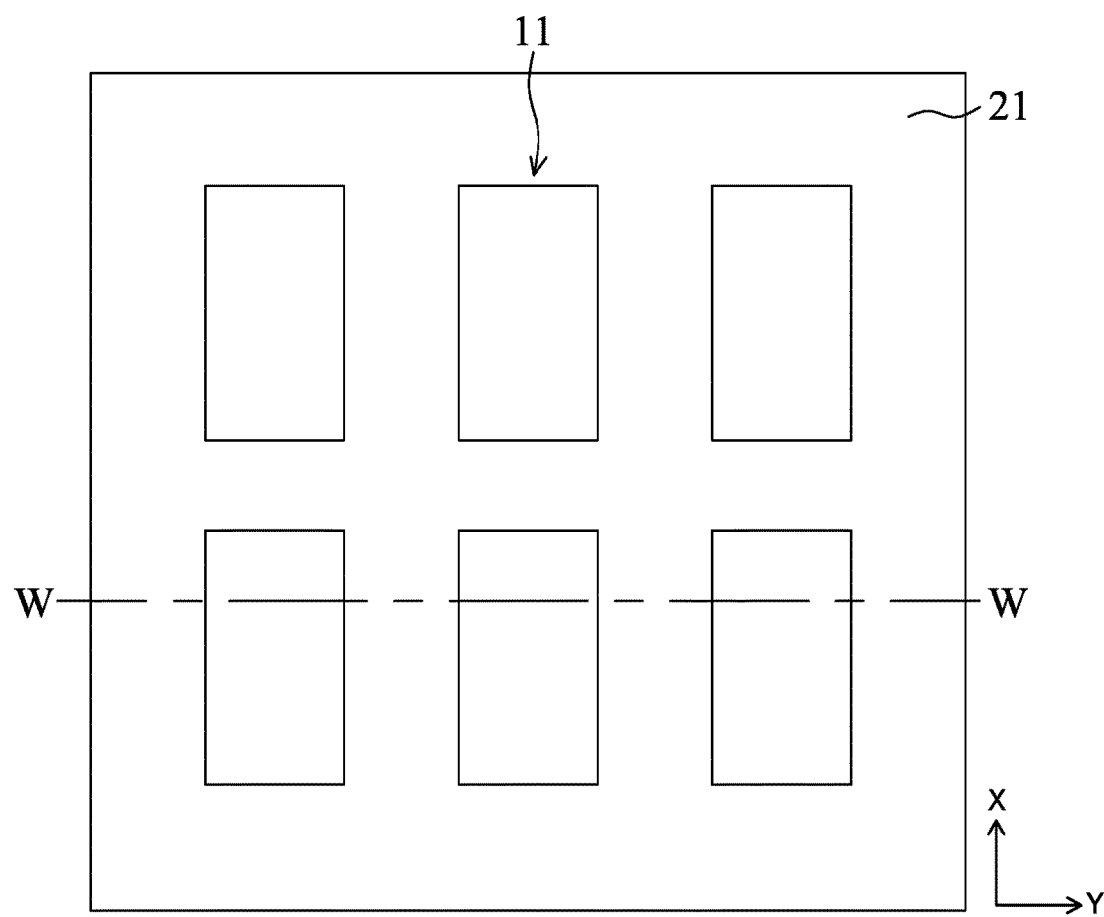
FIGS. 16A~16F show top views of FIGS. 15A~15F respectively.
Figure 16B:
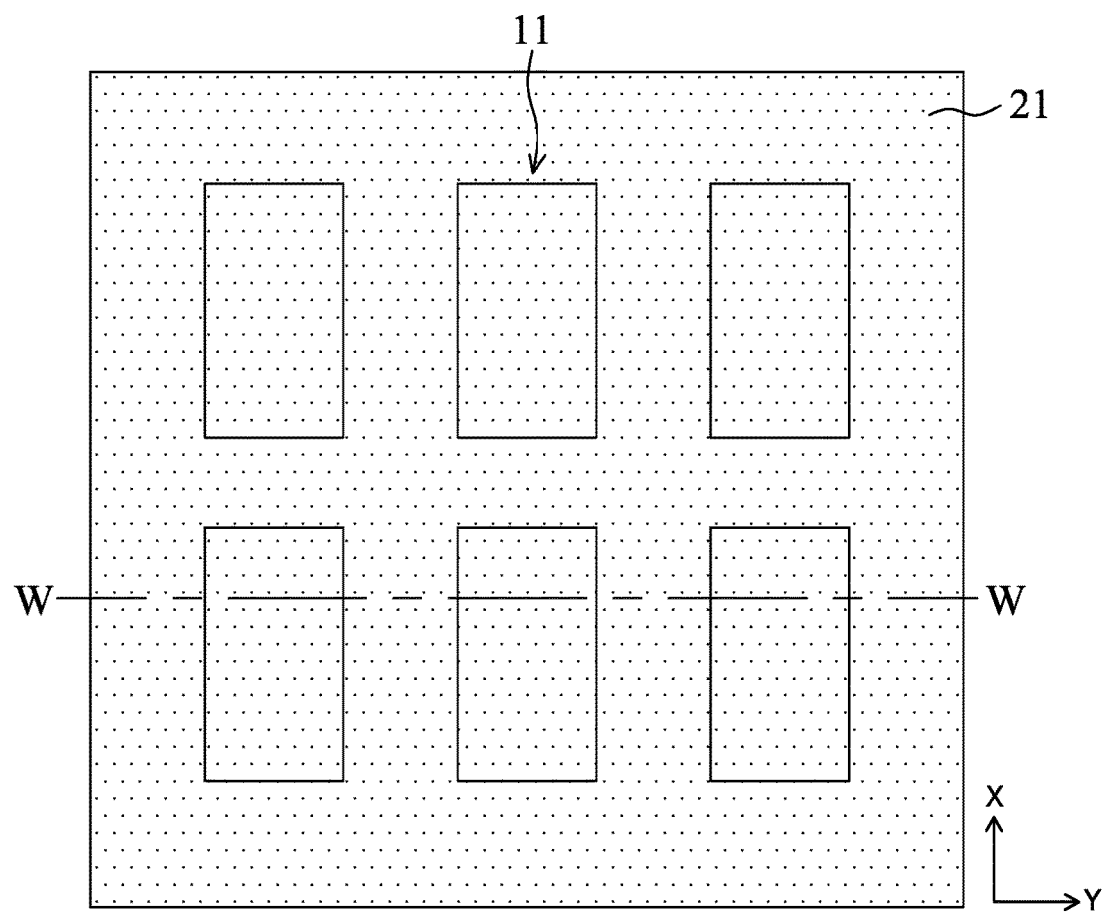
Figure 16C:
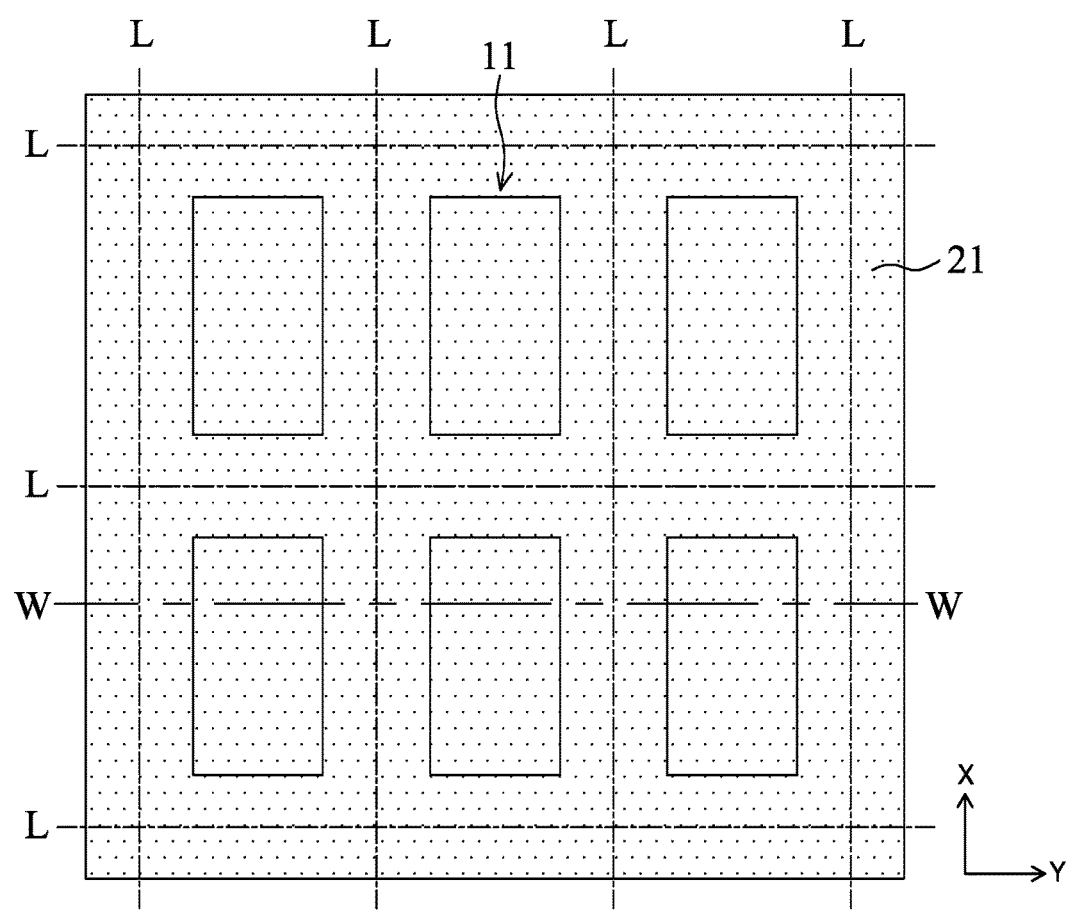
Figure 16D:
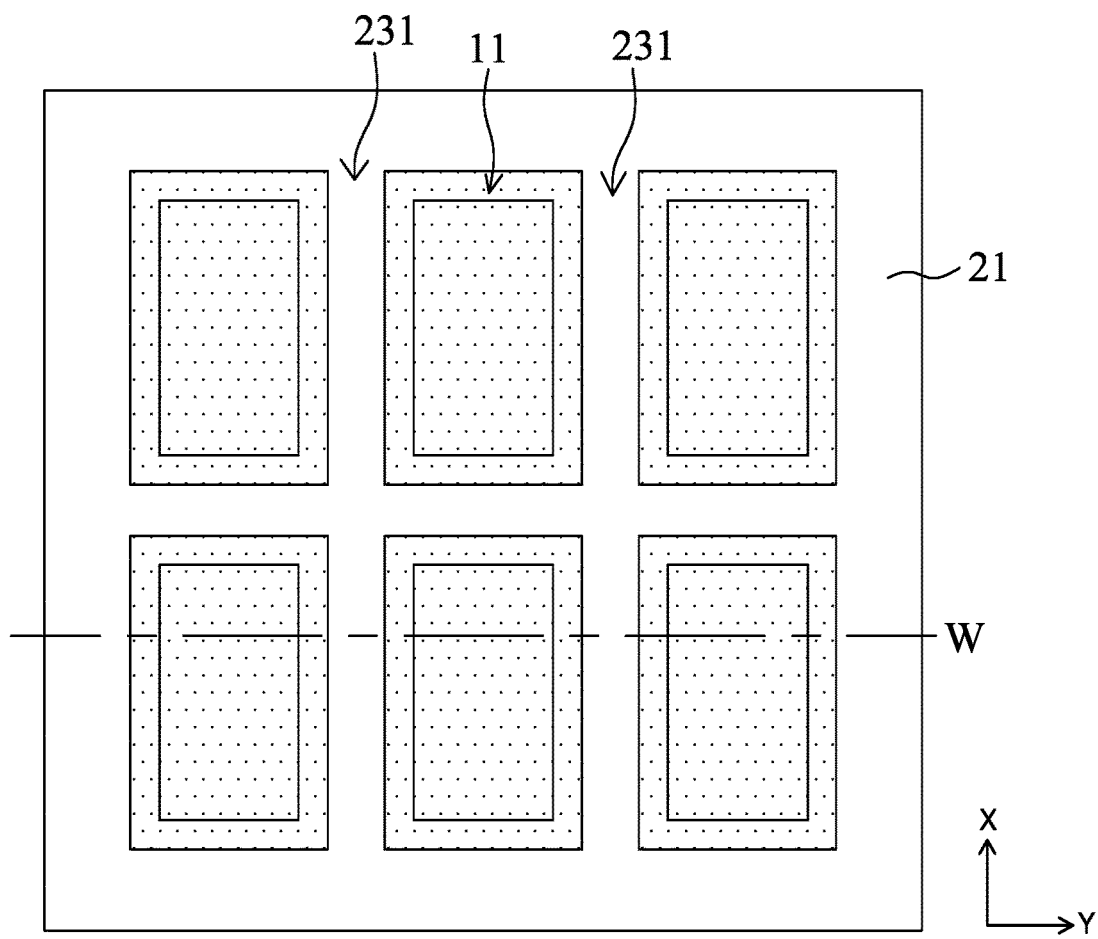
Figure 16E:
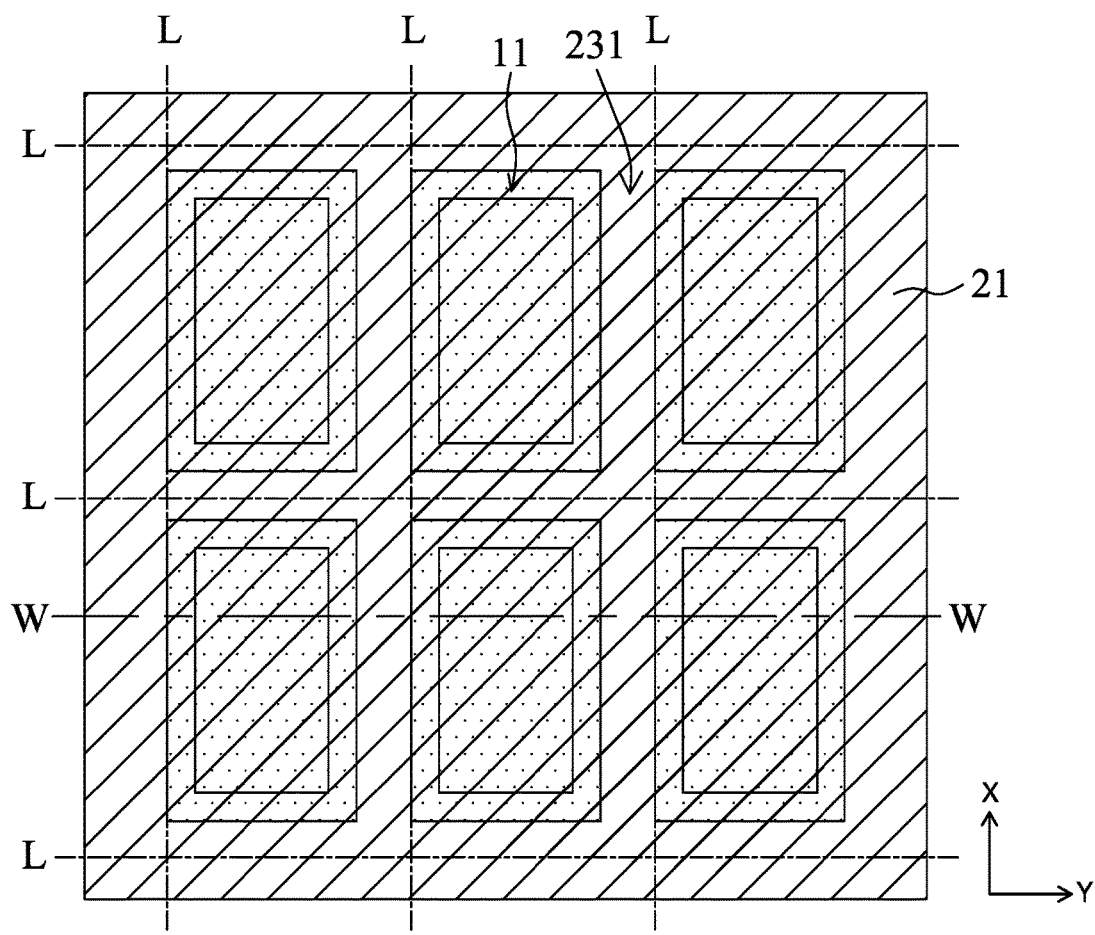

Referring to FIGS. 13B and 14B, a wavelength conversion body 13 completely covers the top surface 1101, the side surfaces 1103~1106 and a portion of the bottom surface 1102 of the light-emitting structure 11. The wavelength conversion body 13 can be formed on the light-emitting structure 11 by spraying, coating, dispensing, screen printing or molding.

Referring to FIGS. 13C~13D and 14C~14D, a transparent body without a plurality of wavelength conversion particles completely encloses the wavelength conversion body 13. Thereafter, the transparent body is cured to form the light-transmitting body 12. The transparent body can be formed by spraying, coating, dispensing, screen printing or molding. Subsequently, a cutter 23 is provided and a cutting step is performed along the cutting line L in the X direction and Y direction to form a plurality of trenches 231. The trenches 231 are formed within the light-transmitting body 12 and the wavelength conversion body 13 to expose the adhesion layer 21. In the cutting step, the trenches 231 are located between two adjacent light-emitting structures 11 and the light-transmitting 12 is divided into a plurality of discontinuous areas. The light-transmitting body 12 and the wavelength conversion body 13 cover the four side surfaces and the top surface of the light-emitting structure 11.

Referring to FIGS. 13E~13F and 14E~14F, a plurality of reflective particles is mixed into a matrix to form a paste in an uncured state. Subsequently, the paste is added to cover the light-transmitting body 12 and the trenches 231 wherein the trenches 231 can be completely covered or partially covered by the paste or have bubble remaining in the paste. Then, the paste is cured to form the second reflective layer 17. The second reflective layer 17 has a height greater than that of the light-transmitting body 12, that is, the second reflective layer 17 covers the fourth side surfaces 123~126 and the top surface 121 (referring to FIGS. 12A and 12B). The second reflective layer 17 can be formed by spraying, coating, dispensing or screen printing. In another embodiment, the second reflective layer 17 can be a pre-formed sheet and adheres to the light-transmitting body 12. The description of the adhesion can be referred to the aforesaid paragraphs. Finally, a cutting step is performed along the cutting line L (in the X direction and Y direction). Subsequently, the adhesion layer 21 is heated or is irradiated by UV radiation light so the light-emitting structure 11, the light-transmitting body 12, the wavelength conversion body 13 and the second reflective layer 17 are separated from the adhesion layer 21 to form a plurality of light-emitting devices.

Referring to FIGS. 13E~13F and 14E~14F, the light-transmitting body 12 is cut along the cutting lines L in X direction so the second reflective layer 17 covers merely the three side surfaces of the light-transmitting body 12 to expose one side surface. By varying the locations of the cutting lines, the thicknesses at the two sides where the light-transmitting body 12 covers the first side surface 1103 and the third side surface 1105 are equal to each other or different. For example, when a portion of the light-transmitting body 12 is removed in the cutting step, the thicknesses ($T_1$, $T_2$) at two side of the light-transmitting body 12 are different ($T_1 \neq T_2$). Or, by controlling the locations of the cutting lines the light-transmitting body 12 is not removed in the cutting step and the thicknesses at two side of the light-transmitting body 12 are equal to each other ($T_1=T_2$).

Next, alternatively, a first reflective layer 14 and extension electrode layers 15A, 15B as shown in FIG. 12B are further formed, and the detailed description can be referred to other corresponding paragraphs.

FIGS. 15A~15F show cross-sectional views of making a light-emitting device in accordance with an embodiment of the present disclosure. FIGS. 16A~16F show top views of FIGS. 15A~15F, respectively. FIGS. 15A~15F are cross-sectional view taken along lines W-W of FIGS. 16A~16F, respectively. The detailed description of FIGS. 15A~15B can be referred to the corresponding paragraphs of FIGS. 13A~13B.

Referring to FIGS. 15C~15D and 16C~16D, a cutter 23A is provided and a cutting step is performed along the cutting line L in the X direction to form a plurality of trenches 231 within the light-transmitting body 12 to expose the wavelength conversion body 13. Furthermore, the cutting step using the cutter 23A is performed along the Y axis with a variable depth of cut along the Z axis. Because the cutter 23A has a curved cross-section and therefore the top surface 121 of light-transmitting body 12 has a wavy shape cross-section.

Figure 17A:
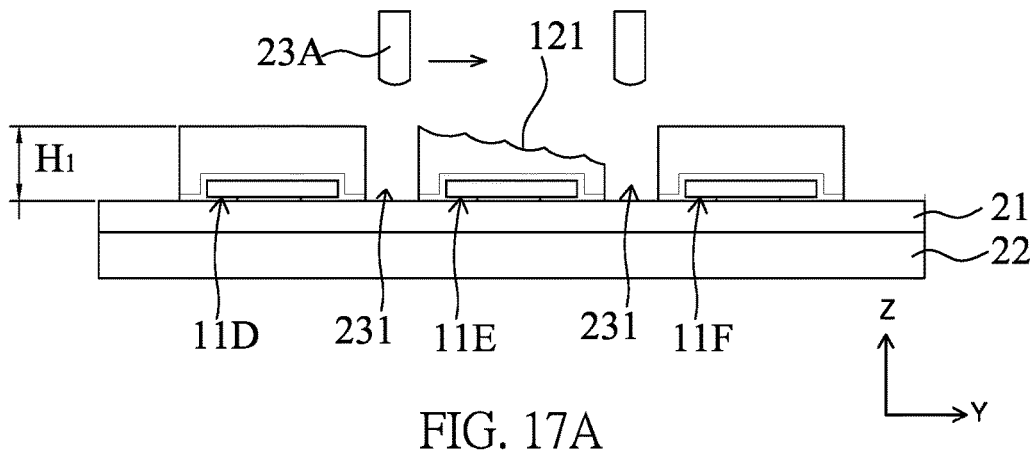
FIGS. 17A~17F show cross-sectional views of making a light-transmitting body having a top surface with a wavy shape in accordance with an embodiment of the present disclosure.

For example, referring to FIG. 17A, the cutter 23A is located between the light-emitting structures 11D, 11E and cuts downward (−Z direction) until reaching the adhesion layer 21 to form the trench 231, wherein the depth of cut is H1.

Figure 17B:
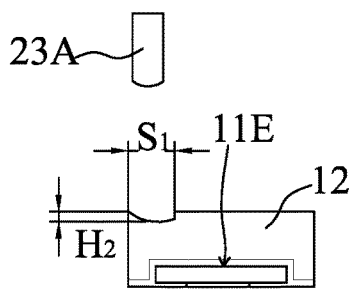

Referring to FIG. 17B, the cutter 23A moves a first distance (S1) along the Y axis and is located above the light-emitting structure 11E to cut a portion of the light-transmitting body 12, wherein the depth of cut is H2 (H2<H1).

Figure 17C:
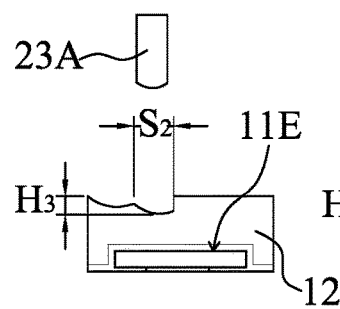

Referring to FIG. 17C, the cutter 23A moves forward a second distance (S2) along the Y axis and is still located above the light-emitting structure 11E to cut a portion of the light-transmitting body 12, wherein the depth of cut is H3 (H3>H2, H3<H1).

Figure 17D:
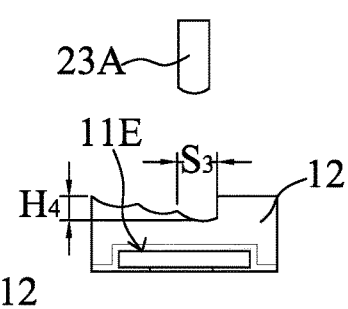

Referring to FIG. 17D, the cutter 23A moves forward a third distance (S3) along the Y axis and is still located above the light-emitting structure 11E to cut a portion of the light-transmitting body 12, wherein the depth of cut is H4 (H4>H3>H2; H4<H1).

Figure 17E:
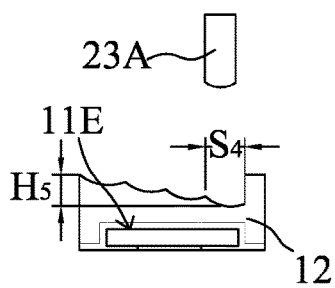

Referring to FIG. 17E, the cutter 23A moves forward a fourth distance (S4) along the Y axis and is still located above the light-emitting structure 11E to cut a portion of the light-transmitting body 12, wherein the depth of cut is H5 (H5>H4>H3>H2; H5<H1).

Figure 17F:
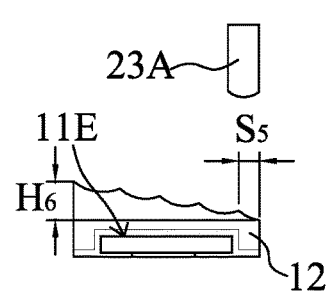

Referring to FIG. 17F, the cutter 23A moves forward a fifth distance (S5) along the Y axis and is still located above the light-emitting structure 11E to cut a portion of the light-transmitting body 12, wherein the depth of cut is H6 (H6>H5>H4>H3>H2; H6<H1).

Finally, referring to FIG. 17A, the cutter 23A moves outside the light-emitting structure 11E (not located above the light-emitting structure 11E) and is located between the light-emitting structures 11E, 11F and cuts downward (−Z direction) until reaching the adhesion layer 21 to form the trench 231, wherein the depth of cut is H1. Accordingly, the top surface 121 of light-transmitting body 12 has a wavy shape cross-section.

Figure 18A:
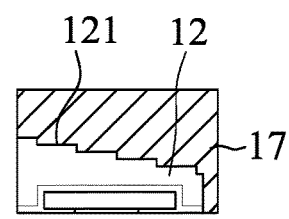
FIGS. 18A~18E show cross-sectional views of a light-transmitting body having a top surface with different structures.
Figure 18B:
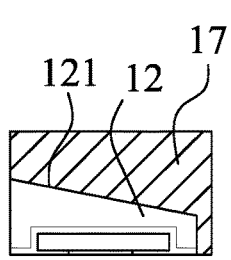
Figure 18C:
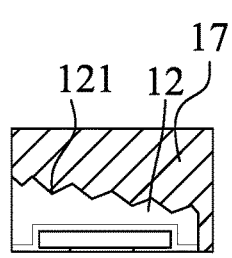

According to the aforesaid method, the cutter 23A moves along the Y axis and cut downward along the Z axis with various cutting depth, thereby forming the top surface 121 of light-transmitting body 12 with different shapes. In addition, the shape of the cutter could cause different profile at the top surface 121. For example, as shown in FIG. 18A, the top surface 121 of light-transmitting body 12 has a stepped cross-section; as shown in FIG. 18B, the top surface 121 of light-transmitting body 12 has a smooth inclined surface in cross section; as shown in FIG. 18C, the top surface 121 of light-transmitting body 12 has a serrated cross-section.

Figure 18D:
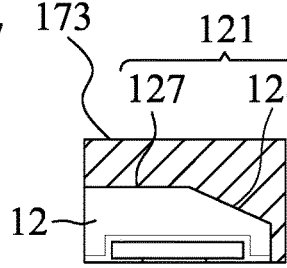

Furthermore, by cutting at different locations, the top surface 121 of light-transmitting body 12 can have various shapes. As shown in FIG. 18D, the cutter is moved to locate above the light-emitting structure and cut downward, and the light-transmitting body 12 has a first surface 127 substantially parallel to the top surface 173 and a second surface 128 inclined with respect to the top surface 173. The first surface 127 and the second surface 128 have a portion above the light-emitting structure. Compared to the light-transmitting body 12 having the top surface 121 substantially perpendicular to the top surface 173 shown in FIG. 12, the top surface 121 of the light-transmitting body 12 above the light-emitting structure in FIG. 18D is not partially or entirely parallel to the top surface 173 (for example, inclined surface, a wavy shape, stepped, etc.) that can help to reflect light from the light-emitting structure toward the side surface to exit the light-emitting device for increasing light intensity.

Figure 18E:
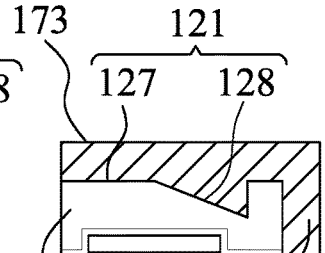

As shown in FIG. 18E, the top surface 121 of the light-transmitting body 12 having the first surface 127 and the second surface 128 can be obtained by using a non-symmetric cutter. In addition, only one cutting step is conducted to form the structure shown in FIG. 18E. Therefore, compared to the processes described in FIGS. 17A~17E, the process disclosed in this embodiment is simpler and processing time and cost can be reduced.

Referring to FIGS. 15E~15F and 16E~16F, a plurality of reflective particles is mixed into a matrix to form a paste in an uncured state. The paste covers the light-transmitting body 12 and the trenches 231 wherein the trenches 231 can be completely covered or partially covered by the paste or have bubble remaining in the paste. Then, the paste is cured to form the second reflective layer 17. Other description of the second reflective layer 17 can be referred to the corresponding paragraphs. Subsequently, a cutting step is performed along the cutting line L (in the X direction and Y direction). Thereafter, the adhesion layer 21 is heated or is irradiated by UV radiation light for removal so a plurality of light-emitting devices is formed.

Figure 15A:
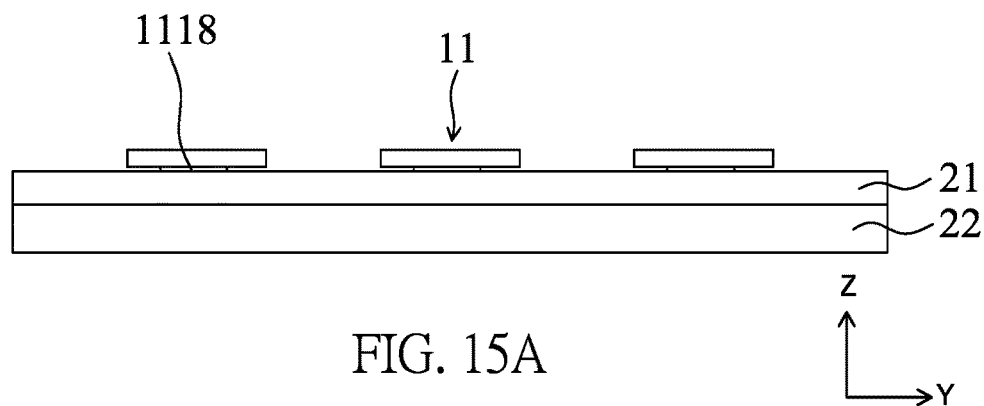
FIGS. 15A~15F show cross-sectional views of making a light-emitting device in accordance with an embodiment of the present disclosure.
Figure 15B:
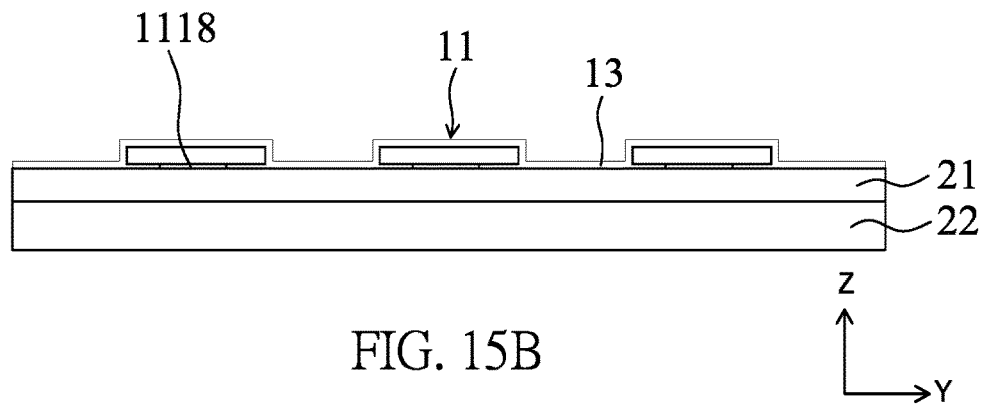
Figure 15C:
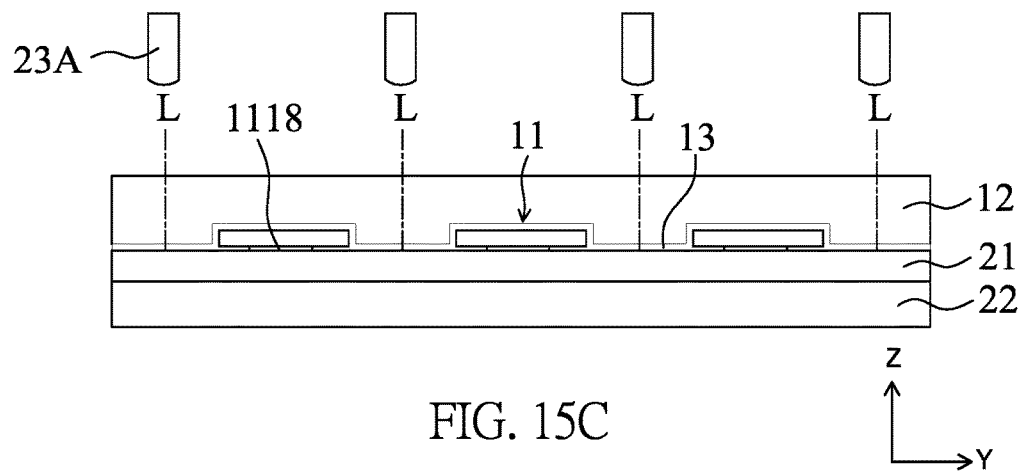
Figure 15D:
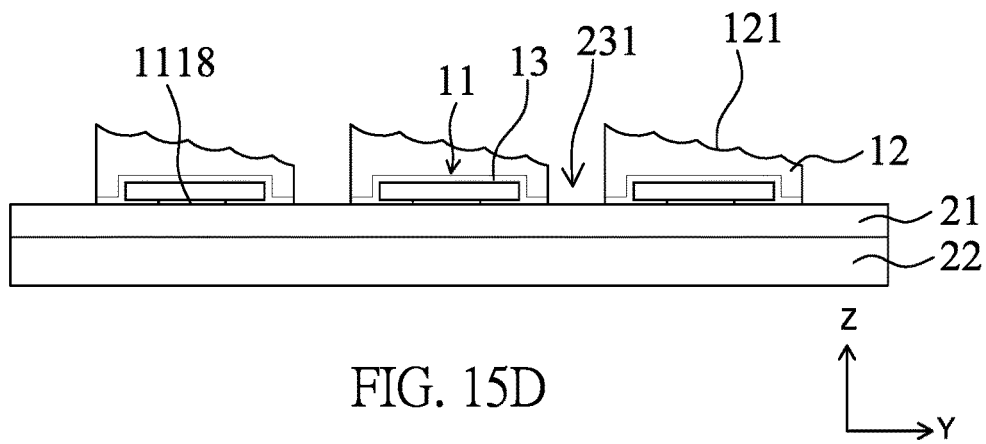
Figure 15E:
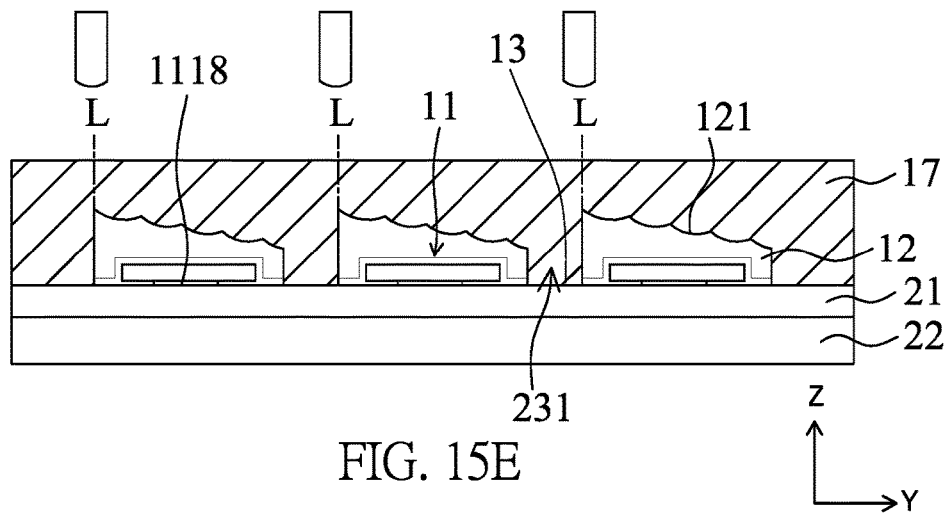
Figure 15F:
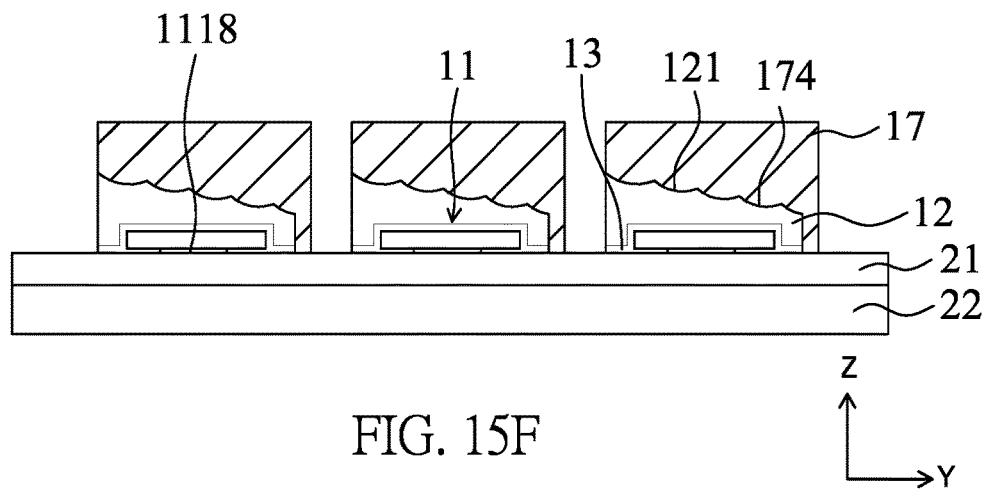
Figure 16F:
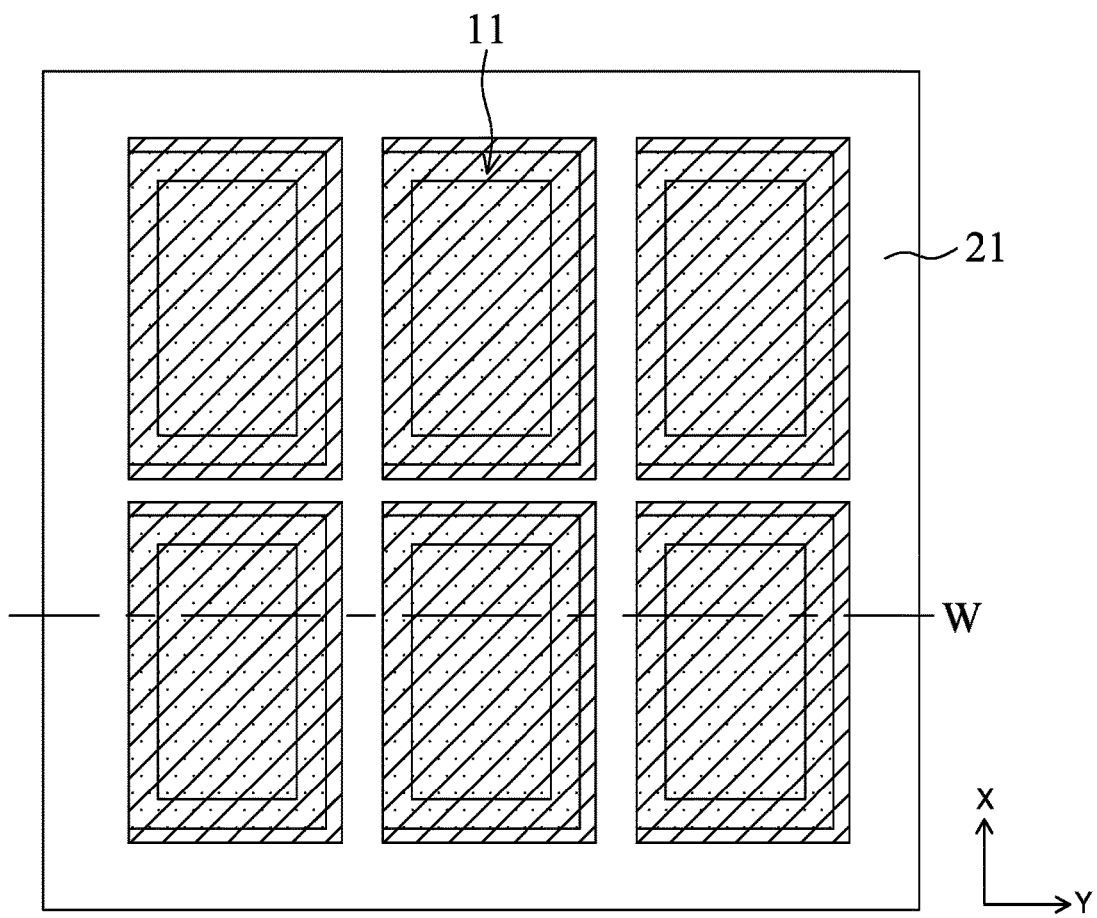

Referring to FIG. 15F, the light-transmitting body 12 is cut along the cutting lines L in X direction so the second reflective layer 17 covers merely the three side surfaces of the light-transmitting body 12 to expose one side surface of the light-transmitting body 12. In addition, because the top surface 121 of the light-transmitting body 12 has a wavy shape, the bottom surface 174 of the second reflective layer 17, which contacts the top surface 121 of the light-transmitting body 12, also has a wavy shape.

Figure 19:
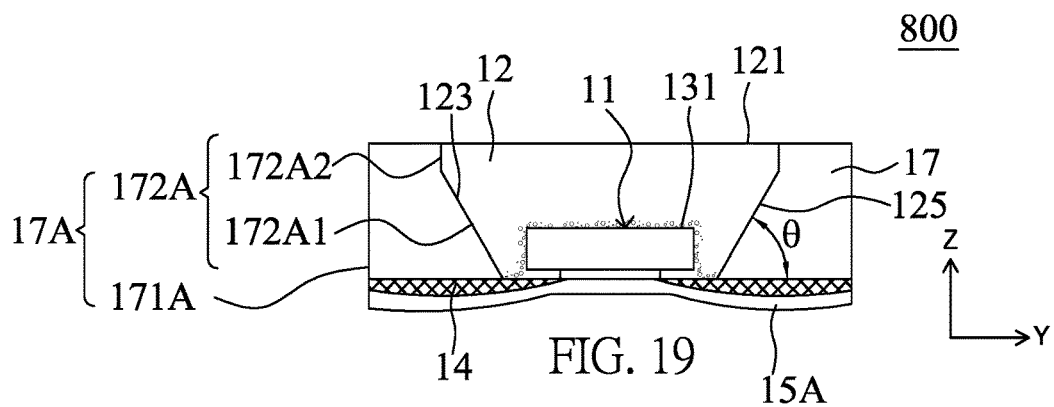
FIG. 19 shows a cross-sectional view of a light-emitting device in accordance with an embodiment of the present disclosure.

FIG. 19 shows a cross-sectional view of a light-emitting device 800 in accordance with an embodiment of the present disclosure. For simplification, the light-emitting structure 11 is shown as cuboid in FIG. 19 as an exemplary illustration.

The light-emitting device 800 has a structure similar to that of the light-emitting device 100, and devices or elements with similar or the same symbols represent those with the same or similar functions. FIG. 19 only shows a cross-sectional view of the light-emitting device 800 and other views can be referred to the description of the light-emitting device 100. The light-emitting device 800 includes a light-emitting structure 11, a light-transmitting body 12 including a plurality of wavelength conversion particles 131, a first reflective layer 14, extension electrode layers 15A, 15B, and a second reflective layer 17.

The structure of FIG. 19 is similar to that of FIG. 2, except the shape of the second reflective layer. As shown in FIG. 19, the second reflective layer 17A has an outer surface 171A and an inner surface 172A. The outer surface 171A is substantially perpendicular to the top surface 121 and the inner surface 172A has a first portion 172A1 inclined with respect to the top surface 121 and a second portion 172A2 substantially perpendicular to the top surface 121. The first portion 172A1 extends from the first reflective layer 14 along the Z axis and has a height higher than the light-emitting structure 11. The first portion 172A1 can reflect light from the light-emitting structure 11 toward the light-transmitting body 12 to exit the light-emitting device 800. The first side surface 123 and the third side surface 125 contact directly the inner surface 172A of the second reflective layer 17A so the shapes of the first side surface 123 and the third side surface 125 are the same as that of the inner surface 172A of the second reflective layer 17A. The first portion 172A1 is inclined with respect to the first reflective layer 14 with an angle (θ) of 60°~80°. The second portion 172A2 extends from the first portion 172A1 along the Z axis.

Figure 19A:
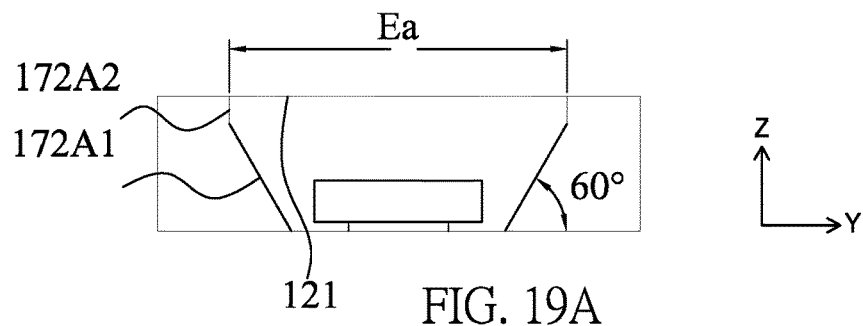
FIGS. 19A~19C show cross-sectional views of light-emitting devices used in the simulation.
Figure 19B:
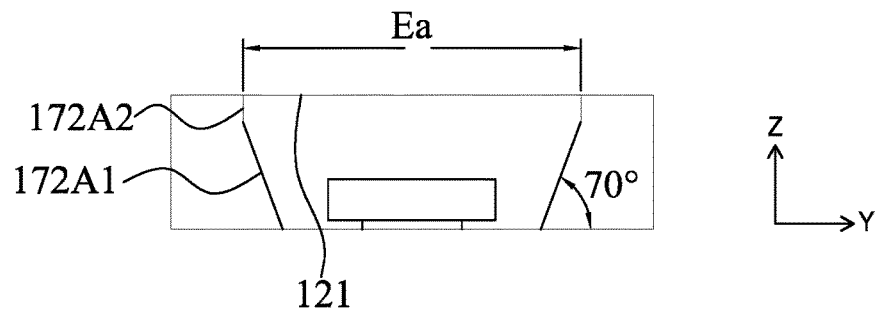
Figure 19C:
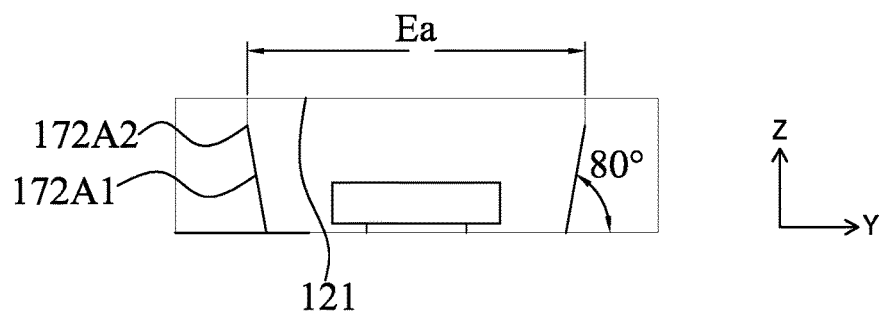
Figure 20A:
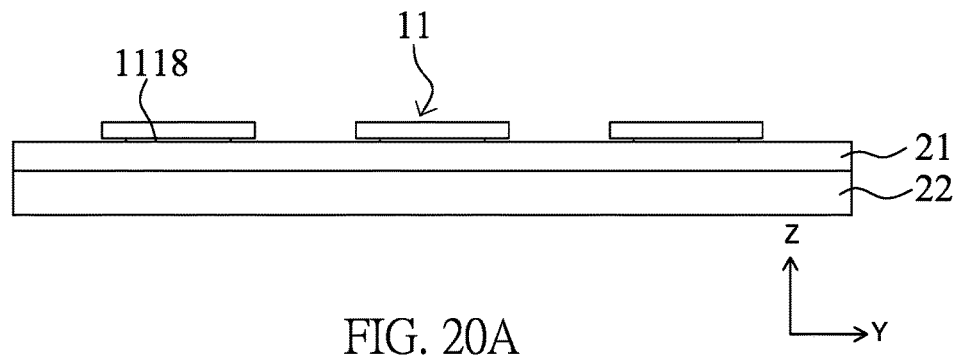
FIGS. 20A~20G show cross-sectional views of making a light-emitting device in accordance with an embodiment of the present disclosure.
Figure 21A:
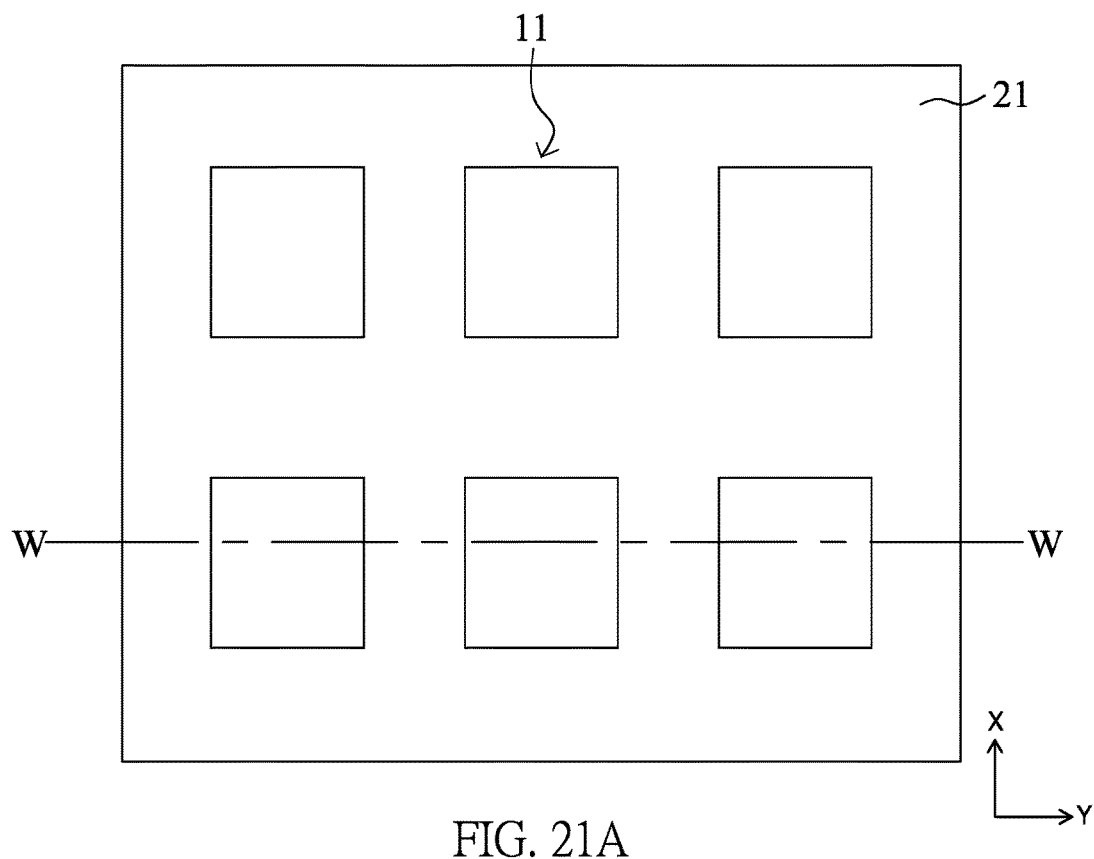
FIGS. 21A~21G show top views of FIGS. 20A~20G, respectively.
Figure 20B:
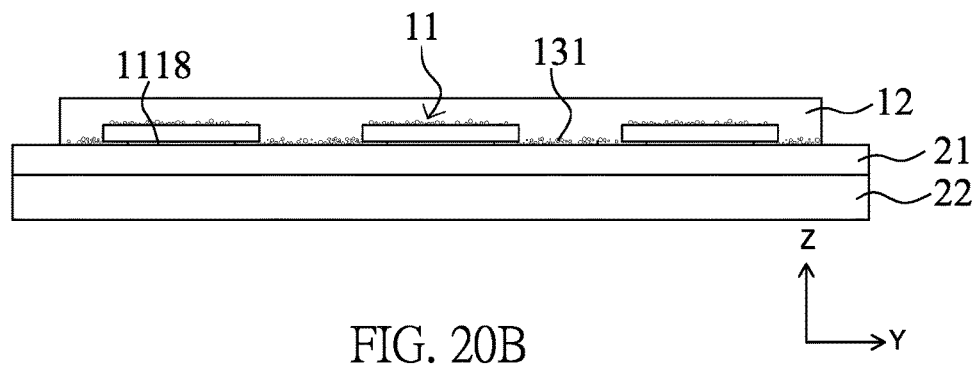
Figure 21B:
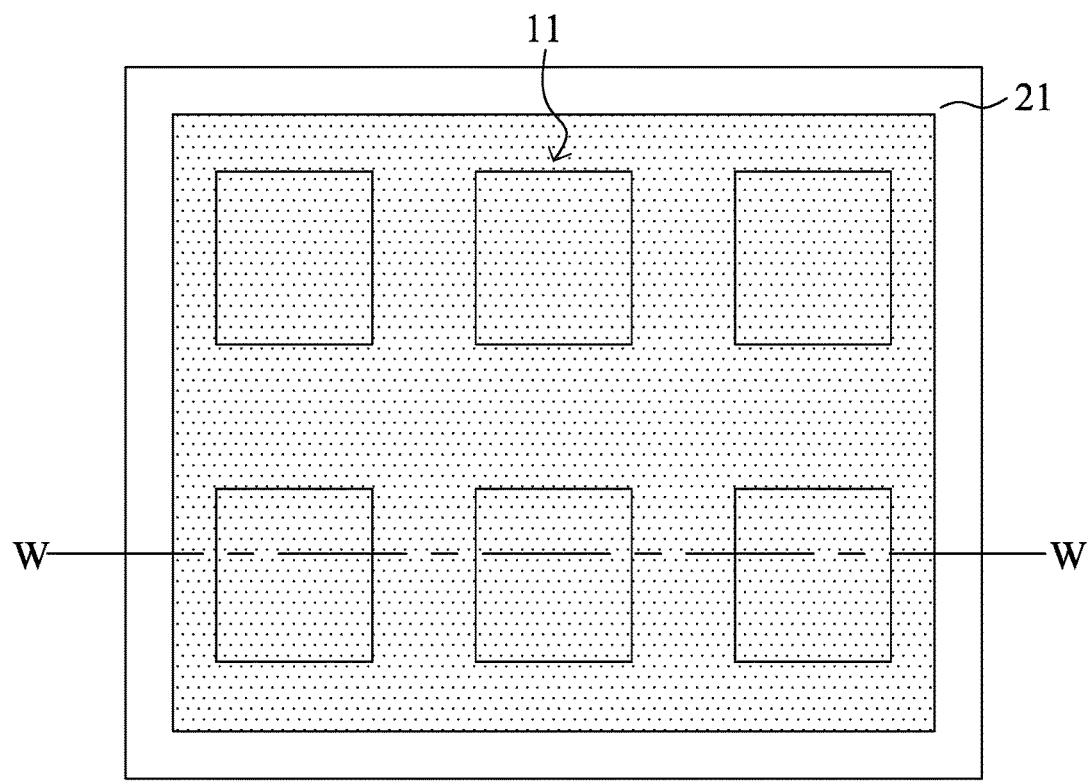
Figure 20C:
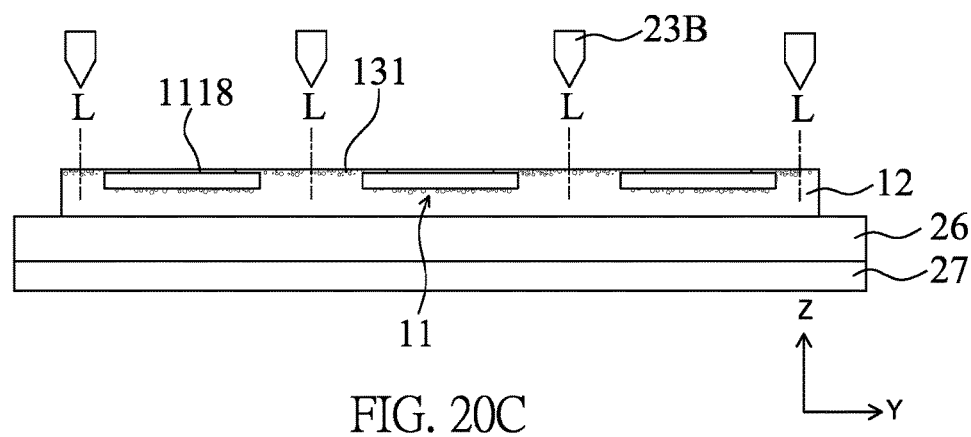
Figure 21C:
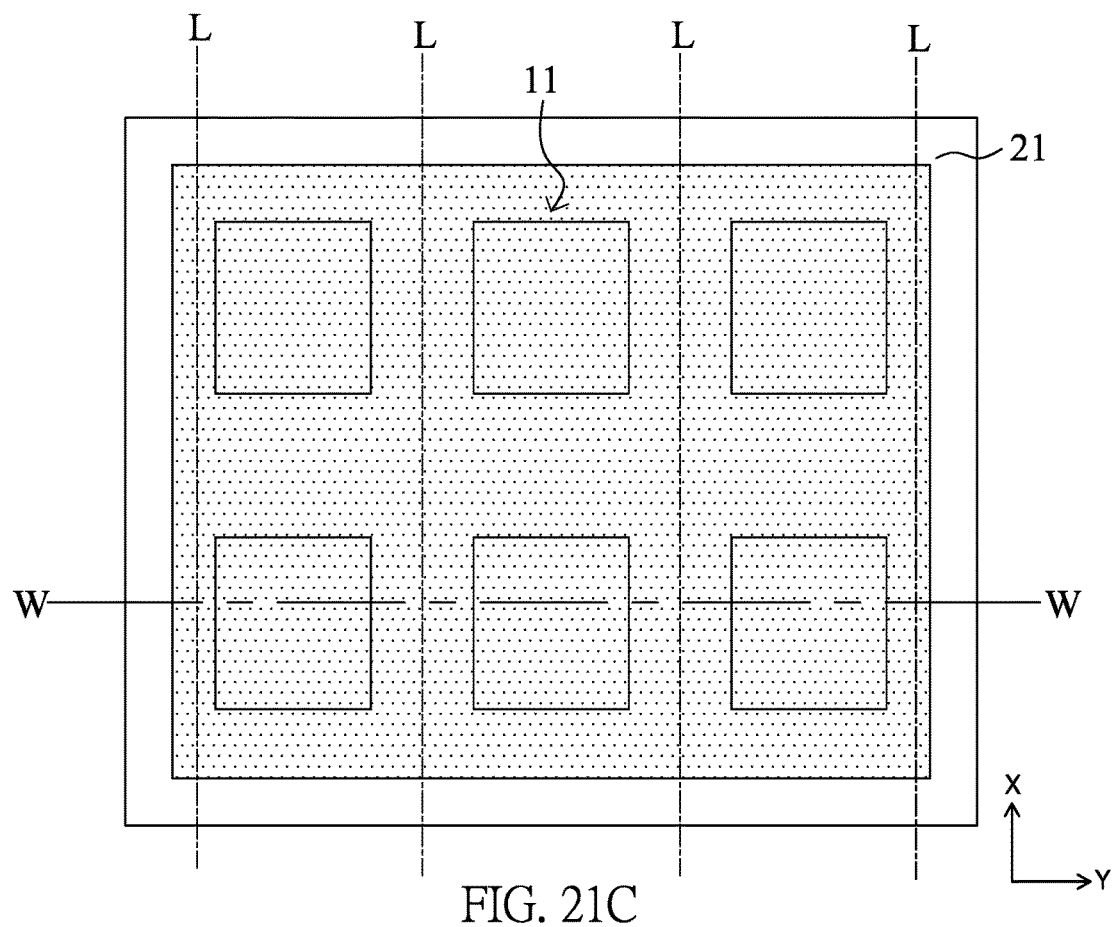
Figure 20D:
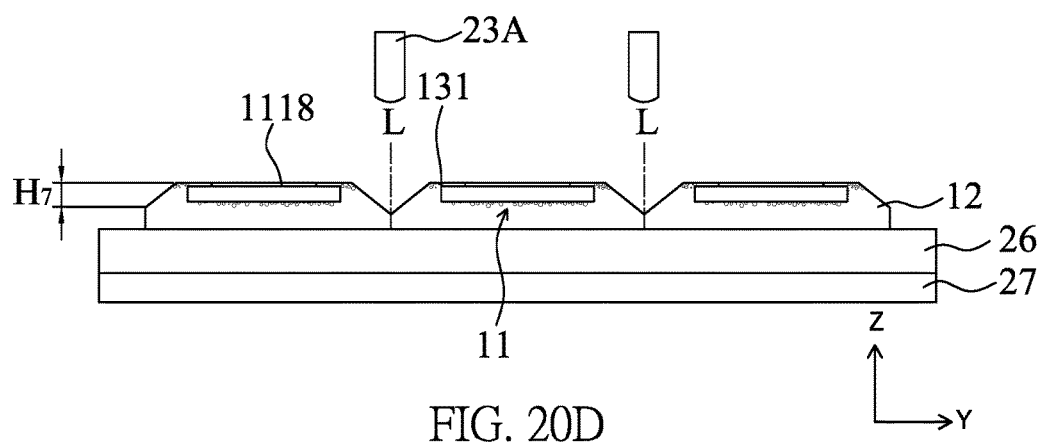
Figure 21D:
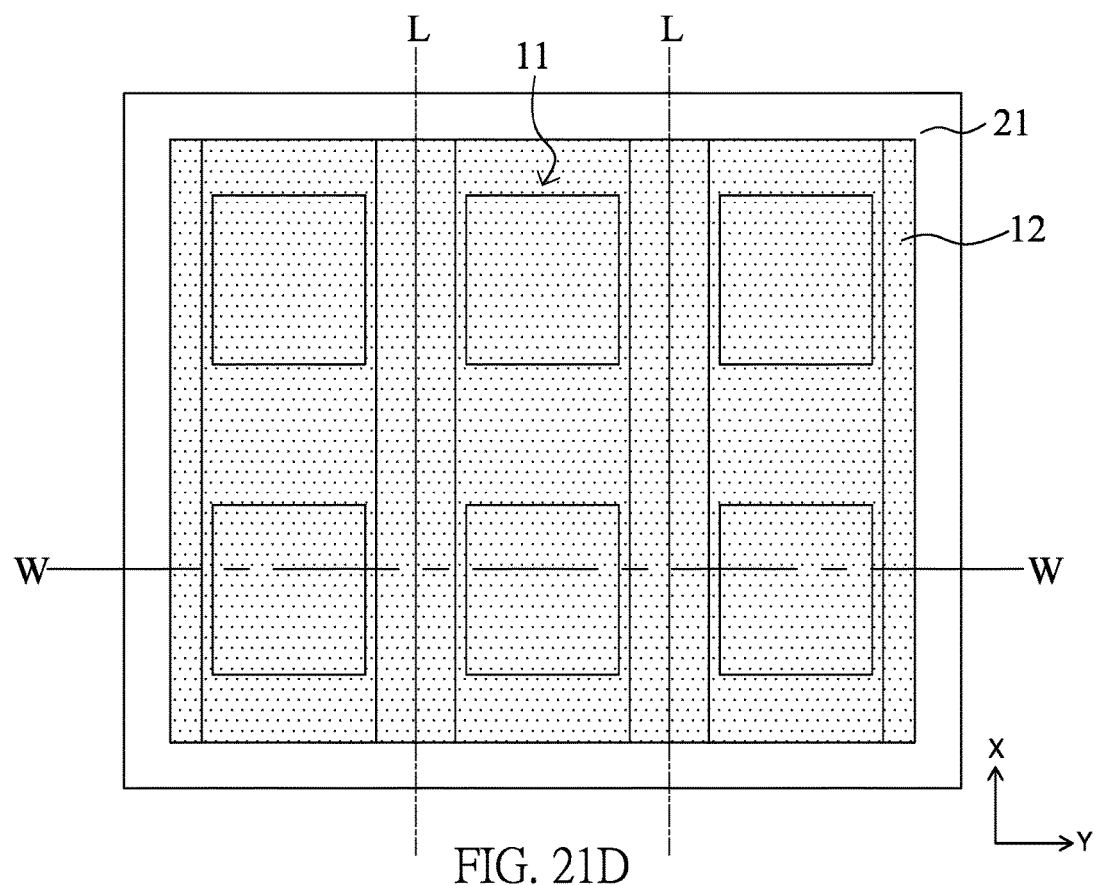
Figure 20E:
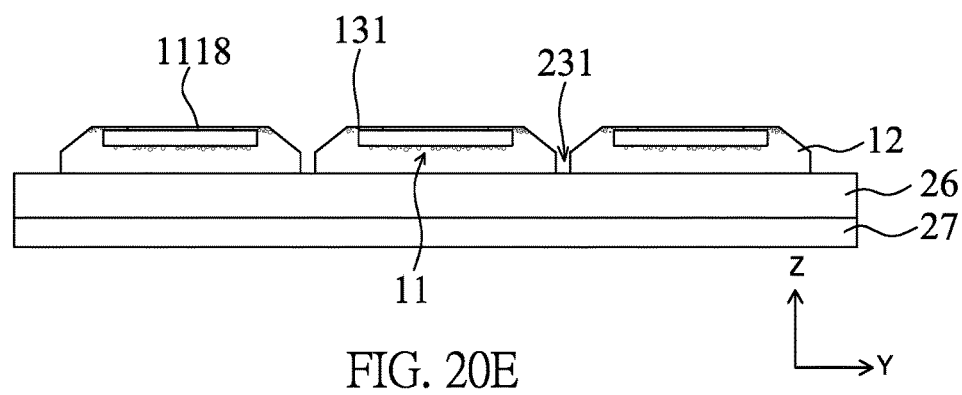
Figure 21E:
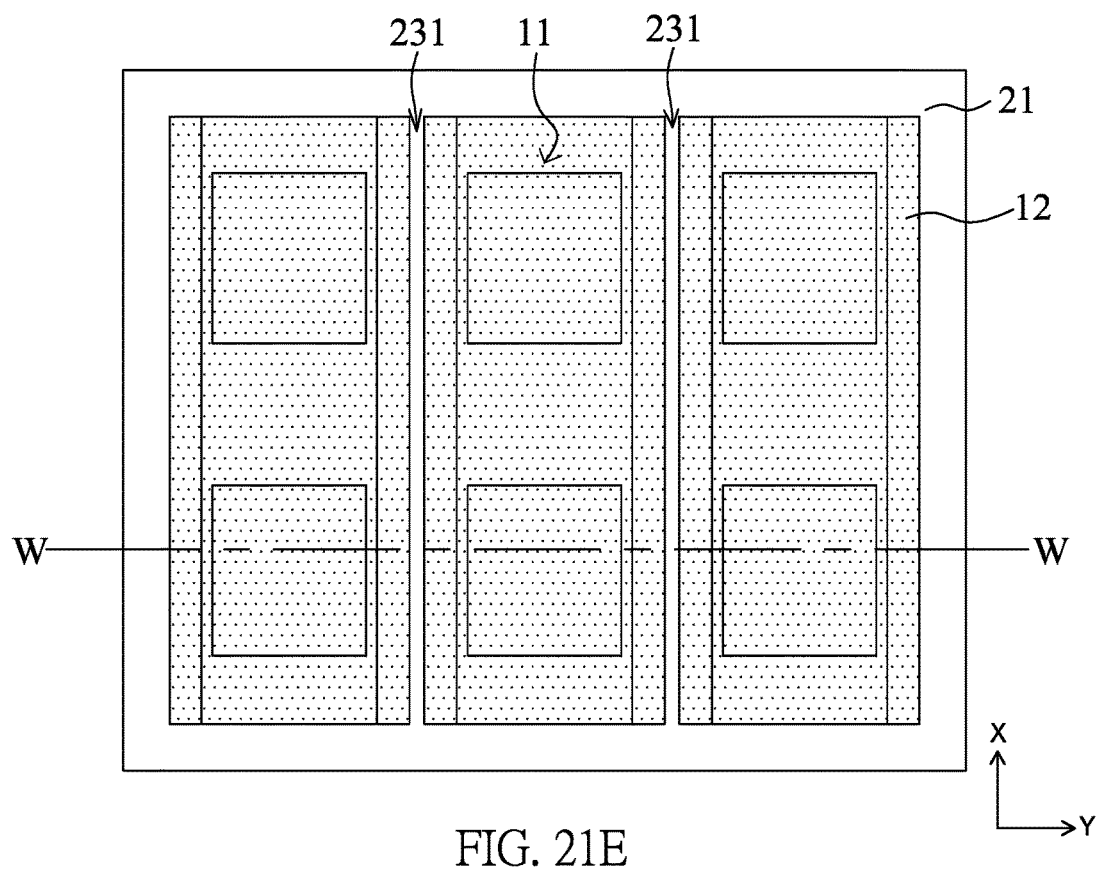
Figure 20F:
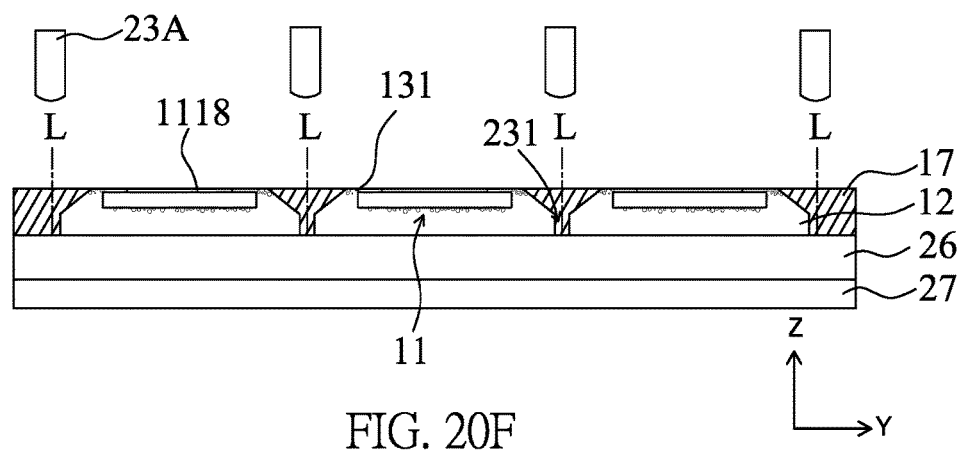
Figure 21F:
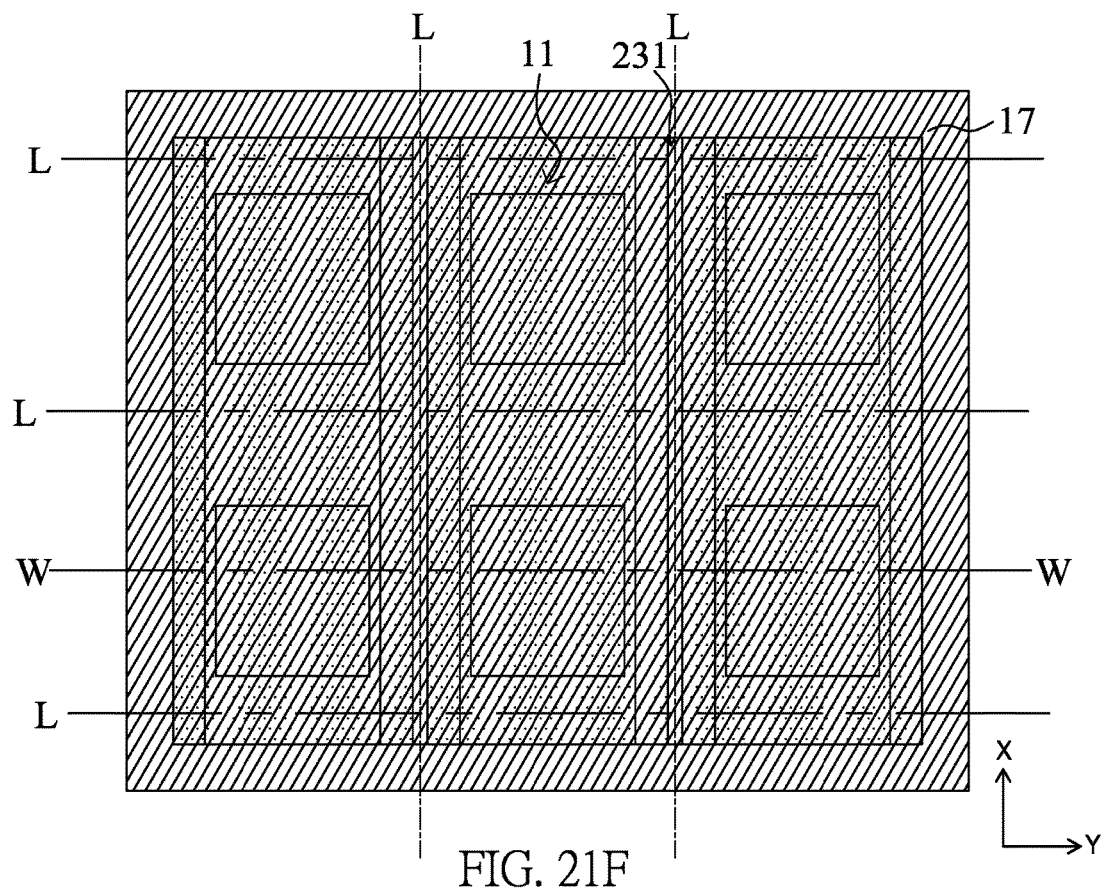
Figure 20G:
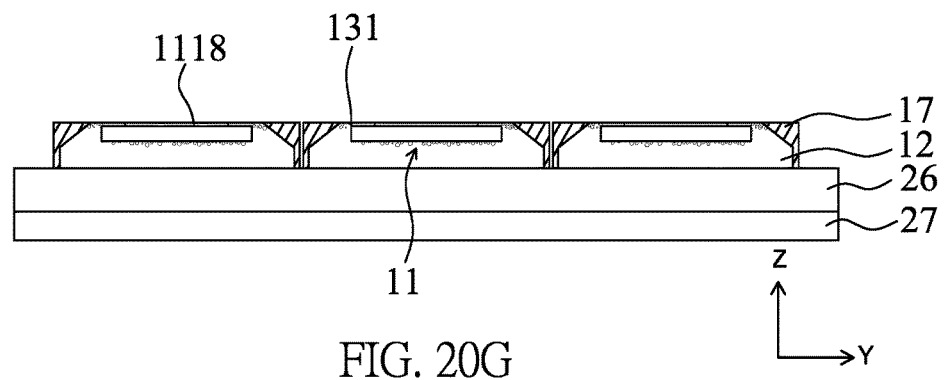
Figure 21G:
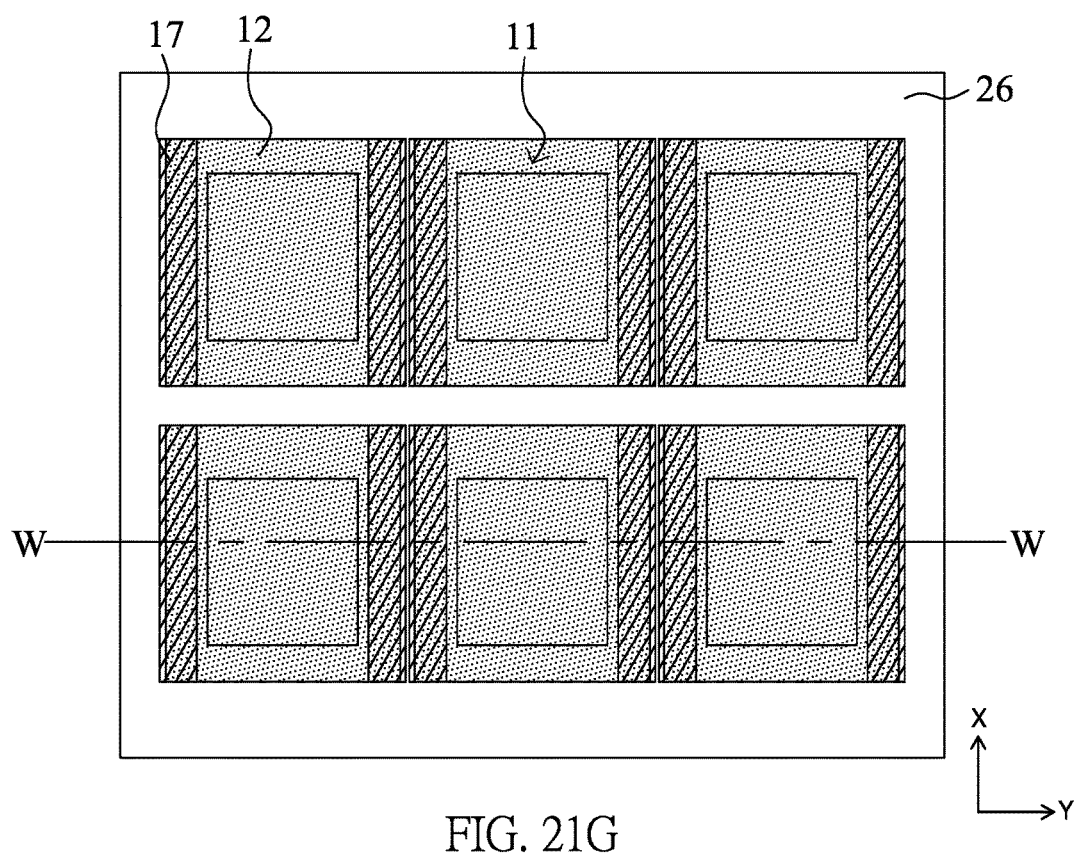

FIGS. 19A~19C show simplified cross-sectional views of light-emitting devices. The simplified light-emitting devices are used in the simulation for obtaining a relation among the height of the first portion (μm) 172A1, the height of the second portion (μm) 172A2, the angle (θ), and the luminous flux (mW). Table 1 shows the simulation result of different angles and the luminous fluxes. In the simulation, the thickness (Y direction) of the light-emitting device is set to 1.1 mm and the height (Z direction) is 0.35 mm. As shown in Table 1, when the angle (θ) is increased, light emitted from the light-emitting structure 11 are not prone to be reflected at the first portion 172A1 toward the light-transmitting body 12 to exit the light-emitting device, which results in lower luminous flux. In addition, since the second portion 172A2 is located above the first portion 172A1 which makes the light-emitting areas (Ea) of the three light-emitting devices with different angles equal, the light-emitting angles of the light-emitting devices in FIGS. 19A~19C are substantially the same. As mentioned above, the inclined angled (θ) can change the luminous flux of the light-emitting device and the light-emitting angle of the light-emitting device can be fixed to a specific value (for example, 120°) by virtue of the second portion 172A2. In other words, by the first portion and the second portion, the light-emitting device could have a predetermined luminous flux and a predetermined light-emitting angle.

TABLE 1

| Height of the first portion(μm) | Height of the second portion(μm) | Angle( θ ) | Luminous flux (mW) |
|---|---|---|---|
| 250 | 100 | 60 | 7.4 |
| 250 | 100 | 70 | 7.37 |
| 250 | 100 | 80 | 7.33 |

When the height of the light-emitting device is fixed, if the inclined angle (θ) is increased, the thickness (Y direction) of the light-emitting device is increased. The light-emitting device may not be prone to apply in some areas due to its larger size. Accordingly, it is necessary to consider the applications while designing the inclined angle.

FIGS. 20A~20G show cross-sectional views of making a light-emitting device in accordance with an embodiment of the present disclosure. FIGS. 21A~21G show top views of FIGS. 20A~20G, respectively. FIGS. 20A~20G are cross-sectional views taken along lines W-W of FIGS. 21A~21G, respectively. For simplification, the light-emitting structure 11 is shown as cuboid as an exemplary illustration. For clear illustration, each layer is drawn in solid lines regardless of a non-transparent, transparent, or translucent material. The detailed description of FIGS. 20A~20B and FIGS. 21A~21B can be referred to the corresponding paragraphs of FIGS. 3A~3B and FIGS. 4A~4B.

Referring to FIGS. 20C~20D and FIGS. 21C~21D, an adhesion layer 26 is provided for attaching to a carrier 27. After attaching the structure of FIG. 20B to the adhesion layer 26, wherein the light-transmitting body 12 is attached to the adhesion layer 26, the adhesion layer 21 is heated or is irradiated by UV radiation light so the light-emitting structure 11 and the light-transmitting body 12 are separated from the adhesion layer 21 (the adhesion layer 21 and the carrier 22 are not shown in FIG. 20C) to expose the electrode layers 1118, 1119 (the electrode layer 1119 is not shown in the figure).

Subsequently, a first cutter 23B is provided and a cutting step is performed along the cutting line L (X direction) to cut the light-transmitting body 12. The first cutter 23B has a triangle cross-section and the cutting depth (H7) is smaller than the height (Z direction) of the light-transmitting body 12 but larger than the height of the light-emitting structure 11. Since the light-transmitting body 12 is not completely cut off, portions of the light-transmitting body 12 are connected to each other.

Referring to FIGS. 20D, 20E, 21D, and 21E, a second cutter 23A is provided to cut downward until reaching the adhesion layer 26 so the light-transmitting body 12 is completely cut off to form the trench 231.

Referring to FIGS. 20F~20G and FIGS. 21F~21G, a plurality of reflective particles is mixed into a matrix to form a paste in an uncured state. The paste covers the light-transmitting body 12 and the trenches 231 wherein the trenches 231 can be completely covered or partially covered by the paste or have bubble remaining in the paste. Then, the paste is cured to form the second reflective layer 17. Other description of the second reflective layer 17 can be referred to corresponding paragraphs. Subsequently, a cutting step using the second cutter 23A is performed along the cutting line L (in the X direction and Y direction). Thereafter, the adhesion layer 26 is heated or is irradiated by UV radiation light so the light-emitting structure 11, the light-transmitting body 12, and the second reflective layer 17 are separated from the adhesion layer 26 to form a plurality of light-emitting devices.

Since the paste is filled to cover the light-transmitting body 12 and within the trenches, in this step, the paste may cover a portion of the electrode layers 1118, 1119 (the electrode layer 1119 is not shown in the figure). In another embodiment, a protective layer (for example, photoresist, not shown) is formed on the electrode layer 1118 prior to filling the paste such that the paste can cover the protective layer without contacting directly the electrode layers 1118, 1119. Thereafter, the protective layer is removed to expose the electrode layers 1118, 1119. A cleaning step to clean the electrode layers 1118, 1119 can be eliminated while using the protective layer. Alternatively, a first reflective layer 14 and extension electrode layers 15A, 15B are further formed, and the detailed description can be referred to other corresponding paragraphs.

In FIGS. 20A~20G, two cutters with different heads are used to form the light-transmitting body 12 with the first surface 172A1 and the second surface 172A2 (referring to the description of FIG. 19). However, the cutter can have a specific shape so one cutting step is performed to obtain the same structure as which is obtained by conducting two cutting steps of FIGS. 20C and 20D.

Figure 22A:
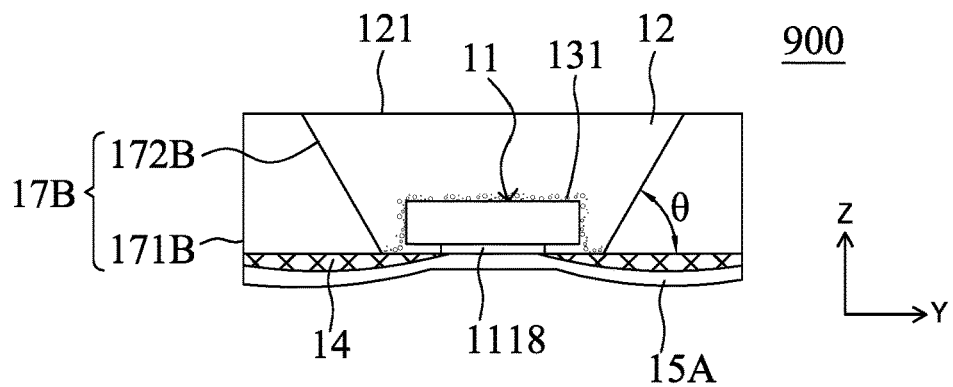
FIG. 22A shows a cross-sectional view of a light-emitting device in accordance with an embodiment of the present disclosure.

FIG. 22A shows a cross-sectional view of a light-emitting device 900 in accordance with an embodiment of the present disclosure. Referring to FIG. 22, the second reflective layer 17B has an outer surface 171B and an inner surface 172B. The outer surface 171B is substantially perpendicular to the top surface 121, and the inner surface 172B is inclined with respect to the top surface 121. The inner surface 172B extends from the first reflective layer 14 to the top surface 121 of the light-transmitting body 12 along the Z axis. The inner surface 172B is inclined with respect to the first reflective layer 14 with an angle (θ) of 60° ~80°. The inner surface 172B can reflect light from the light-emitting structure 11 toward the top surface 121 of the light-transmitting body 12.

Figure 22B:
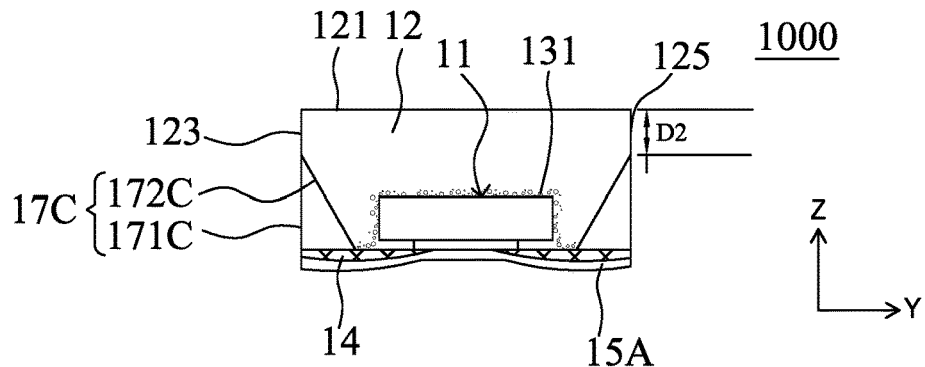
FIG. 22B shows a cross-sectional view of a light-emitting device in accordance with an embodiment of the present disclosure.
Figure 22C:
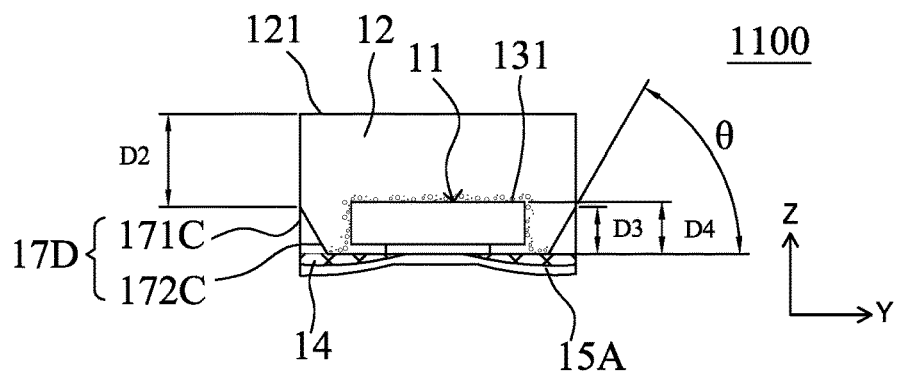
FIG. 22C shows a cross-sectional view of a light-emitting device in accordance with an embodiment of the present disclosure.
Figure 23A:
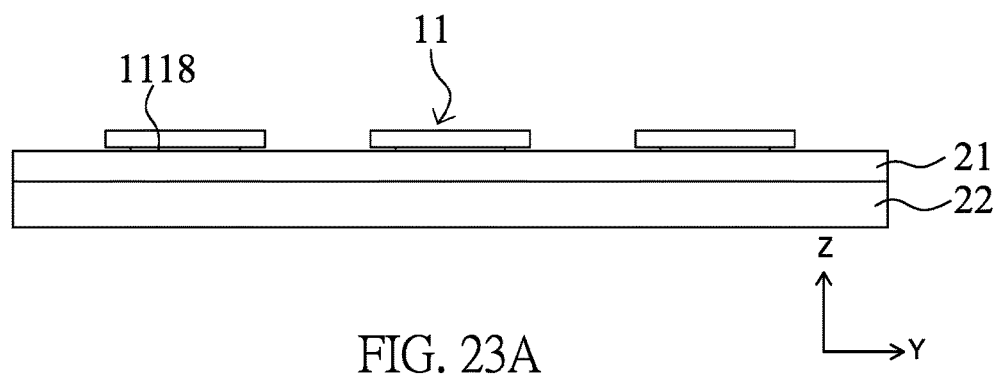
FIGS. 23A~23F show cross-sectional views of making a light-emitting device in accordance with an embodiment of the present disclosure.
Figure 24A:
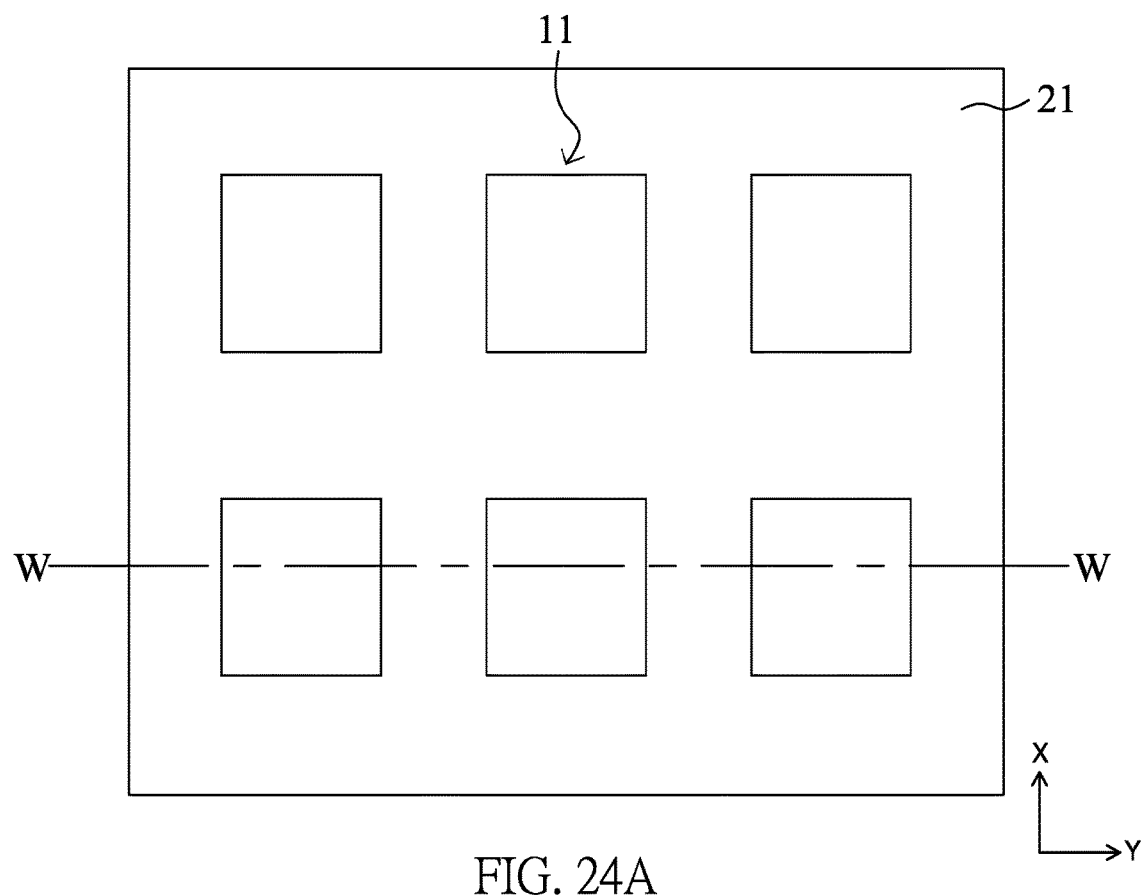
FIGS. 24A~24F show top views of FIGS. 23A~23F respectively.
Figure 23B:
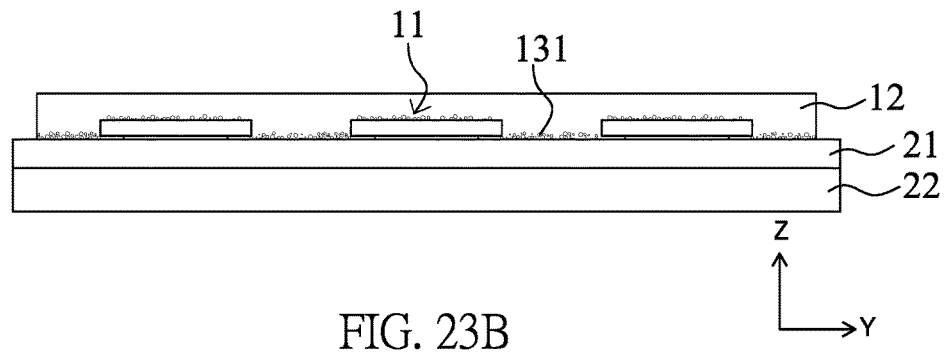
Figure 24B:
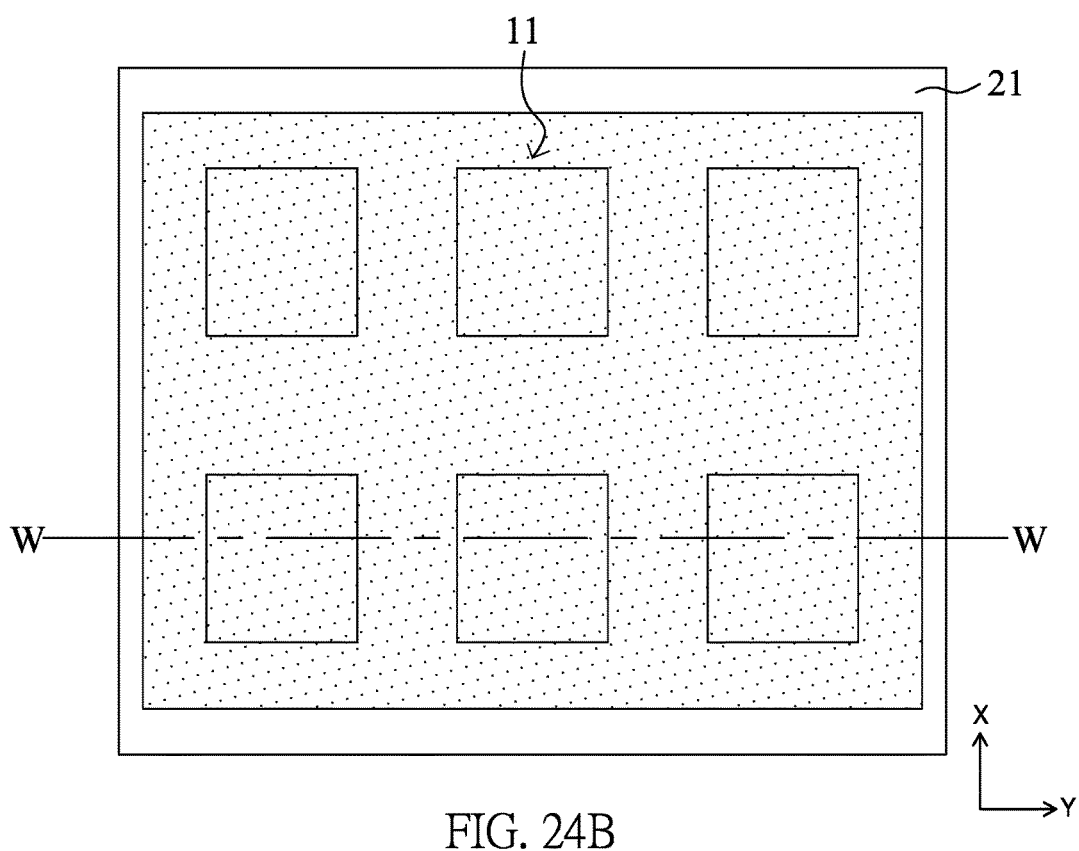
Figure 23C:
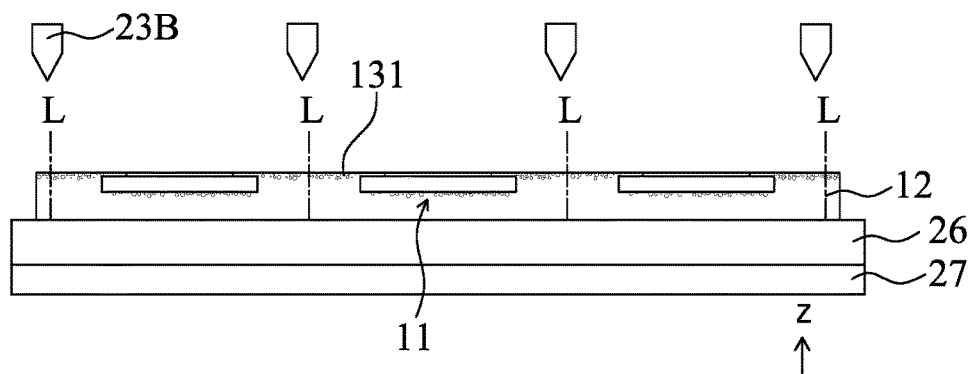
Figure 24C:
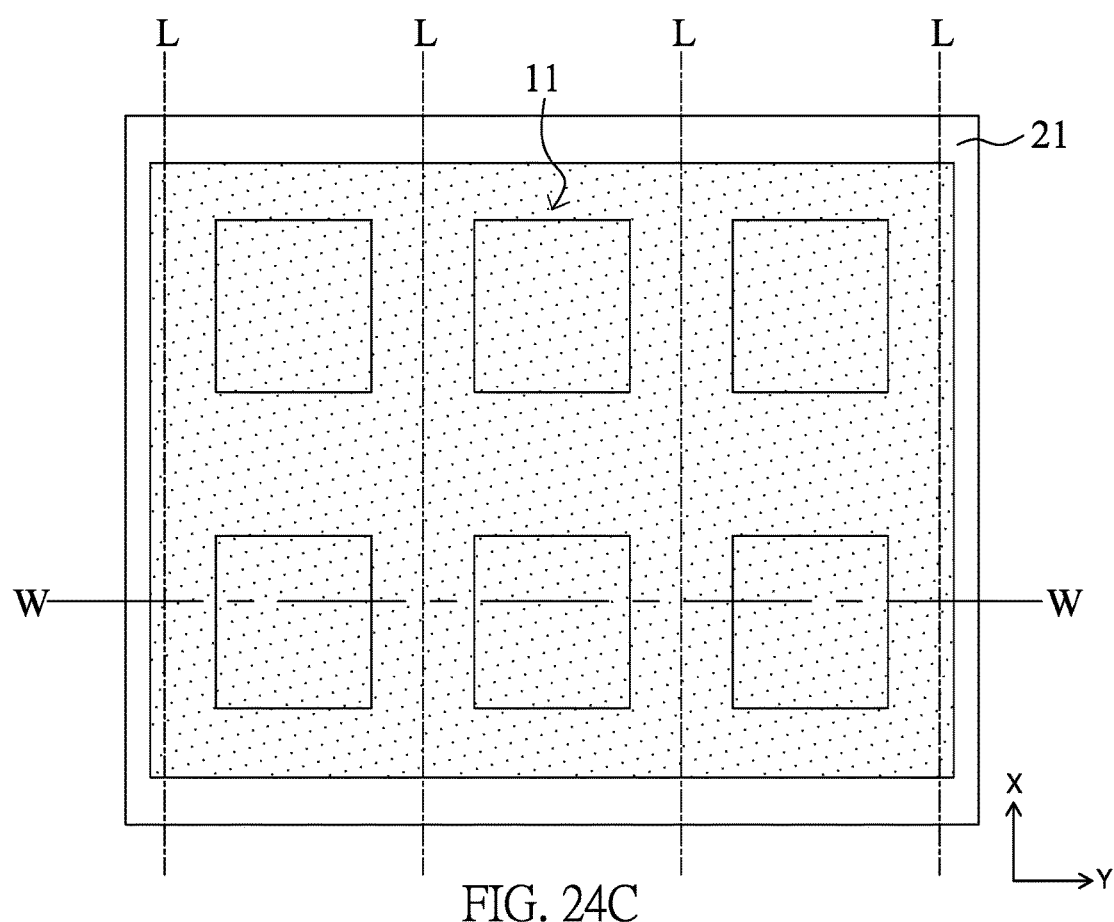
Figure 23D:
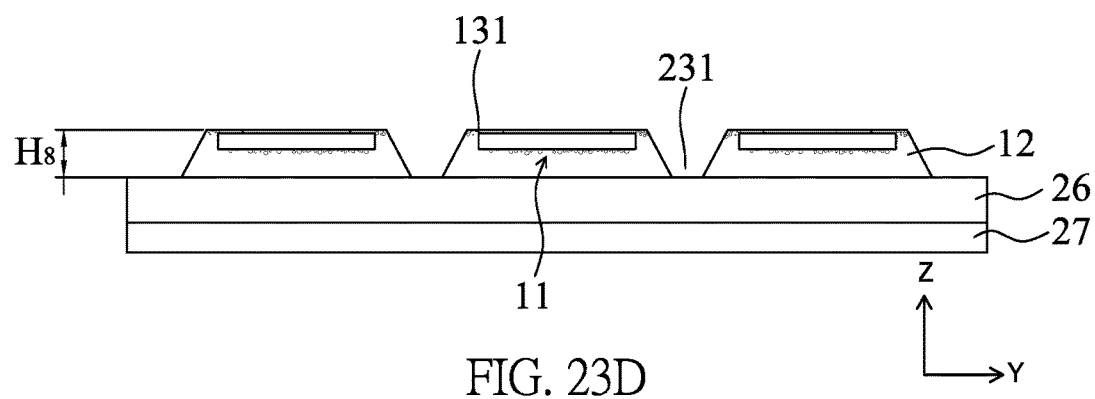
Figure 24D:
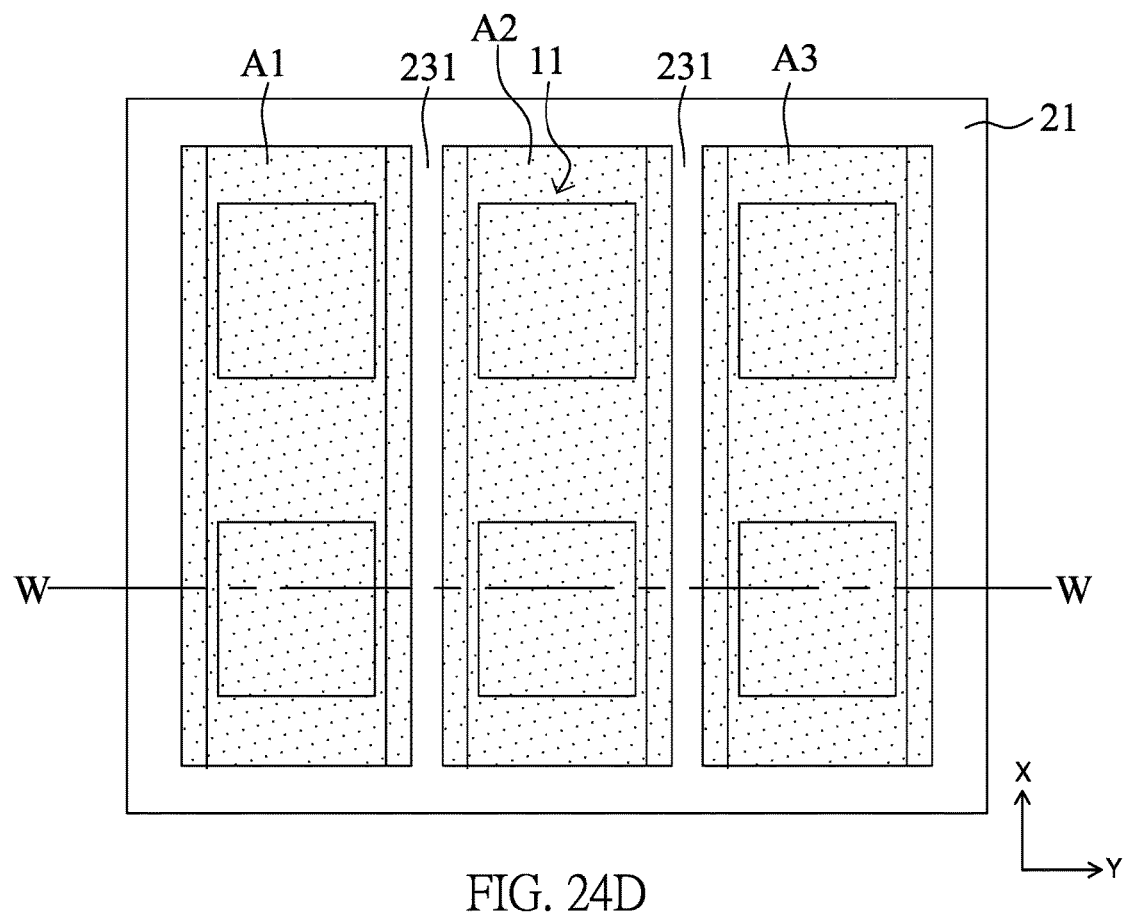
Figure 23E:
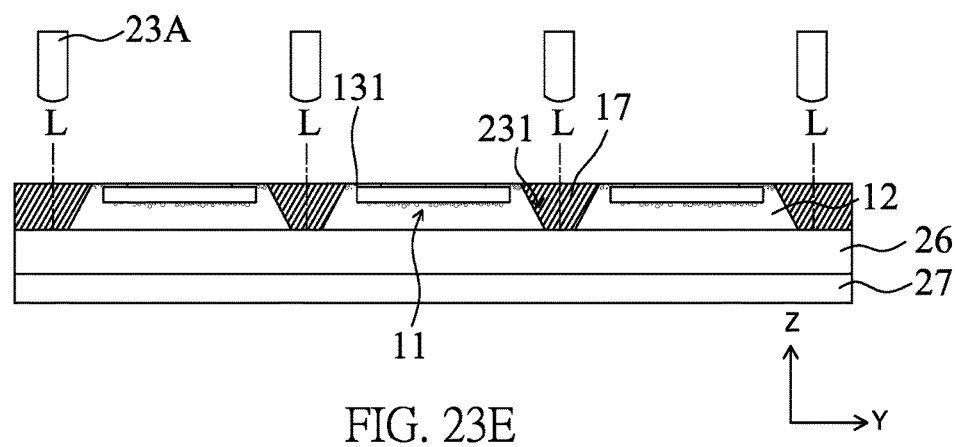
Figure 24E:
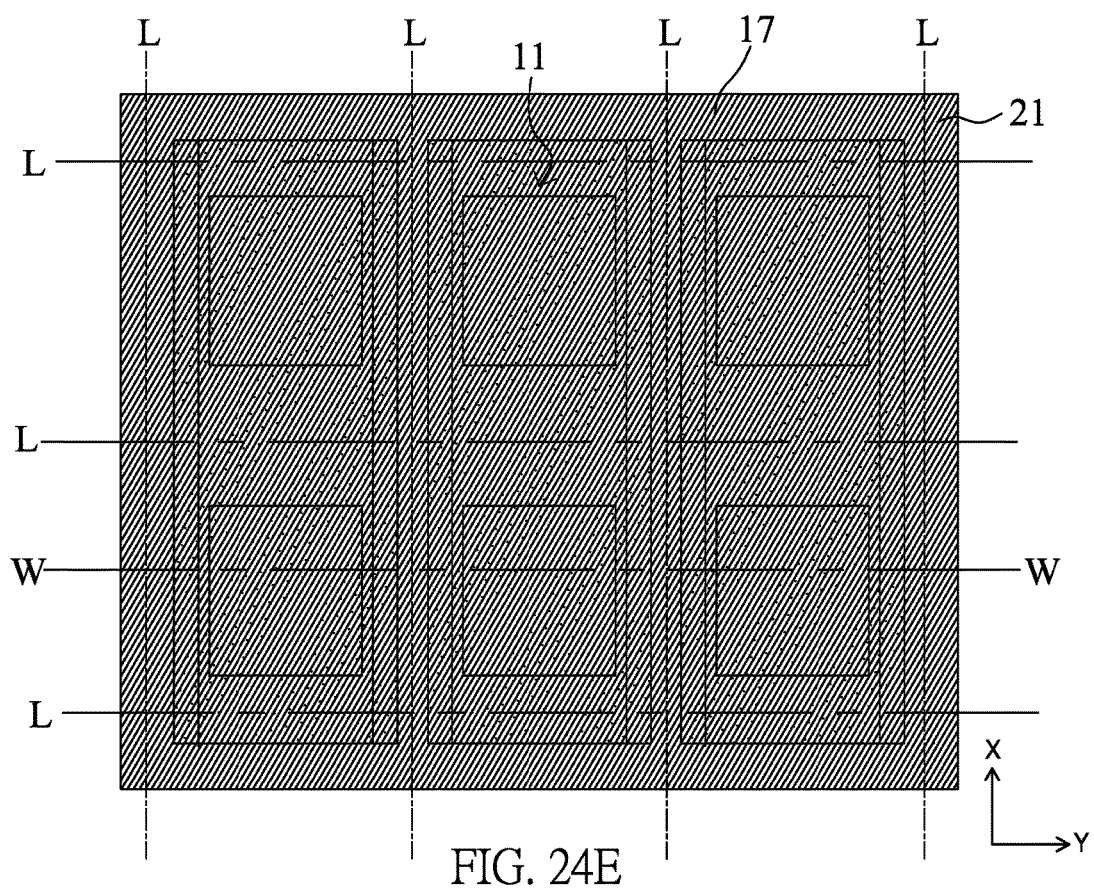
Figure 23F:
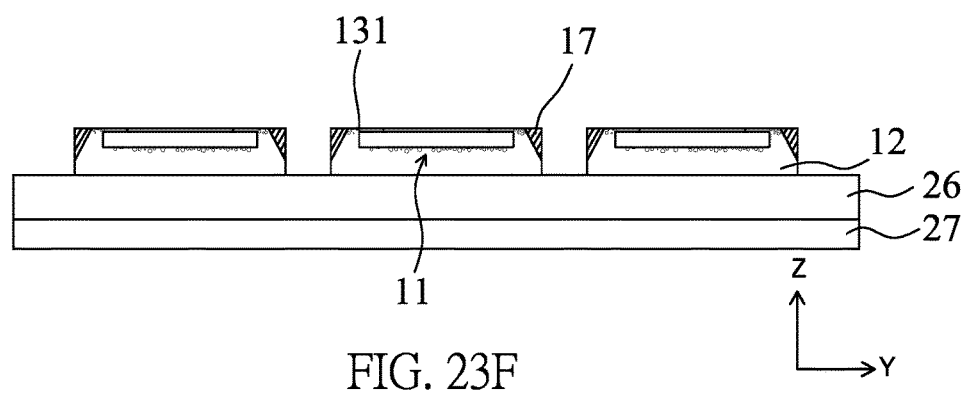
Figure 24F:
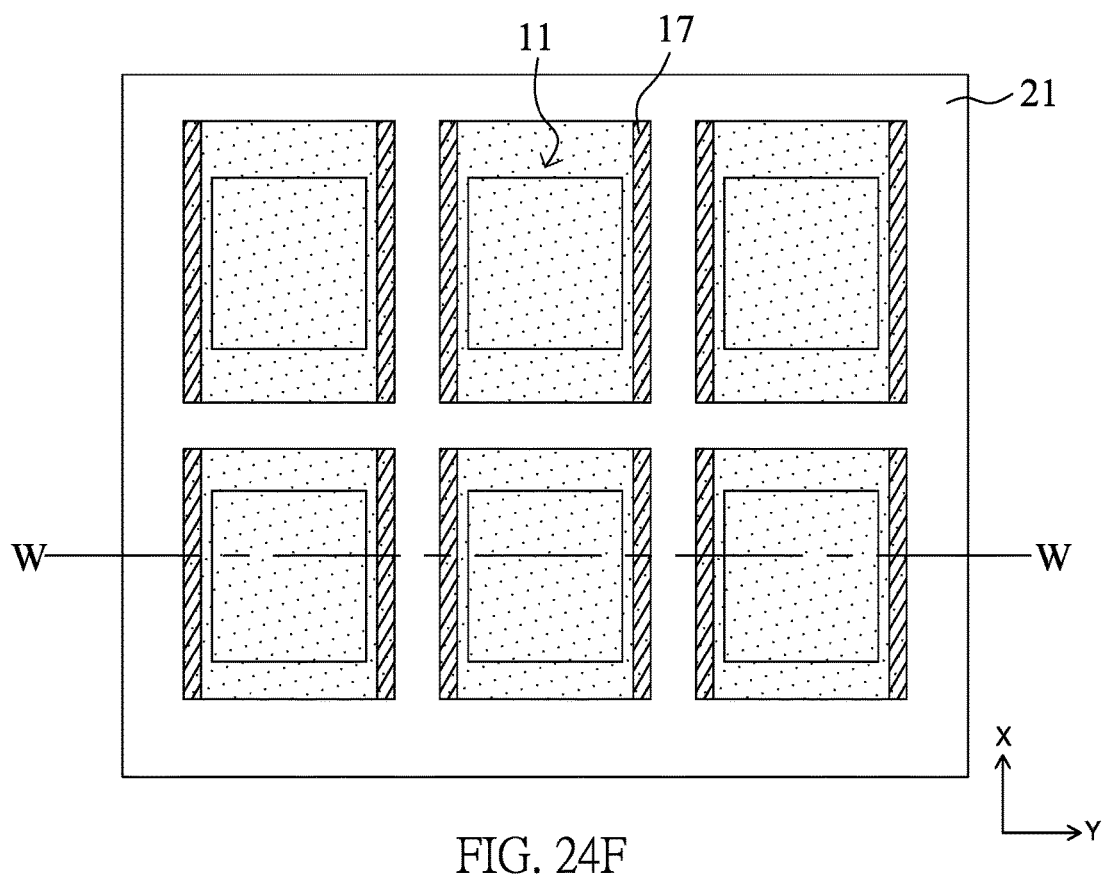

FIG. 22B shows a cross-sectional view of a light-emitting device 1000 in accordance with an embodiment of the present disclosure. FIG. 22C shows a cross-sectional view of a light-emitting device 1100 in accordance with an embodiment of the present disclosure. Referring to FIGS. 22B and 22C, the second reflective layer 17C has an outer surface 171C and an inner surface 172C. The outer surface 171C is substantially perpendicular to the top surface 121, and the inner surface 172C is inclined with respect to the top surface 121. The inner surface 172C extends from the first reflective layer 14 along the Z axis without contacting the top surface 121 of the light-transmitting body 12. The inner surface 172C is separated from the top surface 121 by a distance (D2); wherein 1 μm≤D2≤800 μm (D2=20 μm, 50 μm, 100 μm, 200 μm, 300 μm, 400 μm, 500 μm, 600 μm, 700 μm). The light-emitting device with different D2 can be applied to different applications. In other words, a portion of the first side surface 123 (or the third side surface 125) is not covered by the second reflective layer 17 and is exposed to environment. The exposed first side surface 123 (or the third side surface 125) is substantially coplanar with the outer surface 171C of the second reflective layer 17C. As shown in FIGS. 22B and 22C, since the light-transmitting body 12 covers the second reflective layer 17, in the top view, the light-transmitting boy 12 is seen directly and the second reflective layer 17 is not seen. The inner surface 172C can reflect light from the light-emitting structure 11 toward the top surface 121 of the light-transmitting body 12.

In FIG. 22B, the inner surface 172C is higher than the light-emitting structure 11. In FIG. 22C, the inner surface 172C is lower than the light-emitting structure 11. As shown in FIG. 22C, the inner surface 172C has a height (D3) and the light-emitting structure 11 has a height (D4); ΔD=D3−D4. Table 2 shows the experimental result of ΔD and the light-emitting angle of the light-emitting device.

TABLE 2

| D2 (um) | D3 (um) | D4 (um) | Angle ( θ ) | Δ D (um) | Light-emitting angle |
|---|---|---|---|---|---|
| 280 | 70 | 150 | 60 | −80 | 140 |
| 210 | 140 | 150 | 60 | −10 | 135 |
| 150 | 200 | 150 | 60 | 50 | 120 |
| 120 | 230 | 150 | 60 | 80 | 120 |
| 70 | 280 | 150 | 60 | 130 | 130 |

As shown in Table 2, when D3<D4 and the absolute value of ΔD becomes larger, the light-emitting angle of the light-emitting device 1100 also becomes larger, and the light-emitting angle of the light-emitting device 1100 is close to that where the light-emitting device 1100 does not have the light-transmitting body 12. Different from FIG. 19, in FIGS. 22B and 22C, the inner surface 172C does not extend to the top surface 121, that is, the light-transmitting body 12 is located on the inner surface 172C and there is no the second portion (172A2) as shown in FIG. 19. As shown in FIG. 22B, when the inner surface 172C has a height higher than that of the light-emitting structure 11, light from the light-emitting device 1000 is reflected by the inner surface 172C toward the light-transmitting body 12 to exit the light-emitting device 1000. The light-emitting angle of the light-emitting device 1100 can be decreased (for example, from 140° to 120°) through the inner surface 172C. On the contrary, as shown in FIG. 22C, when the inner surface 172C has a height lower than that of the light-emitting structure 11, since a portion of light from the light-emitting device 1100 is not reflected by the inner surface 172C and exits directly the light-emitting device 1100, the light-emitting angle of the light-emitting device 1100 is larger than that of the light-emitting device 1000 but smaller than that of the light-emitting structure 11 (for example, the light-emitting angle of the light-emitting device 1100 is larger than 120° and smaller than 140°). By designing the height of the inner surface 172C, the light-emitting device can have various light-emitting angles for improving its applicability.

Moreover, as table 1 and table 2 show, by having the first portion 172A1 and the second portion 172A2 (see FIG. 19) or the inclined surface (inner surface 172C) with a height higher than that of the light-emitting structure, the light-emitting device can have a predetermined light-emitting angle (for example, 120°) which is smaller than the light-emitting angle of the light-emitting structure 11. However, compared to the light-emitting device with the second reflective layer having merely the inner surface perpendicular to the top surface 121 (see FIG. 2C) or the light-emitting device without the second reflective layer, the light-emitting device with the second reflective layer having merely the inclined surface (regardless of the height higher or lower than the light-emitting structure) has an improved light intensity.

FIGS. 23A~23F show cross-sectional views of making a light-emitting device in accordance with an embodiment of the present disclosure. FIGS. 24A~24F show top views of FIGS. 23A~23F, respectively. FIGS. 23A~23F are cross-sectional view taken along lines W-W of FIGS. 24A~24F, respectively. For simplification, the light-emitting structure 11 is shown as cuboid as an exemplary illustration. For clear illustration, each layer is drawn in solid lines regardless of a non-transparent, transparent, or translucent material. The detailed description of FIGS. 23A~23B and FIGS. 24A~24B can be referred to the corresponding paragraphs of FIGS. 3A~3B and FIGS. 4A~4B.

Referring to FIGS. 23C~23D and FIGS. 24C~24D, an adhesion layer 26 is provided for attaching to a carrier 27. After attaching the structure of FIG. 23B to the adhesion layer 26 wherein the light-transmitting body 12 is attached to the adhesion layer 26, the adhesion layer 21 is heated or is irradiated by UV radiation light so the light-emitting structure 11 and the light-transmitting body 12 are separated from the adhesion layer 21 (the adhesion layer 21 and the carrier 22 are not shown in FIG. 23C) to expose the electrode layers 1118, 1119 (the electrode layer 1119 is not shown in the figure).

Subsequently, a cutter 23B is provided and a cutting step is performed along the cutting line L (X direction) to cut the light-transmitting body 12 until reaching the adhesion layer 26 (which means the cutting depth (H8) is substantially equal to the height of the light-transmitting body 12) to form trenches 231. The light-transmitting body 12 is divided into a plurality of disconnected areas (A1~A3).

Referring to FIGS. 23E~23F and FIGS. 24E~24F, a plurality of reflective particles is mixed into a matrix to form a paste in an uncured state. The paste covers the light-transmitting body 12 and the trenches 231 wherein the trenches 231 can be completely covered or partially covered by the paste or have bubble remaining in the paste. Then, the paste is cured to form the second reflective layer 17. Other description of the second reflective layer 17 can be referred to corresponding paragraphs. Subsequently, a cutting step is performed along the cutting line L (in the X direction and Y direction). Thereafter, the adhesion layer 26 is heated or is irradiated by UV radiation light so the light-emitting structure 11, the light-transmitting body 12, and the second reflective layer 17 are separated from the adhesion layer 26 to form a plurality of light-emitting devices.

In one embodiment, during cutting, the light-transmitting body 12 and the second reflective layer 17 are simultaneously cut, and therefore a portion of the light-transmitting body 12 is not covered by the second reflective layer 17 and is exposed to environment (the detailed description can be referring to FIG. 22B). Or, cutting at different locations can alter the height of the second reflective layer 17, the contact area between the light-transmitting body 12 and the second reflective layer 17, or the exposed area (height) of the light-transmitting body 12. In addition, cutting at different locations to cut merely the second reflective layer 17 can also make the second reflective layer 17 cover the light-transmitting body 12 as shown in FIG. 22A.

FIGS. 25A~25D show perspective views of making a light-emitting device in accordance with an embodiment of the present disclosure. FIGS. 26A~26C show cross-sectional views of FIGS. 25B~25D, respectively. For simplification, the light-emitting structure 11 is shown as cuboid as an exemplary illustration. For clear illustration, each layer is drawn in solid lines regardless of a non-transparent, transparent, or translucent material.

Figure 25A:
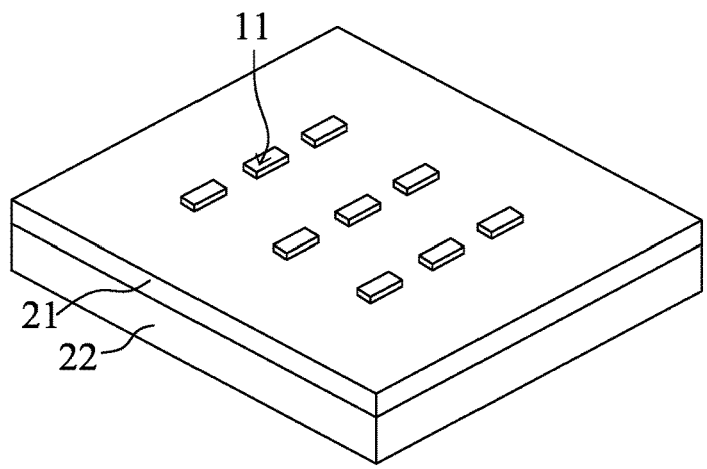
FIGS. 25A~25D show perspective views of making a light-emitting device in accordance with an embodiment of the present disclosure.
Figure 26A:
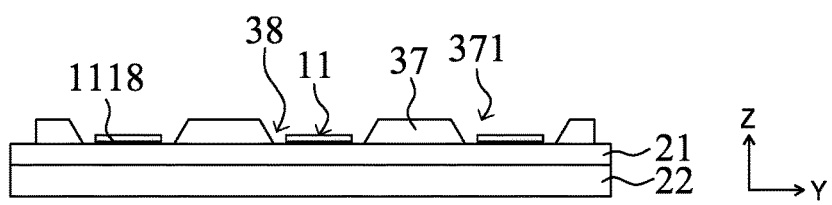
FIGS. 26A~26C show cross-sectional views of FIGS. 25B~25D respectively.
Figure 26B:
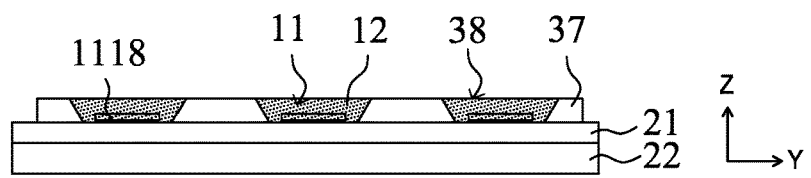
Figure 26C:
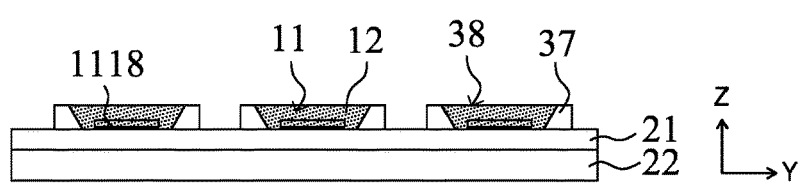

Referring to FIG. 25A, a carrier 22 is provided, an adhesion layer 21 is attached to the carrier 22 and a plurality of light-emitting structure 11 is disposed on the adhesion layer 21. In the embodiment, the light-emitting structure 11 is attached to the adhesion layer 21 through the first electrode layer 1118 and the second electrode layer 1119. The number and arrangement of the light-emitting structure 11 of FIG. 25A is illustrative, and not intended to limit the scope of the present disclosure.

Figure 25B:
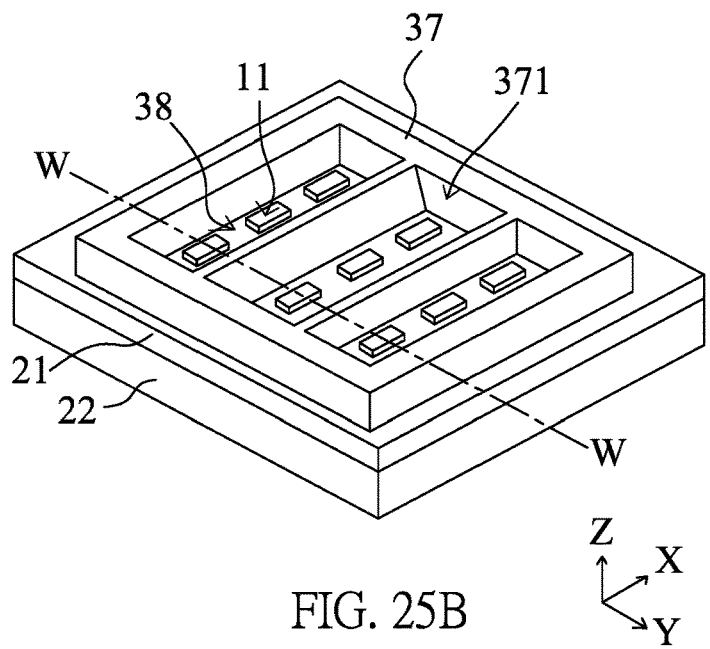

Referring to FIGS. 25B and 26A, a reflective frame 37 with a plurality of through holes 371 is provided and is disposed on the adhesion layer 21 so the light-emitting structures 11 is located within the through holes 371 and the reflective frame 37 surrounds the light-emitting structures 11. The reflective frame 37 and the adhesion layer 21 cooperated with each other to form a recess 38. The reflective frame 37 has an inclined inner wall 371.

Figure 25C:
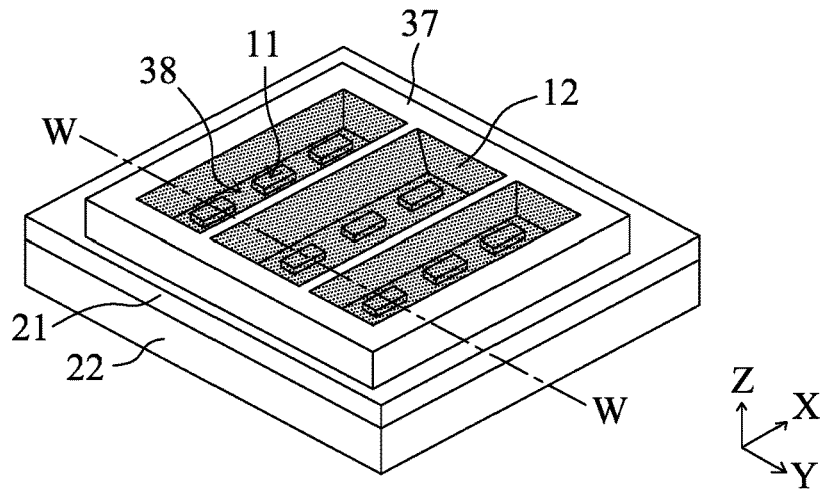

Referring to FIGS. 25C and 26B, a transparent body including a plurality of wavelength conversions particles is filled into the recess 38 and completely covers the light-emitting structures 11. Then, the transparent body is cured to form the light-transmitting body 12.

Figure 25D:
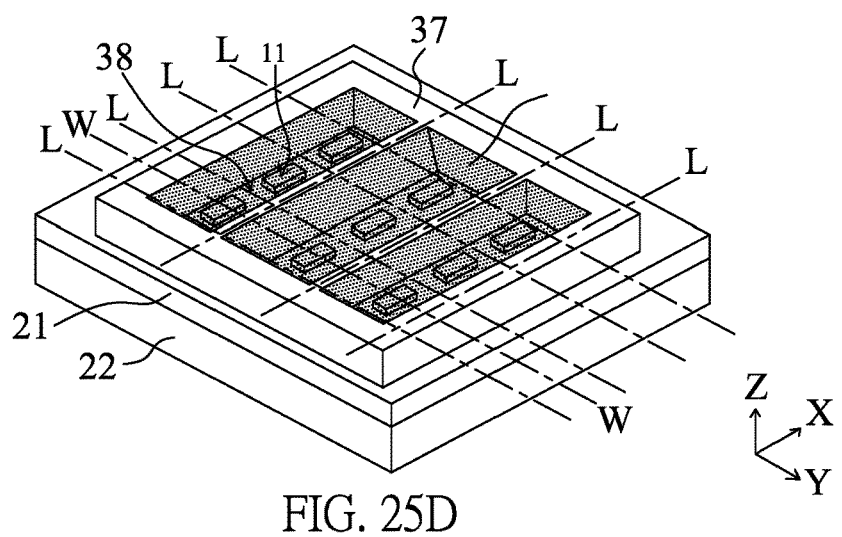

Referring to FIGS. 25D and 26C, a cutting step is performed along the X direction to cut the reflective frame 37 and along the Y direction to cut the light-transmitting body 12 and the reflective frame 37 to form a plurality of light-emitting devices. Similarly, during cutting, if only the reflective frame 37 (the second reflective layer 17) is cut, the light-emitting device 900 of FIG. 22A is obtained. Or, if the light-transmitting body 12 and the reflective frame 37 are cut simultaneously, the light-emitting device 1000 of FIG. 22B is obtained.

Figure 27A:
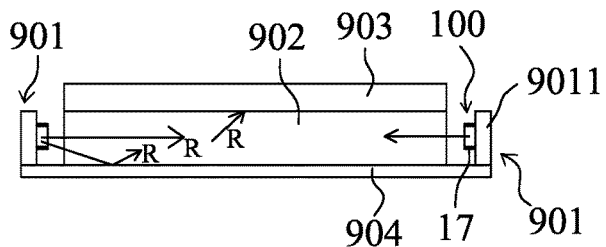
FIG. 27A shows a cross-sectional view of an edge-lit backlight unit of a liquid crystal display in accordance with an embodiment of the present disclosure.

FIG. 27A shows a cross-sectional view of an edge-lit backlight unit of a liquid crystal display in accordance with an embodiment of the present disclosure. The backlight unit includes a light source 901, a light guide plate 902, and a diffusing plate 903. The light source 901 includes a carrier 9011, a plurality of light-emitting devices 100 disposed on the carrier 9011, and a circuit (not shown) formed on the carrier to control the light-emitting devices 100. The light source 901 is arranged at two side of the light guide plate 902. When the light-emitting device 100 emits light, since light (R) emits outward in the Z direction (to exit the light-emitting devices 100), the carrier 9011 is arranged perpendicular to the light guide plate 902 (that is, the light-emitting surface of the light-emitting device 100 is perpendicular to the carrier 9011) which can effectively directs the light (R) into the light guide plate 902. When the light (R) emits into the light guide plate 902, the light guide plate 903 alters the direction of the light (R) toward the diffusing plate 903. Optionally, a reflector 904 can be disposed on the light guide plate 902 opposite to the diffusing plate 903 for reflecting the light (R). The extension electrode layers 15A, 15B of the light-emitting device 100 are mounted on the circuit of the carrier 9011 through solder. In one embodiment, the carrier 9011 and the reflector 904 can be integrally formed as one-piece object and in an L-shape form. In addition, the light-emitting devices 100 are arranged on one side of the light guide plate 902 for reducing making cost and simplifying the assembly.

Figure 27B:
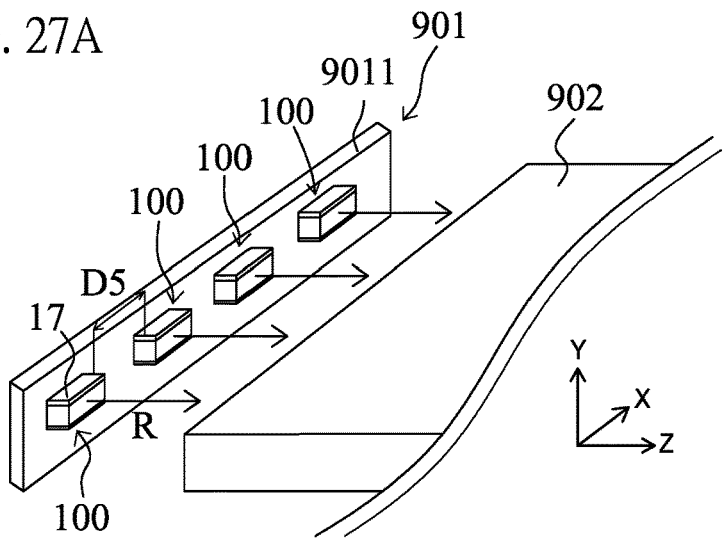
FIG. 27B shows a perspective view of a light source and a light-guiding plate.

FIG. 27B shows a perspective view of a light source 902 and the light-guiding plate 902 of FIG. 27A. The light-emitting devices 100 are arranged along the X direction to form one-dimensional array. The second reflective layer 17 is parallel to the long side of the carrier 9011. In this embodiment, the number and arrangement of the light-emitting device 100 is illustrative, and not intended to limit the scope of the present disclosure. Since the light-emitting device 100 has the light-emitting angle of 130~150° in the long side direction (X direction), the distance (D5) between two adjacent light-emitting devices 100 ranges from 12 mm to 15 mm which does not cause dark area in the light guide plate 902. Based on different application, the distance (D5) can range from 4 mm to 15 mm.

Figure 28:
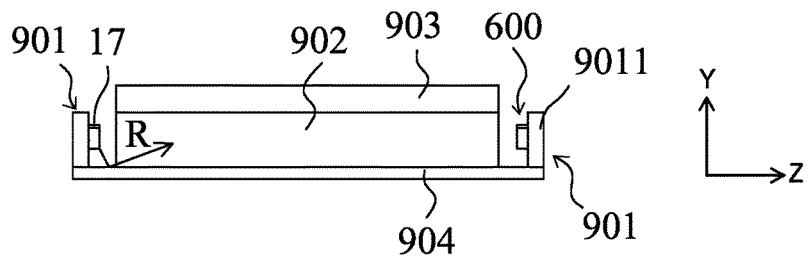
FIG. 28 shows a cross-sectional view of an edge-lit backlight unit of a liquid crystal display in accordance with an embodiment of the present disclosure.

FIG. 28 shows a cross-sectional view of an edge-lit backlight unit of a liquid crystal display in accordance with an embodiment of the present disclosure. Similar to FIG. 27A, in FIG. 28, the light-emitting device 600 replaces the light-emitting device 100. The light-emitting device 600 only has a side with the second reflective layer 17. The side of the light-emitting device 600 without the second reflective layer faces the reflector 904. Therefore, the light (R) from the light-emitting device can be reflected by the second reflective layer 17 toward the reflector 904, and further is redirect toward the diffusing plate 903 through the reflector 904 for increasing the overall light intensity of the liquid crystal display.

Figure 29:
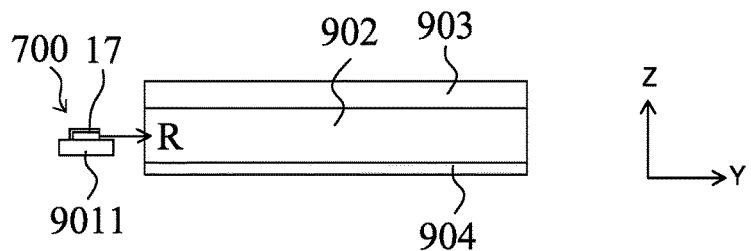
FIG. 29 shows a cross-sectional view of an edge-lit backlight unit of a liquid crystal display in accordance with an embodiment of the present disclosure.

FIG. 29 shows a cross-sectional view of an edge-lit backlight unit of a liquid crystal display in accordance with an embodiment of the present disclosure. The light source 901 includes a carrier 9011, a plurality of light-emitting devices 700 disposed on the carrier 9011. Since light (R) emits outward in the Y direction (to exit the light-emitting devices 700), the carrier 9011 is arranged parallel to the light guide plate 902 (that is, the light-emitting surface of the light-emitting device 700 is parallel to the carrier 9011) which can effectively directs the light (R) into the light guide plate 902.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
    a light-emitting structure with a side surface;
    a light-transmitting body enclosing the light-emitting structure and having a first side surface, a second side surface, a third side surface and a fourth side surface; and
    a reflective layer covering the side surface, the first side surface and the third side surface without covering the second side surface and the fourth side surface;
    wherein the light-emitting device has a first light-emitting angle and a second light-emitting angle different from the first light-emitting angle.

2. The light-emitting device according to claim 1, wherein the light-transmitting body has a top surface and a bottom surface opposite to the top surface, and the light-emitting device comprises a pair of extension electrode layers disposed on the bottom surface.

3. The light-emitting device according to claim 1, wherein the first side surface is opposite to the third side surface and the second side surface is opposite to the fourth side surface.

4. The light-emitting device according to claim 1, wherein the first light-emitting angle is of 130~150°.

5. The light-emitting device according to claim 1, wherein the second light-emitting angle is of 100~125°.

6. The light-emitting device according to claim 1, wherein the light-emitting device has merely three light-emitting surfaces.

7. The light-emitting device according to claim 1, further comprising an extension electrode layer overlapping the reflective layer.

8. The light-emitting device according to claim 1, further comprising an extension electrode layer having a side surface coplanar with the reflective layer.

9. The light-emitting device according to claim 3, wherein the reflective layer has an inner surface with a first portion inclined with respect to the top surface and a second portion substantially perpendicular to the top surface.

10. The light-emitting device according to claim 9, wherein the first portion has a height larger than that of the light-emitting structure.

11. The light-emitting device according to claim 1, wherein the first side surface has a portion uncovered by the reflective layer.

12. The light-emitting device according to claim 1, wherein the light-transmitting body has a top surface and the reflective layer has an inner surface inclined with respect to the top surface.

13. The light-emitting device according to claim 1, further comprising another reflective layer, wherein the light-transmitting body further has a bottom surface covered by the another reflective layer.

14. The light-emitting device according to claim 1, further comprising another reflective layer, wherein the light-emitting structure has an insulation layer covered by the another reflective layer.

\* \* \* \* \*